(12) United States Patent
Lai et al.

(10) Patent No.: US 12,218,138 B2
(45) Date of Patent: *Feb. 4, 2025

(54) AIR GAP FORMATION BETWEEN GATE SPACER AND EPITAXY STRUCTURE

(71) Applicant: TAIWAN SEMICONDUCTOR MANUFACTURING CO., LTD., Hsinchu (TW)

(72) Inventors: Bo-Yu Lai, Taipei (TW); Kai-Hsuan Lee, Hsinchu (TW); Wei-Yang Lee, Taipei (TW); Feng-Cheng Yang, Hsinchu County (TW); Yen-Ming Chen, Hsinchu County (TW)

(73) Assignee: TAIWAN SEMICONDUCTOR MANUFACTURING CO., LTD., Hsnichu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/510,370

(22) Filed: Nov. 15, 2023

(65) Prior Publication Data
US 2024/0088155 A1 Mar. 14, 2024

Related U.S. Application Data

(60) Continuation of application No. 17/885,383, filed on Aug. 10, 2022, now Pat. No. 11,855,097, which is a (Continued)

(51) Int. Cl.
*H01L 27/092* (2006.01)
*H01L 21/8234* (2006.01)
(Continued)

(52) U.S. Cl.
CPC .. *H01L 27/0924* (2013.01); *H01L 21/823431* (2013.01); *H01L 21/823468* (2013.01); *H01L 21/823814* (2013.01); *H01L 21/823821* (2013.01); *H01L 21/823864* (2013.01); *H01L 29/0653* (2013.01); *H01L 29/6653* (2013.01);
(Continued)

(58) Field of Classification Search
CPC ......... H01L 21/823864; H01L 29/6653; H01L 29/6656; H01L 21/823821; H01L 29/66795; H01L 29/0653; H01L 27/0924; H01L 21/823814; H01L 21/31111; H01L 29/165; H01L 29/7848; H01L 29/66545;
(Continued)

(56) References Cited

U.S. PATENT DOCUMENTS 8,012,820 B2 9/2011 Majumdar et al.
9,502,530 B2 11/2016 Hung et al.
(Continued)

Primary Examiner — Shouxiang Hu
(74) Attorney, Agent, or Firm — Maschoff Brennan

(57) ABSTRACT

A semiconductor device includes source/drain regions, a gate structure, a first gate spacer, and a dielectric material. The source/drain regions are over a substrate. The gate structure is laterally between the source/drain regions. The first gate spacer is on a first sidewall of the gate structure, and spaced apart from a first one of the source/drain regions at least in part by a void region. The dielectric material is between the first one of the source/drain regions and the void region. The dielectric material has a gradient ratio of a first chemical element to a second chemical element.

20 Claims, 41 Drawing Sheets

Related U.S. Application Data continuation of application No. 17/113,209, filed on Dec. 7, 2020, now Pat. No. 11,456,295, which is a division of application No. 16/412,007, filed on May 14, 2019, now Pat. No. 10,861,753.

(60) Provisional application No. 62/752,856, filed on Oct. 30, 2018.

(51) Int. Cl.
| | | |
|---|---|---|
| *H01L 21/8238* | (2006.01) | |
| *H01L 29/06* | (2006.01) | |
| *H01L 29/66* | (2006.01) | |
| *H01L 29/78* | (2006.01) | |
| *H01L 21/311* | (2006.01) | |

(52) U.S. Cl.
CPC .... *H01L 29/6656* (2013.01); *H01L 29/66636* (2013.01); *H01L 29/66795* (2013.01); *H01L 29/785* (2013.01); *H01L 21/31111* (2013.01)

(58) Field of Classification Search
CPC ............. H01L 29/66636; H01L 29/785; H01L 21/823468; H01L 21/823431
See application file for complete search history.

(56) References Cited

U.S. PATENT DOCUMENTS

| | | |
|---|---|---|
| 9,577,070 B2 | 2/2017 | Tsai et al. |
| 10,396,078 B2 | 8/2019 | Holt et al. |
| 10,505,010 B2 | 12/2019 | Yu et al. |
| 11,456,295 B2 * | 9/2022 | Lai .................. H01L 21/823431 |
| 11,855,097 B2 * | 12/2023 | Lai ...................... H01L 29/7848 |
| 2007/0138570 A1 | 6/2007 | Chong et al. |
| 2013/0089962 A1 | 4/2013 | Chang et al. |
| 2014/0073097 A1 | 3/2014 | Chung et al. |
| 2016/0126146 A1 | 5/2016 | Hoentschel et al. |
| 2018/0006128 A1 | 1/2018 | Cheng et al. |

* cited by examiner

ABSTRACT## AIR GAP FORMATION BETWEEN GATE SPACER AND EPITAXY STRUCTURE

PRIORITY CLAIM AND CROSS-REFERENCE

The present application is a Continuation Application of the U.S. application Ser. No. 17/885,383, filed Aug. 10, 2022, which is a Continuation Applications of the U.S. application Ser. No. 17/113,209, filed Dec. 7, 2020, now U.S. Pat. No. 11,456,295, issued on Sep. 27, 2022, which is a Divisional Applications of the U.S. application Ser. No. 16/412,007, filed May 14, 2019, now U.S. Pat. No. 10,861,753, issued on Dec. 8, 2020, which claims priority to U.S. Provisional Application Ser. No. 62/752,856, filed Oct. 30, 2018, all of which are herein incorporated by reference in their entirety.

BACKGROUND

Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3B-15 illustrate cross-sectional views of intermediate stages in the formation of transistors in accordance with some embodiments.

DETAILED DESCRIPTION

Figure 1:
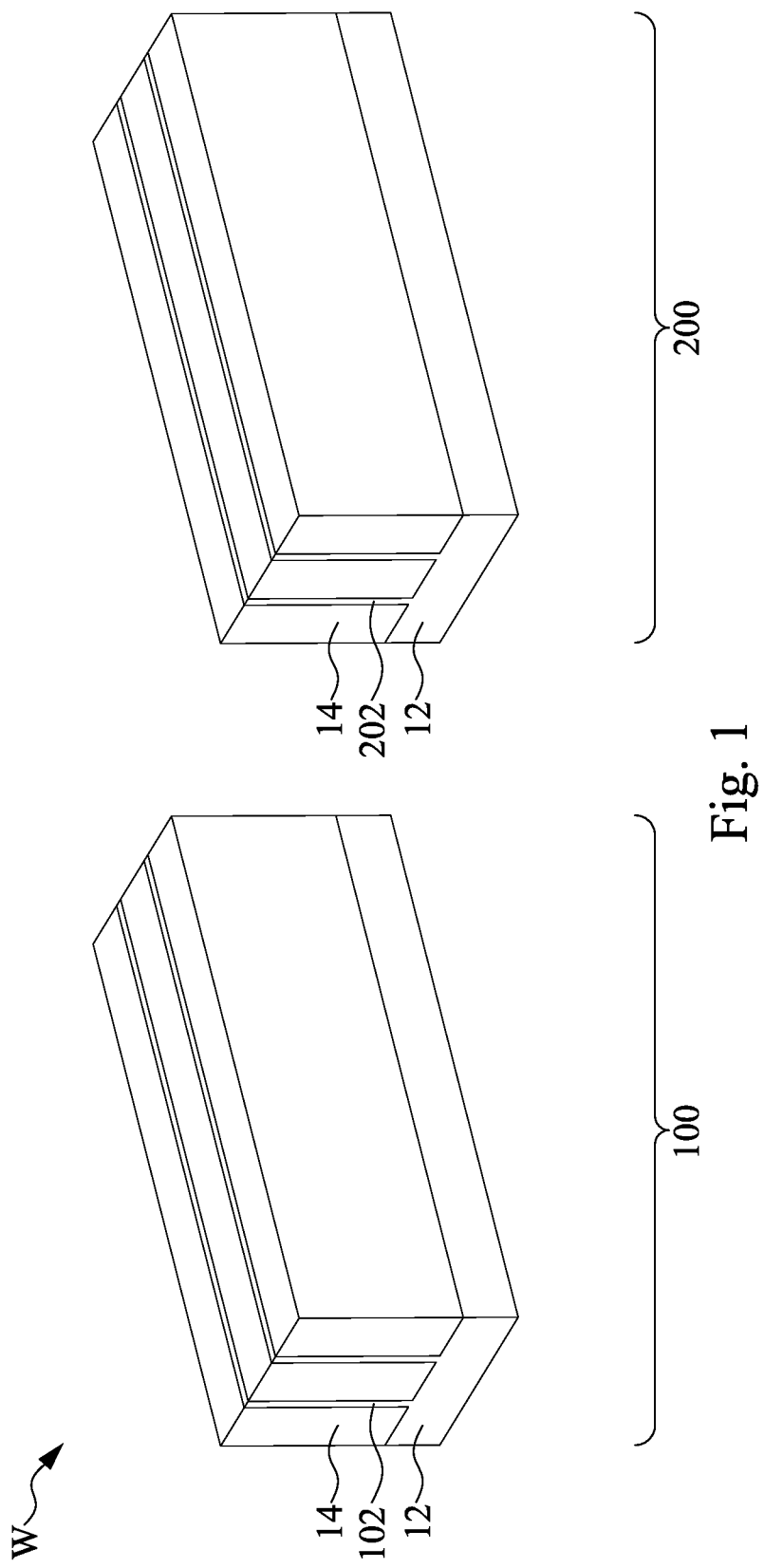
FIGS. 1, 2 and 3A illustrate perspective views of intermediate stages in the formation of transistors in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistor and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated exemplary embodiments, the formation of Fin Field-Effect Transistors (FinFETs) is used as an example to explain the concept of the present disclosure. Planar transistors may also adopt the embodiments of the present disclosure.

FIGS. 1 through 15 illustrate the perspective views and cross-sectional views of intermediate stages in the formation of transistors in accordance with some embodiments of the present disclosure. The steps shown in FIGS. 1 through 15 are also reflected schematically in the process flow shown in FIGS. 16A and 16B. The formed transistors include a p-type transistor (such as a p-type FinFET) and an n-type transistor (such as an n-type FinFET) in accordance with some exemplary embodiments. Throughout the various views and illustrative embodiments, like reference numbers are used to designate like elements. It is understood that additional operations can be provided before, during, and after the processes shown by FIGS. 1-15, and some of the operations described below can be replaced or eliminated, for additional embodiments of the method. The order of the operations/processes may be interchangeable.

FIG. 1 illustrates a perspective view of an initial structure. The initial structure includes a wafer W, which further includes a substrate 12. The substrate 12 may be a semiconductor substrate, which may be a silicon substrate, a silicon germanium substrate, or a substrate formed of other semiconductor materials. In accordance with some embodiments of the present disclosure, the substrate 12 includes a bulk silicon substrate and an epitaxy silicon germanium (SiGe) layer or a germanium layer (without silicon therein) over the bulk silicon substrate. The substrate 12 may be doped with a p-type or an n-type impurity. Isolation regions 14 such as shallow trench isolation (STI) regions may be formed to extend into the substrate 12. The portions of substrate 12 between neighboring STI regions 14 are referred to as semiconductor strips 102 and 202, which are in first and second device regions 100 and 200, respectively. The first device region 100 is an n-type transistor region, in which one or more n-type transistors such as one or more n-type FinFETs are to be formed. The second device region 200 is a p-type transistor region, in which one or more p-type transistors such as one or more p-type FinFETs are to be formed. As a result, the device region 100 can be referred to as an NFET region, and the device region 200 can be referred to as a PFET region.

STI regions 14 may include a liner oxide (not shown). The liner oxide may be formed of a thermal oxide formed through a thermal oxidation of a surface layer of substrate 12. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 14 may also include a dielectric material over the liner oxide, and the dielectric material may be formed using flowable chemical vapor deposition (FCVD), spin-on coating, or the like.

Figure 2:
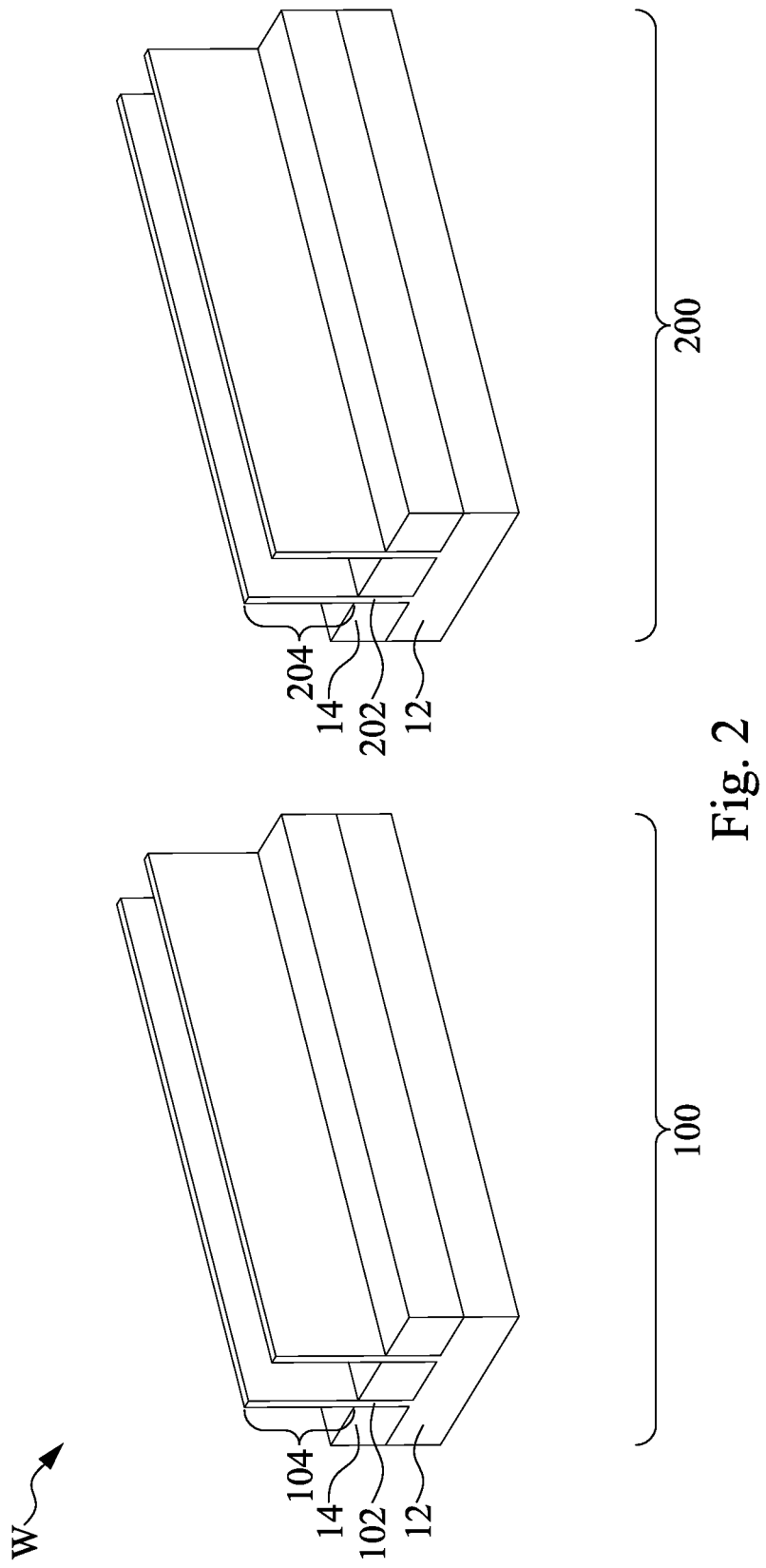

Referring to FIG. 2, the STI regions 14 are recessed, so that the top portions of semiconductor strips 102 and 202 protrude higher than the top surfaces of the neighboring STI regions 14 to form protruding fins 104 and 204. The respective step is illustrated as step S11 in the process flow shown in FIG. 16A. The etching may be performed using a dry etching process, wherein $NH_3$ and $NF_3$ are used as the etching gases. During the etching process, plasma may be generated. Argon may also be included. In accordance with alternative embodiments of the present disclosure, the recessing of the STI regions 14 is performed using a wet etch process. The etching chemical may include diluted HF, for example.

In above-illustrated exemplary embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The materials of protruding fins 104 and 204 may also be replaced with materials different from that of substrate 12. For example, protruding fins 104 may be formed of Si, SiP, SiC, SiPC, or a III-V compound semiconductor such as InP, GaAs, AlAs, InAs, InAlAs, InGaAs, or the like. Protruding fins 204 may be formed of Si, SiGe, SiGeB, Ge, or a III-V compound semiconductor such as InSb, GaSb, InGaSb, or the like.

Figure 3A:
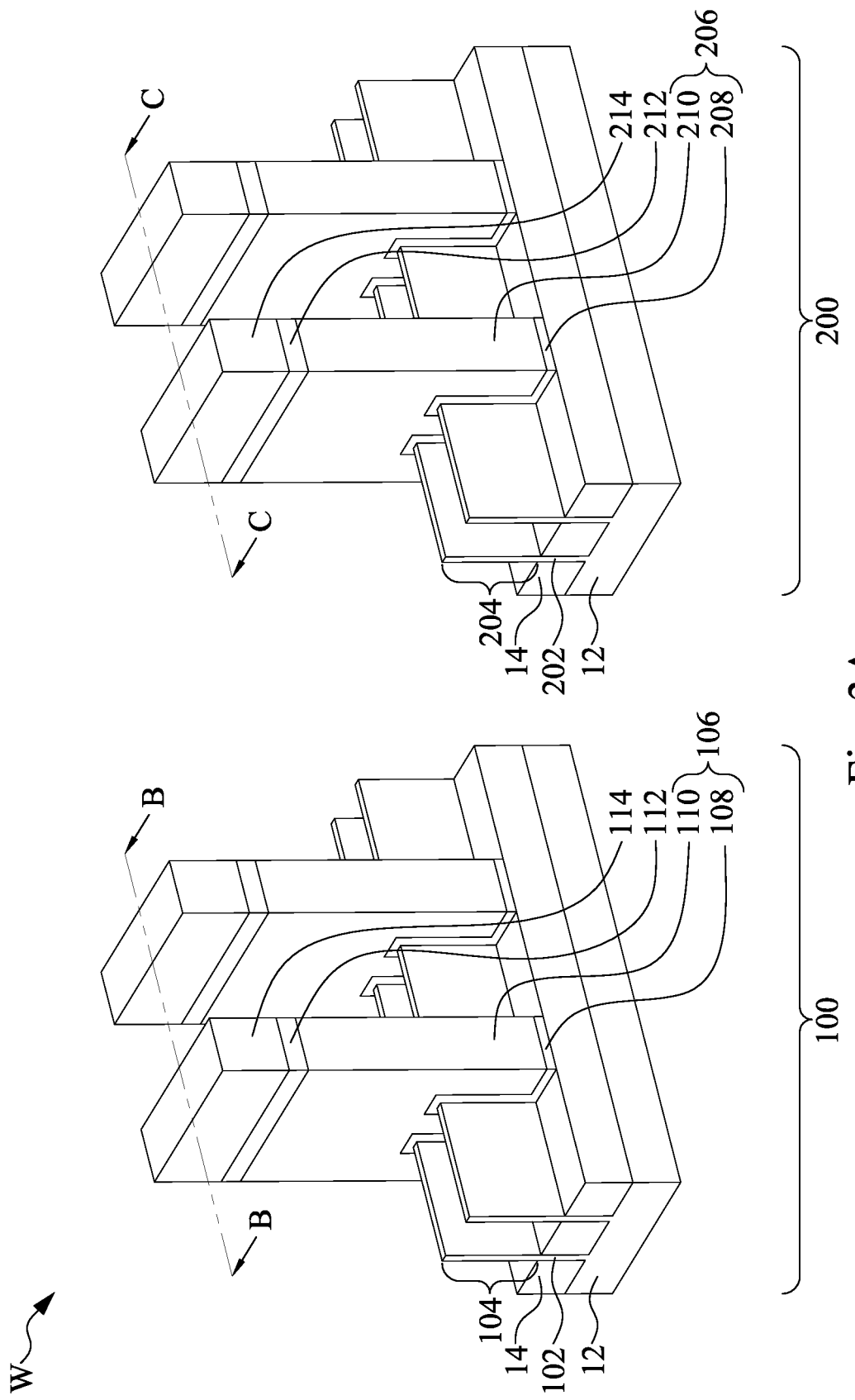

Referring to FIG. 3A, dummy gate stacks 106 and 206 are formed on the top surfaces and the sidewalls of protruding fins 104 and 204, respectively. The respective step is illustrated as step S12 in the process flow shown in FIG. 16A. Formation of the dummy gate stacks 106 and 206 includes depositing in sequence a gate dielectric layer and a dummy gate electrode layer across the fins 104 and 204, followed by patterning the gate dielectric layer and the dummy gate electrode layer. The resulting dummy gate stack 106 includes a gate dielectric layer 108 and a dummy gate electrode 110 over the gate dielectric layer 108. Similarly, the dummy gate stack 206 includes a gate dielectric layer 208 and a dummy gate electrode 210 over the dummy gate dielectric layer 206. The gate dielectric layers 108 and 208 can be any acceptable dielectric layer, such as silicon oxide, silicon nitride, the like, or a combination thereof, and may be formed using any acceptable process, such as thermal oxidation, a spin process, CVD, or the like. The dummy gate electrodes 110 and 210 can be any acceptable electrode layer, such as comprising polysilicon, metal, the like, or a combination thereof. The gate electrode layer can be deposited by any acceptable deposition process, such as CVD, plasma enhanced CVD (PECVD), or the like. Each of dummy gate stacks 106 and 206 crosses over a single one or a plurality of protruding fins 104 and 204, respectively. Dummy gate stacks 106 and 206 may have lengthwise directions perpendicular to the lengthwise directions of the respective protruding fins 104 and 204, respectively.

A mask pattern may be formed over the dummy gate electrode layer to aid in the patterning. In some embodiments, a hard mask pattern including bottom masks 112 and 212 over a blanket layer of polysilicon and top masks 114 and 214 over the respective bottom masks 112 and 212. The hard mask pattern is made of one or more layers of $SiO_2$, SiCN, SiON, $Al_2O_3$, SiN, or other suitable materials. In certain embodiments, the bottom masks 112 and 212 include silicon nitride, and the top masks 114 and 214 includes silicon oxide. By using the mask pattern as an etching mask, the dummy electrode layer is patterned into the dummy gate electrodes 110 and 210, and the blanket gate dielectric layer is patterned into the gate dielectric layers 108 and 208.

Figure 3B:
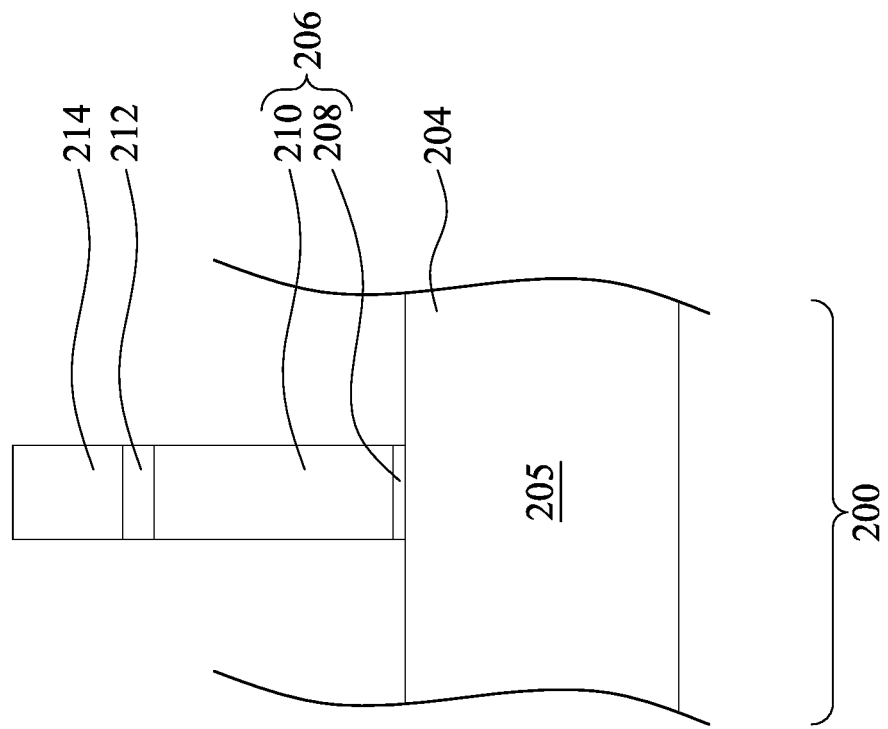
Figure 3B:
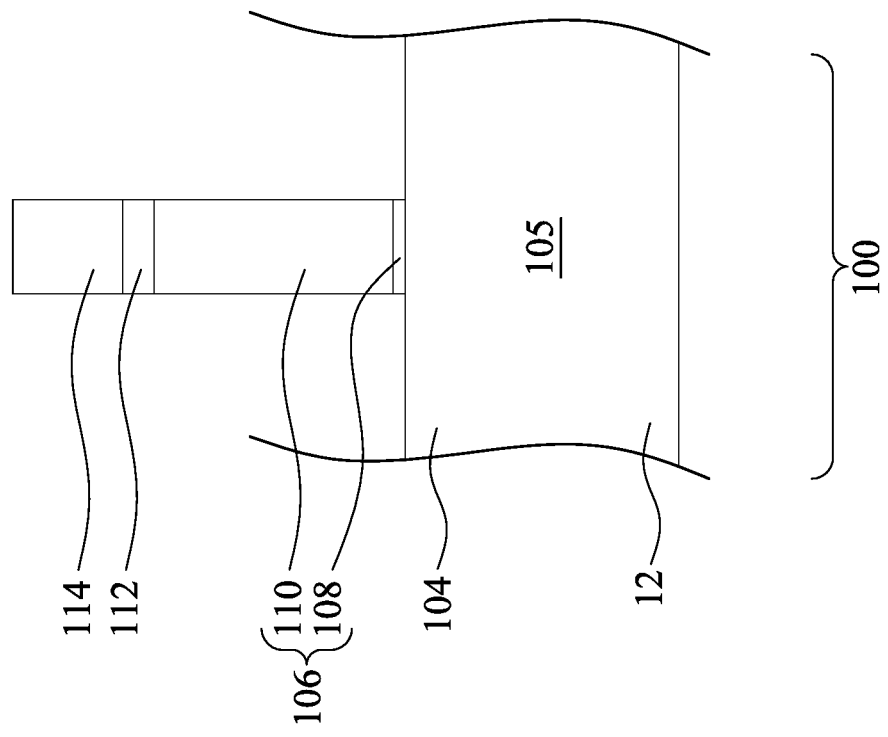

FIG. 3B illustrates a cross-sectional view of device regions 100 and 200 in accordance with some embodiments. The cross-sectional view combines the cross-sectional view obtained from the vertical plane containing line B-B in FIG. 3A and the cross-sectional view obtained from the vertical plane containing line C-C in FIG. 3A, with one or more STI regions 14 separating device regions 100 and 200. Protruding fins 104 and 204 are illustrated schematically. Also, a p-well region 105 and an n-well region 205 may be formed to extend into protruding fins 104 and 204, respectively. The p-well region 105 and the n-well region 205 may also extend into the bulk portion of semiconductor substrate 12 lower than protruding fins 104 and 204. Unless specified otherwise, the cross-sectional views in subsequent figures may also be obtained from planes same as the vertical planes as shown in FIG. 3A, which planes contain lines B-B and C-C, respectively.

Figure 4:
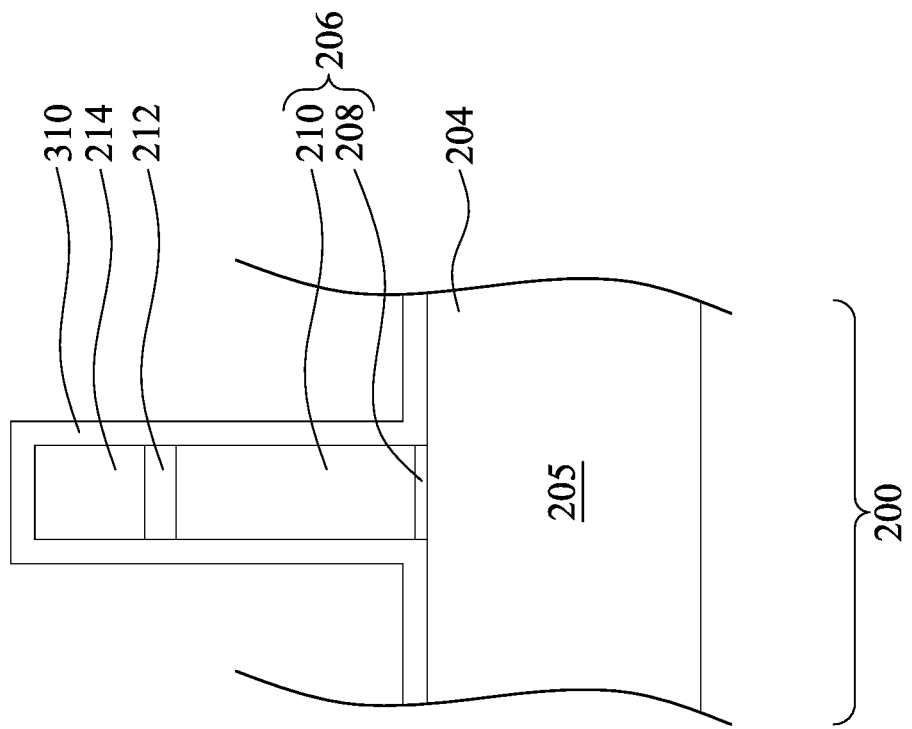
Figure 4:
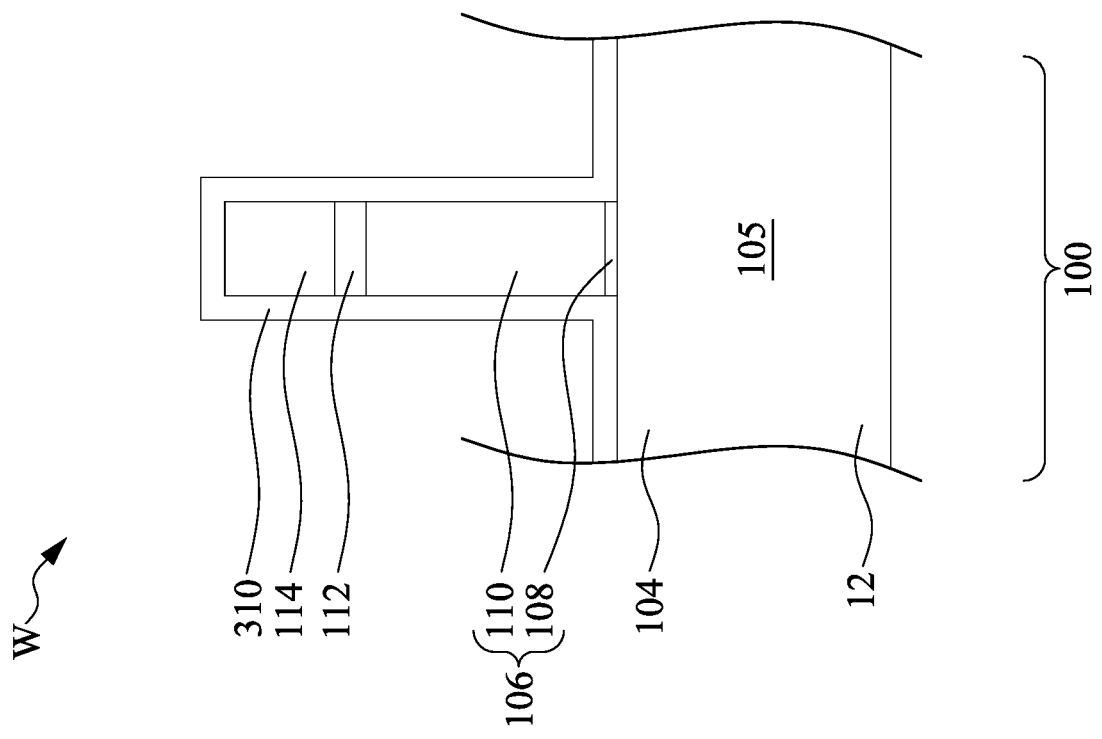

Next, as shown in FIG. 4, a first spacer layer 310 is formed as a blanket layer to cover the wafer W. The respective step is also illustrated as step S13 in the process flow shown in FIG. 16A. In some embodiments, the first spacer layer 310 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials, or other suitable dielectric materials. The first spacer layer 310 may be formed using, for example, CVD, ALD, PVD or other suitable deposition techniques. As a result of deposition of the blanket deposition, the first spacer layer 310 includes different portions respectively in the NFET region 100 and the PFET region 200. In some embodiments, the first spacer layer 310 is a nitrogen-free dielectric layer, so as to remain substantially intact during following etching processes performed to etch silicon nitride, which will be described in greater detail below. For example, the first spacer layer 310 may include silicon oxide, silicon carbide, silicon oxycarbide or other suitable nitrogen-free dielectric materials.

Figure 5:
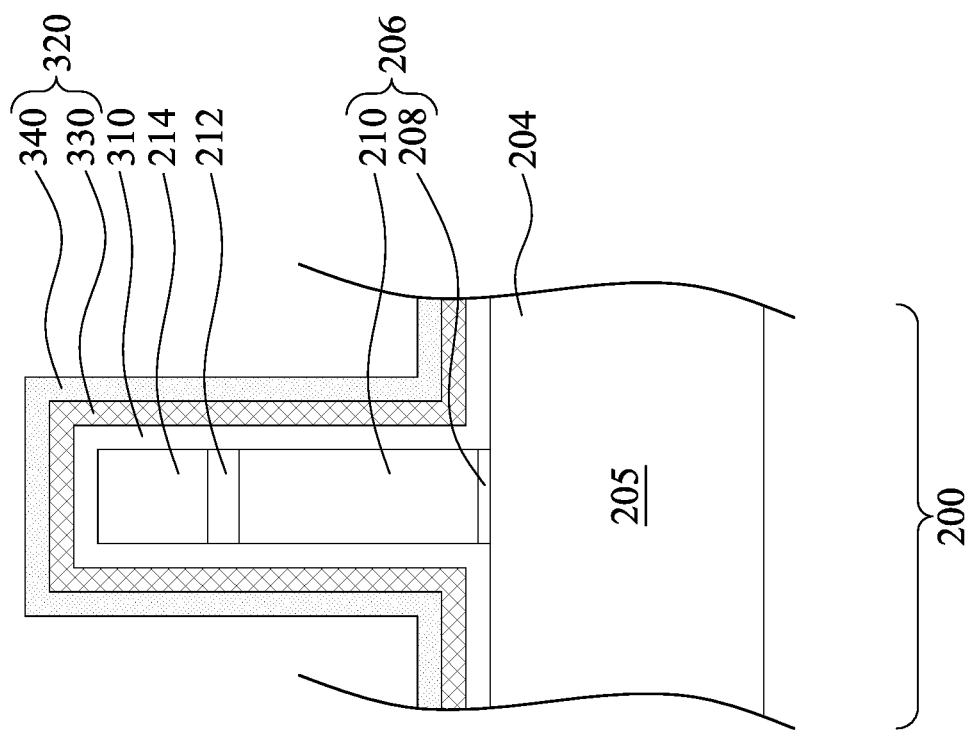
Figure 5:
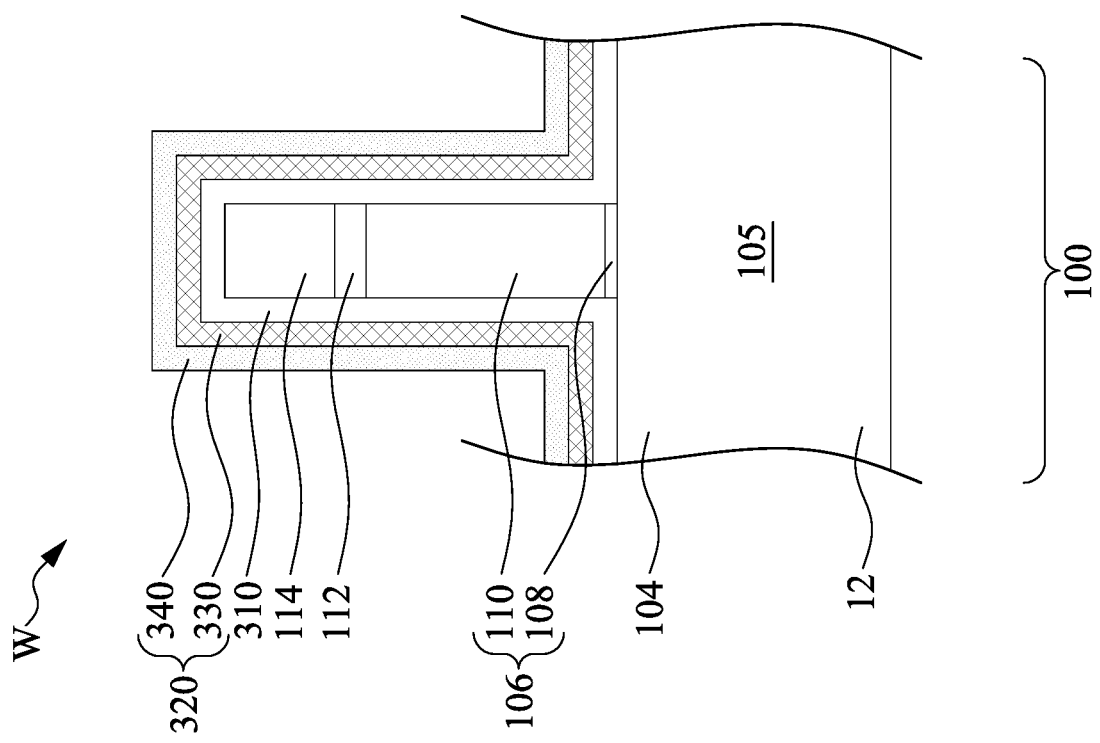

A sacrificial spacer film 320 is then blanket formed to cover the first spacer layer 310, as shown in FIG. 5. The respective step is illustrated as step S14 in the process flow shown in FIG. 16A. The sacrificial spacer film 320 is a bi-layered film that includes an inner dummy spacer layer 330 over the first spacer layer 310 and an outer dummy spacer layer 340 over the inner dummy spacer layer 330. The inner dummy spacer layer 330 and the outer dummy spacer layer 340 have different etch selectivities. For example, the inner and outer dummy spacer layers 330 and 340 are both nitride-based dielectric layers but have different nitrogen atomic percentages and/or different densities that may lead to different etch selectivities. In some particular embodiments, the inner dummy spacer layer 330 and the outer dummy spacer layer 340 include silicon nitride but have different silicon-to-nitrogen ratios and/or different densities. The silicon-to-nitrogen ratio in present disclosure is an atomic ratio of the number of silicon atoms to the number of nitrogen atoms. The Si/N ratio difference and/or density difference are associated with different etch selectivities between the inner dummy spacer layer 330 and the outer dummy spacer layer 340, which in turn will facilitate a following etching process that etches the inner dummy spacer layer 330 at a faster etch rate than it etches the outer dummy spacer layer 340, which will be described in greater detail below.

In some embodiments, the inner dummy spacer layer 330 is a low-temperature silicon nitride layer formed using, for example, PVD, CVD, ALD, thermal CVD (TCVD), PECVD or other suitable deposition techniques, and the outer dummy spacer layer 340 is a high-temperature silicon nitride layer formed using, for example, PVD, CVD, ALD, TCVD, PECVD or other suitable deposition techniques, at a temperature higher than a temperature of formation of the inner dummy spacer layer 330. The temperature difference between formations of the inner and outer dummy spacer layers 330 and 340 leads to different Si/N ratios between the inner and outer dummy spacer layers 330 and 340. More particularly, the low-temperature silicon nitride layer 330 has a lower Si/N ratio than the high-temperature silicon nitride layer 340, thus resulting in different etch selectivities between the low-temperature silicon nitride layer 330 and the high-temperature silicon nitride layer 340.

In some embodiments where the inner dummy spacer layer 330 is a low-temperature silicon nitride layer, the inner dummy spacer layer 330 can be deposited by a thermal CVD process. In the thermal CVD process, a process gas mix comprising a silicon-containing precursor gas and a nitrogen-containing precursor gas is thermally decomposed in a CVD chamber at a low temperature in a range from about 400° C. to a temperature lower than the temperature of depositing the high-temperature silicon nitride layer 340 by about 50° C. If the temperature of forming the inner dummy spacer layer 330 is not lower than the temperature of forming the high-temperature silicon nitride layer 340 by about 50° C., the etch selectivity between the layers 330 and 340 might be unsatisfactorily low for a following selective etching process. If the temperature of forming the inner dummy spacer layer 330 is lower than about 400° C., the deposition rate of the inner dummy spacer layer 330 might be unsatisfactorily low.

In some embodiments, the silicon-containing precursor gas has a weak silicon to silicon single bond (i.e., Si—Si single bond) to enable the molecule to easily decompose at the low temperature. Optionally, the silicon-containing precursor gas may have a chlorine (Cl) atom and/or a nitrogen (N) atom bonded to each of the silicon atoms having a weak single bond. That is, silicon-containing precursor gas may optionally have a Si—Cl functional group and/or a Si—N functional group continuous to the weak Si—Si single bond, thus resulting in improved step coverage. The silicon-containing precursor gas includes, for example, $SiH_4$, disilane, hexachlorodisilane (HCD or $Si_2Cl_6$) and organo silicon containing gases, such as 1,2 diethyl-tetrakis (diethylamino) disilane, 1,2-dichloro-tetrakis (diethylamino) disilane, hexakis (N-pyrrolidino) disilane, and other chlorinated or non-chlorinated alkyl-amino-di or mono-silane $R_2N$—$Si(R'_2)$—$Si_x(R'_2)_y$—$NR_2$ (x=y=0 or 1; R,R'=any combination of Cl, or methyl, or ethyl, or iso-propyl, or other alkyl groups, or another alkylamino group, or cyclic group containing N, or a silyl group). In some embodiments, the nitrogen-containing precursor gas has a weak nitrogen-nitrogen single bond (i.e., N—N single bond) to enable easy decomposition of the nitrogen source gas at the low temperature. The nitrogen-containing precursor gas includes, for example, ammonia ($NH_3$) or $N_2H_4$, combinations or the like.

In some embodiments where the outer dummy spacer layer 340 is a high-temperature silicon nitride layer, the outer dummy spacer layer 340 can be deposited by a thermal CVD process at a higher temperature than that of forming the inner dummy spacer layer 330. In this thermal CVD process, a process gas mix comprising a silicon-containing precursor gas and a nitrogen-containing precursor gas is thermally decomposed in a CVD chamber at a high temperature in a range from a temperature greater than the temperature of forming the inner dummy spacer layer 330 by about 50° C. to about 800° C. If the temperature of forming the outer dummy spacer layer 340 is higher than about 800° C., semiconductor materials (e.g., SiGe fins 204) might reflow. If the temperature of forming the outer dummy spacer layer 340 is not greater than the temperature of forming the inner dummy spacer layer 330 by about 50° C., the etch selectivity between the layers 330 and 340 might be unsatisfactorily low for a following selective etching process. In some embodiments, the silicon-containing precursor gas and the nitrogen-containing precursor gas used in the high-temperature thermal CVD process may be the same as that used in the low-temperature thermal CVD process of forming the inner layer 330.

As a result of the temperature difference as discussed above, the inner dummy spacer layer 330 has a Si/N ratio lower than a Si/N ratio of the outer dummy spacer layer 340. For example, the Si/N ratio of the inner dummy spacer layer 330 is in a range from about 0.5 to about 0.9, and the Si/N ratio of the outer dummy spacer layer 330 is in a range from about 1.0 to about 1.5. Moreover, the temperature difference between formation of the inner dummy spacer layer 330 and formation of the outer dummy spacer layer 340 also leads to different densities between the inner and outer dummy spacer layers 330 and 340. In greater detail, the inner dummy spacer layer 330 has a density lower than a density of the outer dummy spacer layer 340. For example, the density of the inner dummy spacer layer 330 is in a range from about 2.65 g/cm$^3$ to about 2.73 g/cm$^3$, and the density of the outer dummy spacer layer 340 is in a range from about 2.81 g/cm$^3$ to about 2.89 g/cm$^3$.

It is observed that the higher the Si/N ratio (and/or the density) of a silicon nitride layer, the slower the etch rate of the silicon nitride layer in a wet etching process using phosphoric acid ($H_3PO_4$) as the etchant. For example, the outer dummy spacer layer 340 having a Si/N ratio in a range from about 1.0 to about 1.5 and/or a density in a range from about 2.81 g/cm$^3$ to about 2.89 g/cm$^3$ has an etch rate in a range from about 57.3 angstroms/minute to about 67.3 angstroms/minute when soaking in phosphoric acid. In contrast, the inner dummy spacer layer 330 having a Si/N ratio in a range from about 0.5 to about 0.9 and/or a density in a range from about 2.65 g/cm$^3$ to about 2.73 g/cm$^3$ has an etch rate in a range from about 120 angstroms/minute to about 130 angstroms/minute when soaking in phosphoric acid. As a result, the phosphoric acid can be used as an etchant in one or more following etching processes that selectively etch the inner dummy spacer layer 330 at a faster etch rate than etching the outer dummy spacer layer 340.

Figure 6:
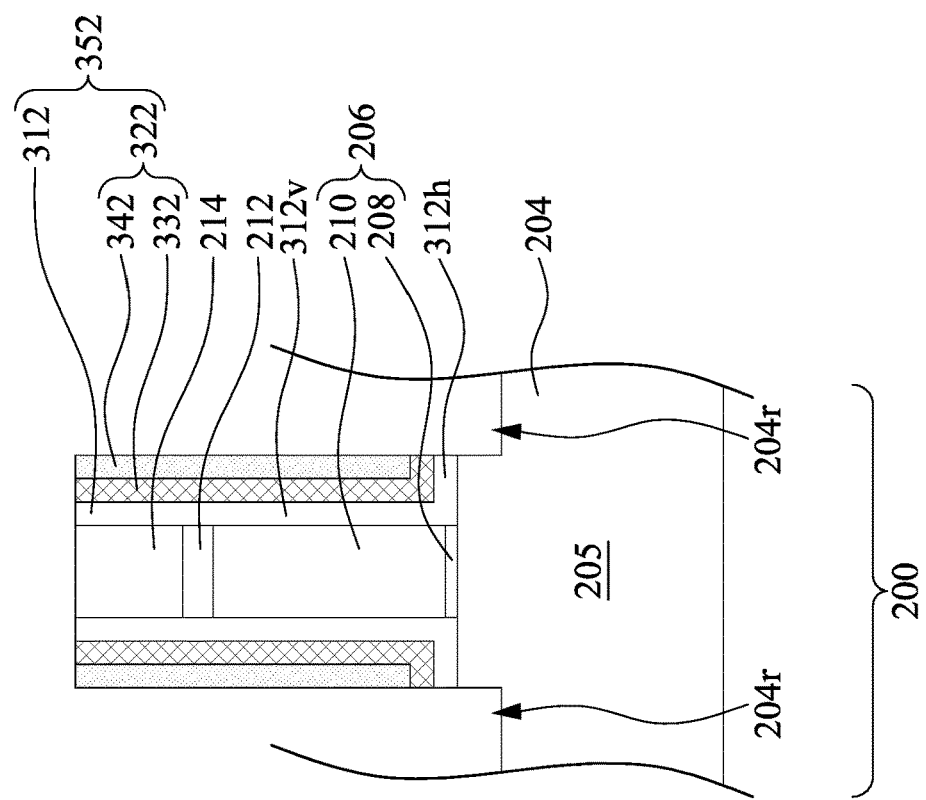
Figure 6:
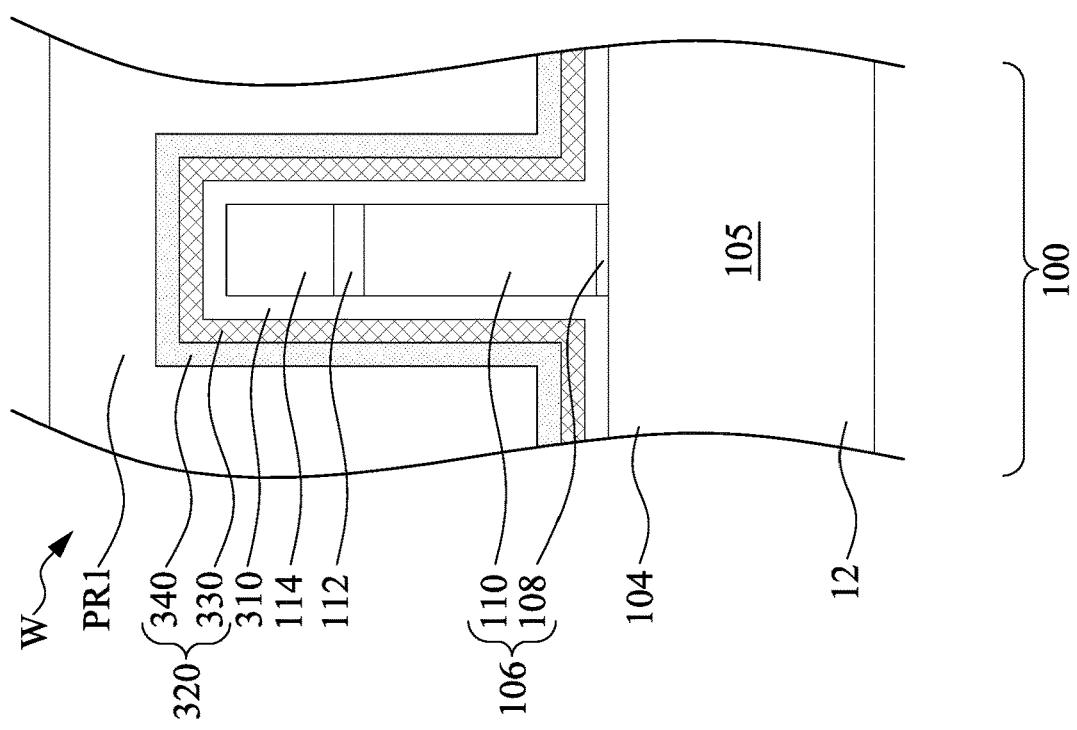

FIG. 6 illustrates patterning of the first spacer layer 310 and the sacrificial spacer film 320 in the PFET region 200. First, a photoresist PR1 (e.g., a single-layer photo resist or a tri-layer photo resist) is applied and patterned to cover the NFET region 100 and leaves the PFET region 200 uncovered. Next, an anisotropic etching process is performed to etch the sacrificial spacer film 320 and the first spacer layer 310 in the uncovered PFET region 200, so that horizontal portions of the sacrificial spacer film 320 and the first spacer layer 310 are removed, exposing at least a top surface of the semiconductor fin 204. The respective step is illustrated as step S15 in the process flow shown in FIG. 16A. The remaining portion 312 of the first spacer layer 310 and the remaining portion 322 of the sacrificial spacer film 320 on sidewalls of the gate stack 206 are in combination referred to gate spacers 352.

As a result of the patterning, the patterned first spacer layer 312 has a substantially L-shaped cross section and thus having a substantially horizontal portion 312h extending along the top surface of the semiconductor fin 204 and a substantially vertical portion 310v extending along a sidewall of the gate stack 206. The patterned sacrificial spacer film 322 has a bottom surface in contact with a top surface of the horizontal portion 312h of the patterned first spacer layer 312 and a sidewall in contact with a sidewall of the vertical portion 312v of the patterned first spacer layer 312. Moreover, the sacrificial spacer film 322 includes a remaining portion 332 of the inner dummy spacer layer 330 and a remaining portion 342 of the outer dummy spacer layer 340. The inner dummy spacer layer 332 has a substantially L-shaped cross section, and the outer dummy spacer layer 342 has a linear-shaped cross section and extends along a sidewall of the inner dummy spacer layer 332.

In a subsequent step, the exposed semiconductor fin 204 is recessed, for example, in an anisotropic or isotropic etching step, so that recesses 204r are formed to extend into the semiconductor fin 204. The respective step is illustrated as step S16 in the process flow shown in FIG. 16A. The etching is performed using an etchant that attacks the semiconductor fin 204, and hardly attacks the gate spacers 352. Stated differently, the first spacer layer 312, the inner dummy spacer layer 332 and the outer dummy spacer layer 342 have higher etch resistance to the etching process than that of the semiconductor fin 204. Accordingly, in the etching step, the heights of gate spacers 352 are substantially not reduced.

In some embodiments, recessing the semiconductor fin 204 may be performed by a dry chemical etch with a plasma source and an etchant gas. The plasma source may be inductively coupled plasma (ICR) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the semiconductor fin 204 at a faster etch rate than it etches the gate spacers 352. In some other embodiments, recessing the semiconductor fin 204 may be performed by a wet chemical etch, such as ammonium peroxide mixture (APM), NH$_4$OH, tetramethylammonium hydroxide (TMAH), combinations thereof, or the like, which etches the semiconductor fin 204 at a faster etch rate than it etches the gate spacers 352. In some other embodiments, recessing the semiconductor fin 204 may be performed by a combination of a dry chemical etch and a wet chemical etch. In some embodiments, after the formation of recesses 204r, the photoresist PR1 is removed, for example, in an ashing step.

Figure 7:
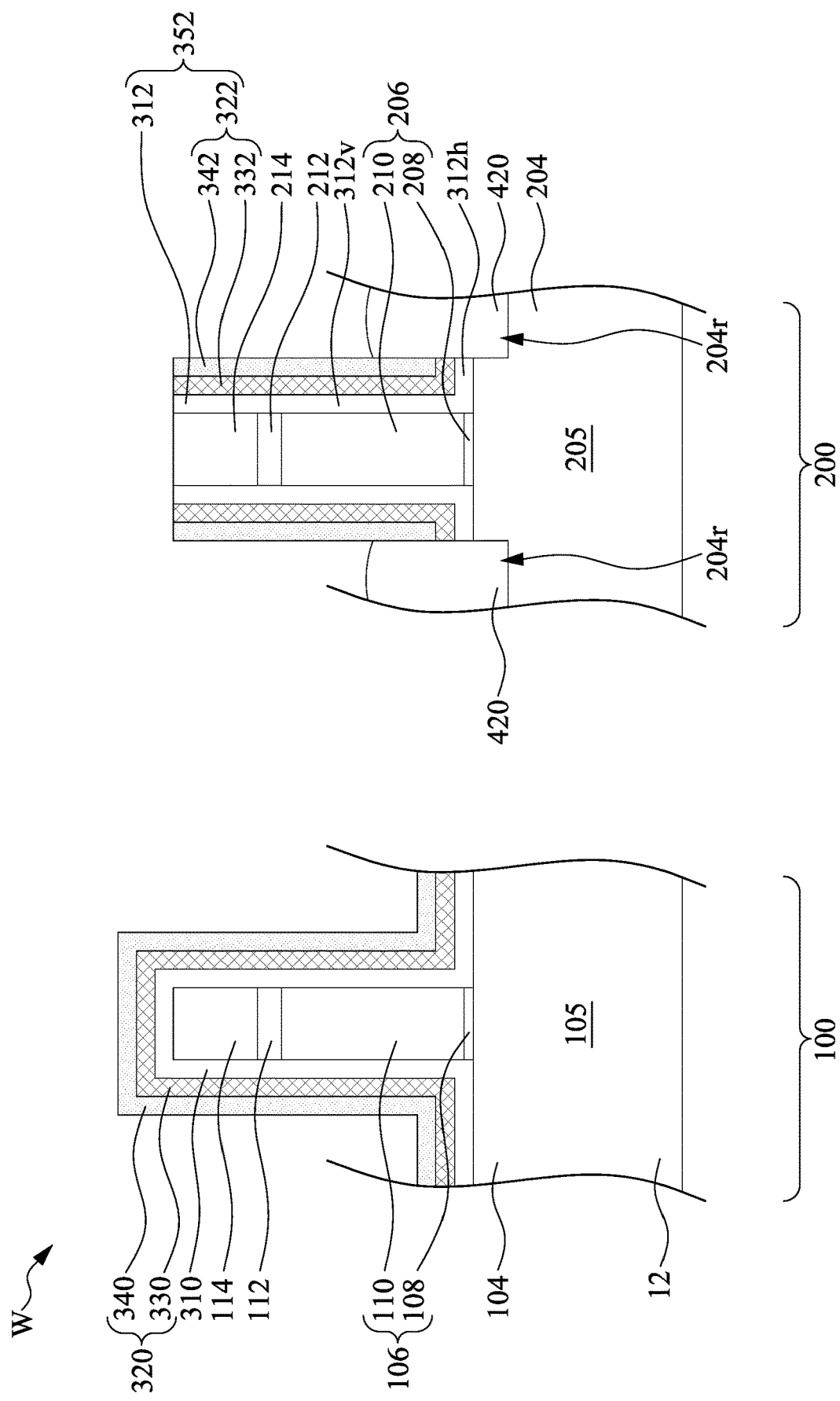

FIG. 7 illustrates epitaxy for forming epitaxy structures 420 in the PFET region 200. In accordance with some embodiments of the present disclosure, the epitaxy structures 420 may be formed using one or more epitaxy or epitaxial (epi) processes, such that Si, SiGe, SiGeB, Ge or a III-V compound semiconductor such as InSb, GaSb, InGaSb, or the like can be grown on the semiconductor fin 204. The respective step is illustrated as step S17 in the process flow shown in FIG. 16A. In some embodiments, a p-type impurity (e.g., boron) may be in-situ doped in the epitaxy structures 420, so that the resulting FinFETs formed in the PFET region 200 are p-type FinFETs. In some embodiments, the lattice constants of the epitaxy structures 420 are different from the lattice constant of the semiconductor fin 204, so that the channel region between the epitaxy structures 420 can be strained or stressed by the epitaxy structures 420 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 204.

If the photoresist PR1 (as shown in FIG. 6) remains covering the NFET region 100 during the epitaxy process, the epitaxy process (e.g., plasmas in the PECVD process) might cause damages to the photoresist PR1. Such damages might lead to increased photoresist scums (or residues) on the NFET region 100 after the photoresist ashing process. However, because the photoresist PR1 is removed prior to epitaxially growing the epitaxy structures 420, the photoresist scums in the NFET region 100 can be reduced.

Figure 8:
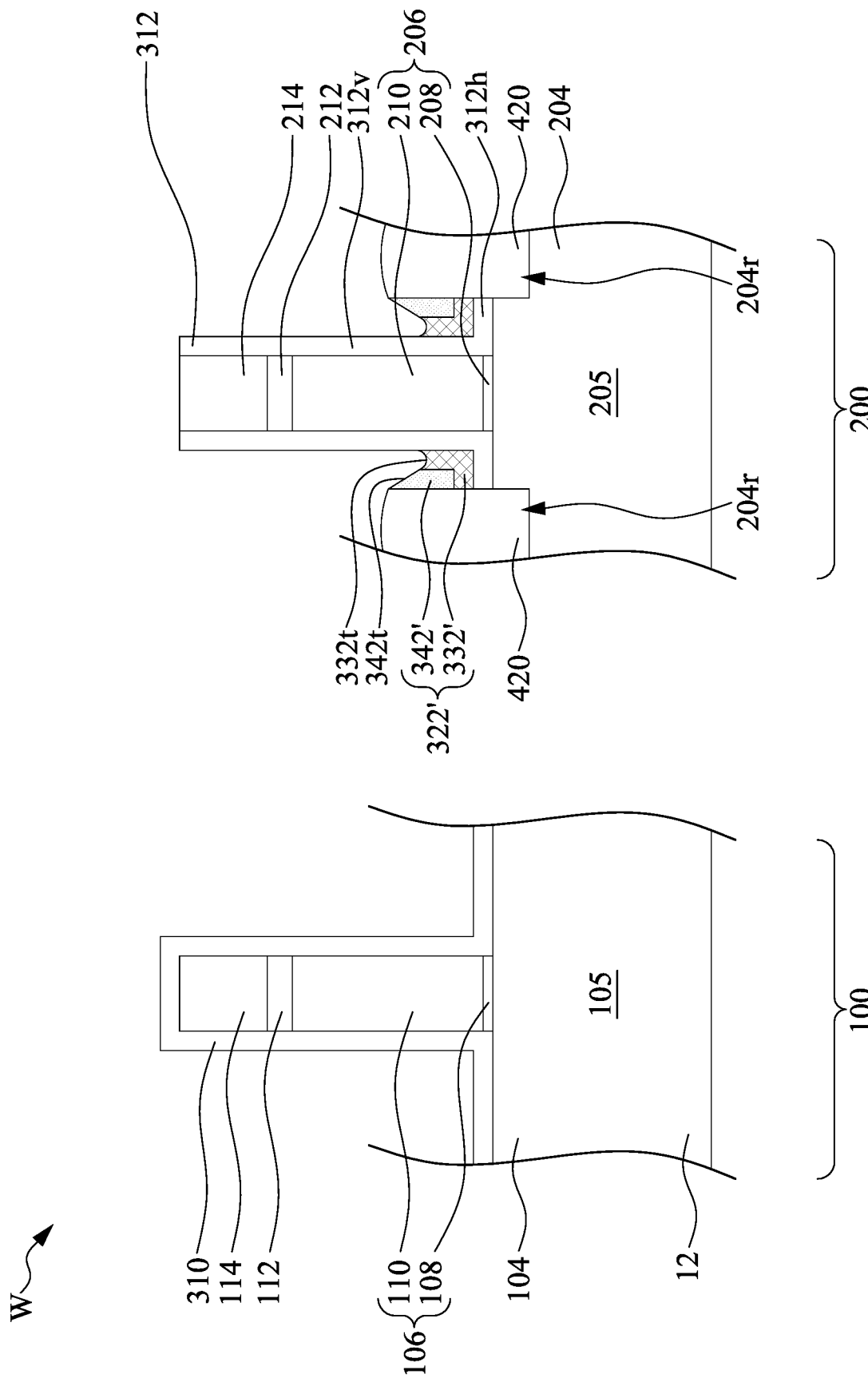

Next, the sacrificial spacer films 320 and 322 are etched, and the resulting structure is illustrated in FIG. 8. The respective step is illustrated as step S18 in the process flow shown in FIG. 16A. In accordance with some embodiments of the present disclosure, etching the sacrificial spacer films 320 and 322 includes a selective etching process which etches the sacrificial spacer films 320 and 322 at a faster rate than it etches other materials on the wafer W. In particular, the etchant is selected to etch the sacrificial spacer films 320 and 322 at a faster rate than it etches the first spacer layers 310 and 312. Stated differently, the sacrificial spacer films 320 and 322 have lower etch resistance to the etchant used in the etching process than that of the first spacer layers 310 and 312. In this way, the first spacer layers 310 and 312 remain substantially intact during the etching process.

In some embodiments, the etchant used to selectively etch the sacrificial spacer films 320 and 322 includes, for example, phosphoric acid (H$_3$PO$_4$). In greater detail, the etching process includes soaking the wafer W in the phosphoric acid bath a given temperature for a given duration. The etching duration is selected so that the sacrificial spacer film 320 is substantially completely removed from the NFET region 100, but a portion 322' of the sacrificial spacer film 322 in the PFET region 200 still remains in the gap between the first spacer layer 312 and the epitaxy structure 420 due to the aspect ratio of the gap. The remaining sacrificial spacer film 322' includes a remaining portion 332' of the inner dummy spacer layer 332 and a remaining portion 342' of the outer dummy spacer layer 342. As discussed previously, the phosphoric acid can etch the inner dummy spacer layer 332 at a faster rate than it etches the outer dummy spacer layer 342, because the inner dummy spacer layer 332 has a lower Si/N ratio and/or lower density than that of the outer dummy spacer layer 342. Stated differently, the outer dummy spacer layer 342 has higher etch resistance to phosphoric acid than that of the inner dummy spacer layer 332. As a result, after soaking the wafer W in the phosphoric acid bath, the remaining outer dummy spacer layer 342' has a topmost end 342t higher than a topmost end 332t of the remaining inner dummy spacer layer 332'. Moreover, the sidewall of the epitaxy structure 420 remains covered by the outer dummy spacer layer 342'. Therefore, the sidewall of the epitaxy structure 420 can be protected from another phosphoric acid etching in a following step (e.g., step S23 as shown in FIG. 16B), which will be described in greater detail below.

Figure 9:
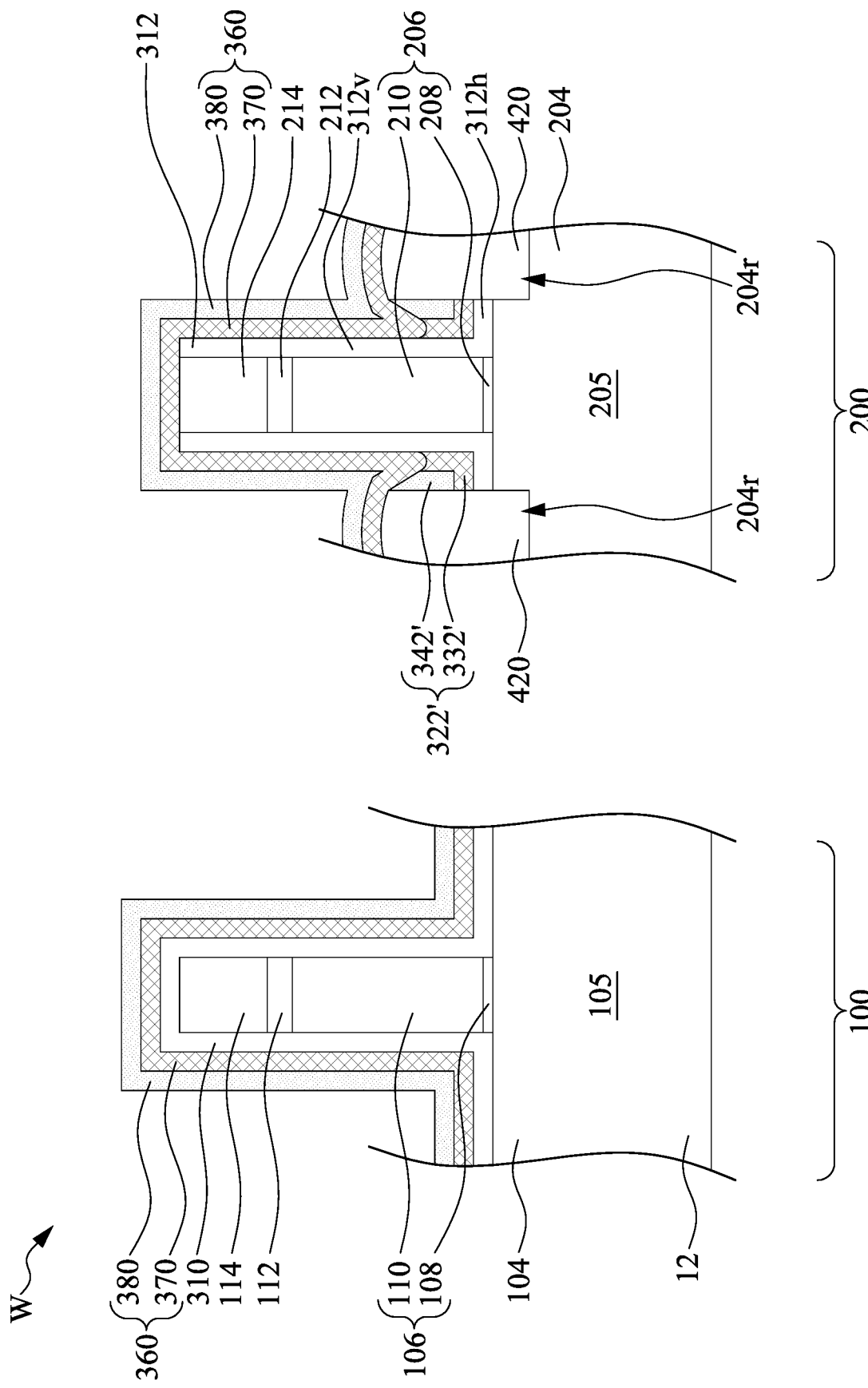

FIG. 9 illustrates forming another sacrificial spacer film 360 blanket over the wafer W. The respective step is illustrated as step S19 in the process flow shown in FIG. 16B. The bi-layered dummy spacer film 360 includes an inner dummy spacer layer 370 and an outer dummy spacer layer 380 over the inner dummy spacer layer 370. The inner dummy spacer layer 370 has a different etch selectivity than an etch selectivity of the outer dummy spacer layer 380. In some embodiments, the inner dummy spacer layer 370 and the outer dummy spacer layer 380 include silicon nitride, but the inner dummy spacer layer 370 has a lower Si/N ratio and/or lower density than that of the outer dummy spacer layer 380, which in turn will facilitate to etch the inner dummy spacer layer 370 at a faster rate than etching the outer dummy spacer layer 380 using phosphoric acid as an etchant in a following step, which will be described in greater detail below. In some embodiments, the inner dummy spacer layer 370 is a low-temperature silicon nitride layer formed using substantially the same process conditions as discussed previously with respect to the inner dummy spacer layer 330, and thus formation of the inner dummy spacer layer 370 is not discussed herein for the sake of brevity. In some embodiments, the outer dummy spacer layer 380 is a high-temperature silicon nitride layer formed using substantially the same process conditions as discussed previously with respect to the outer dummy spacer layer 340, and thus formation of the inner dummy spacer layer 380 is not discussed herein for the sake of brevity.

Figure 11:
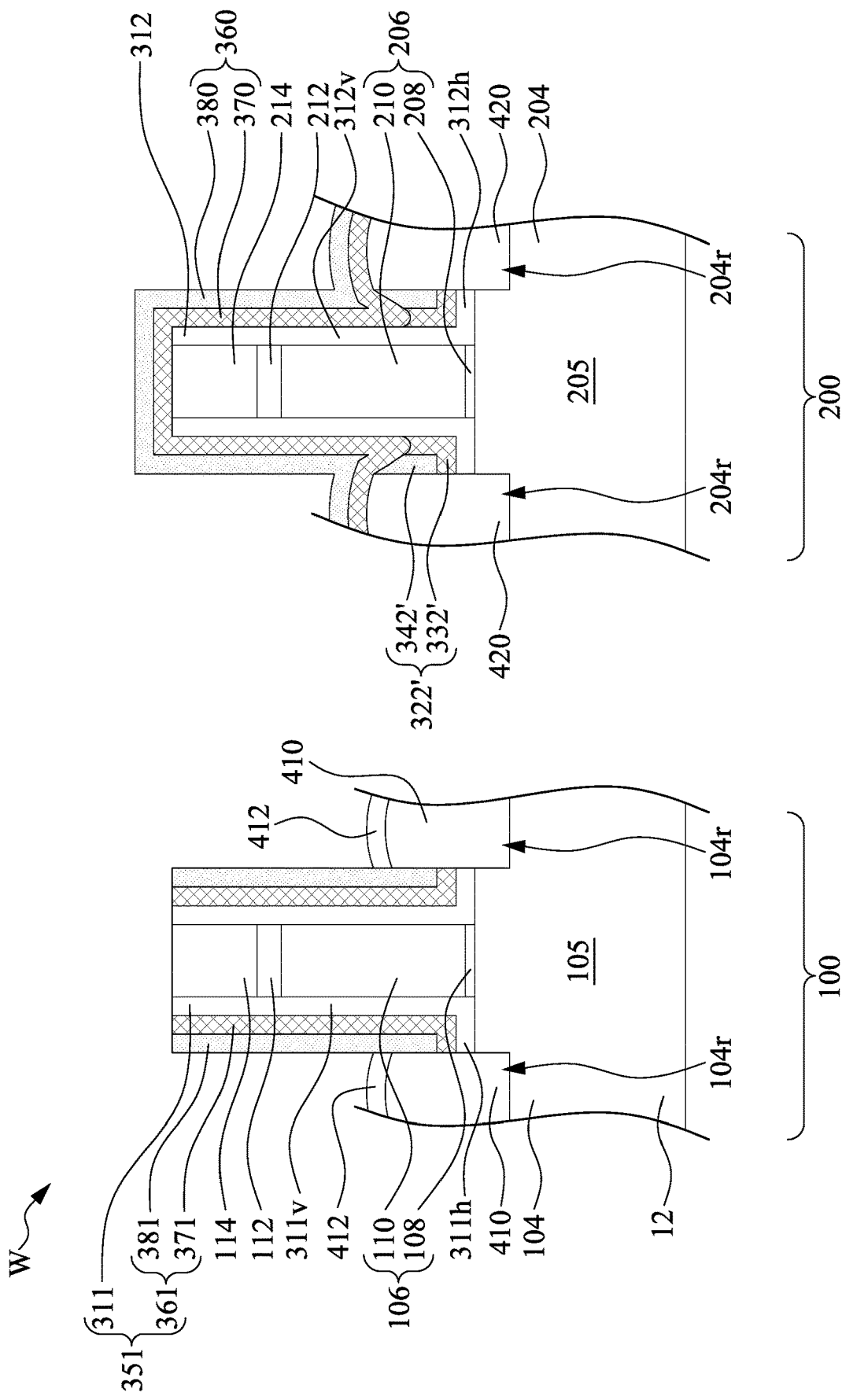

As shown in FIG. 9, the sacrificial spacer film 360 caps the p-type epitaxy structures 420, thus preventing n-type epitaxy structures from being epitaxially grown on the p-type epitaxy structures 420 in a following step (e.g., the epitaxy step as shown in FIG. 11). Notably, if removal of the previous sacrificial spacer film 320 from the NFET region 100 (i.e., step S18 illustrated the process flow in FIG. 16A) is skipped, deposition of the sacrificial spacer film 360 would result in double sacrificial spacer films 320 and 360 in the NFET region 100, which in turn would form thicker vertical spacers on sidewalls of the gate stacks 106 than that formed by a single sacrificial spacer film 360 as illustrated in FIG. 9. The thicker vertical spacers would increase a distance between subsequently formed recesses in the fin 104, which in turn would result in an unsatisfactory source/drain proximity on the fin 104 (i.e., a unsatisfactory distance between the subsequently formed n-type epitaxy structures on the fin 104). However, because the previous sacrificial spacer film 320 is removed from the NFET region 100, the later sacrificial spacer film 360 can be formed directly on the first spacer layer 310 in the NFET region 100, which in turn will result in a satisfactory source/drain proximity on the fin 104 (i.e., a satisfactory distance between the subsequently formed n-type epitaxy structures on the fin 104 (as shown in FIG. 11)).

Figure 10:
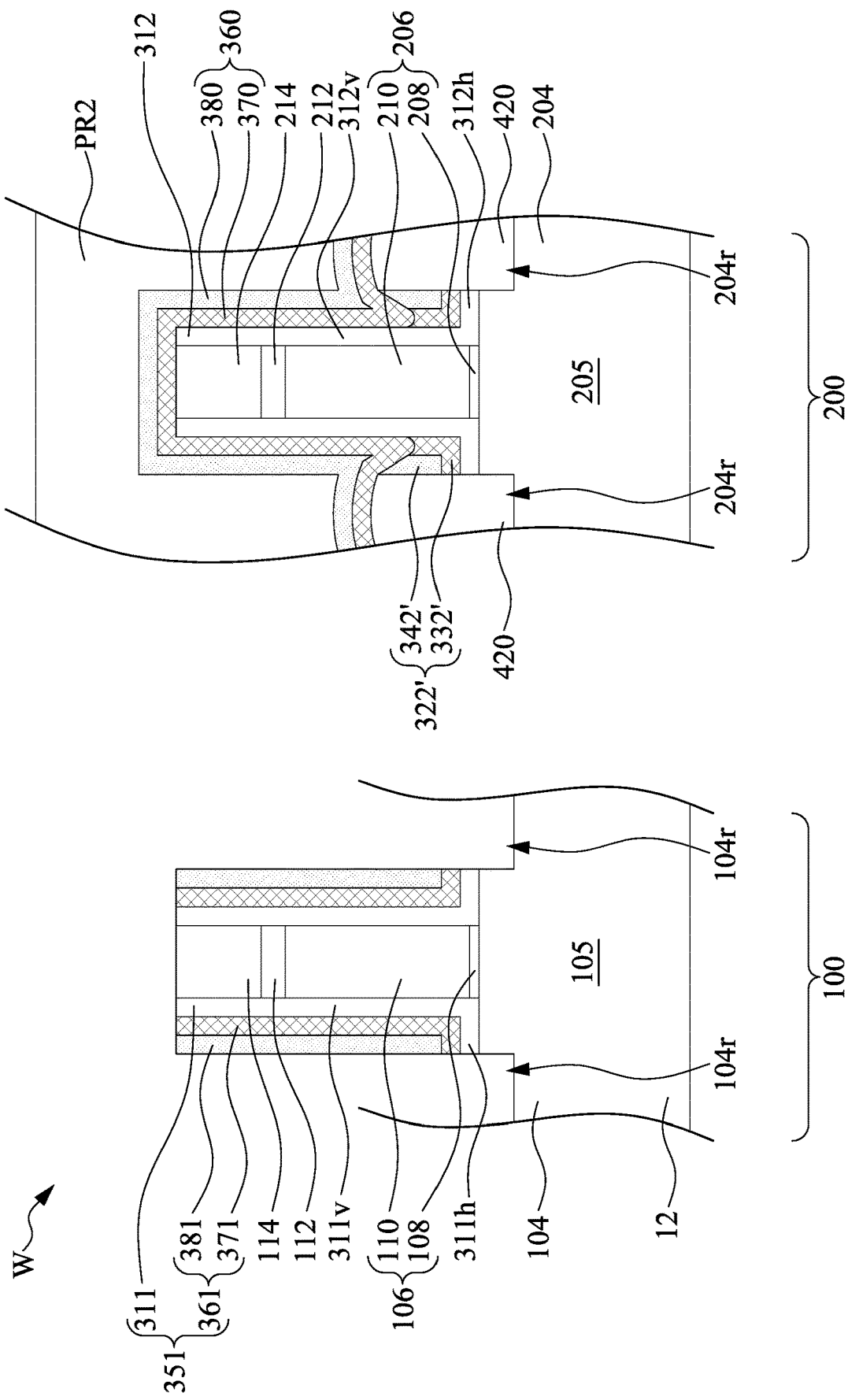

FIG. 10 illustrates patterning of the first spacer layer 310 and the sacrificial spacer film 360 in the NFET region 100. First, a photoresist PR2 (e.g., a single-layer photo resist or a tri-layer photo resist) is applied and patterned to cover the PFET region 200 and leaves the NFET region 100 uncovered. Next, an anisotropic etching process is performed to etch the sacrificial spacer film 360 and the first spacer layer 310 in the uncovered NFET region 100, so that horizontal portions of the sacrificial spacer film 360 and the first spacer layer 310 are removed, exposing at least a top surface of the semiconductor fin 104. The respective step is illustrated as step S20 in the process flow shown in FIG. 16B. The remaining portion 311 of the first spacer layer 310 and the remaining portion 361 of the sacrificial spacer film 360 on sidewalls of the gate stack 106 are in combination referred to gate spacers 351.

As a result of the patterning, the patterned first spacer layer 311 has a substantially L-shaped cross section and thus having a substantially horizontal portion 311h extending along the top surface of the semiconductor fin 104 and a substantially vertical portion 311v extending along a sidewall of the gate stack 106. The patterned sacrificial spacer film 361 has a bottom surface in contact with a top surface of the horizontal portion 311h of the patterned first spacer layer 311 and a sidewall in contact with a sidewall of the vertical portion 311v of the patterned first spacer layer 311. Moreover, the sacrificial spacer film 361 includes a remaining portion 371 of the inner dummy spacer layer 370 and a remaining portion 381 of the outer dummy spacer layer 380. The inner dummy spacer layer 371 has a substantially L-shaped cross section, and the outer dummy spacer layer 381 has a linear-shaped cross section and extends along a sidewall of the inner dummy spacer layer 371.

In a subsequent step, the exposed semiconductor fin 104 is recessed, for example, in an anisotropic or isotropic etching step, so that recesses 104r are formed to extend into the semiconductor fin 104. The respective step is illustrated as step S21 in the process flow shown in FIG. 16B. The etching is performed using an etchant that attacks the semiconductor fin 104, and hardly attacks the gate spacers 351. Accordingly, in the etching step, the heights of gate spacers 351 are substantially not reduced. Example etching processes and etchants are substantially the same as that discussed previously with respect to recessing the semiconductor fin 204, and thus they are not repeated herein for the sake of brevity. After the formation of recesses 104r, the photoresist PR2 is removed, for example, in an ashing step.

FIG. 11 illustrates epitaxy for forming epitaxy structures 410 in the NFET region 100. In accordance with some embodiments of the present disclosure, the epitaxy structures 410 may be in-situ doped with an n-type impurity (e.g., phosphorus), so that the resulting FinFETs formed in the NFET region 100 are n-type FinFETs. The respective step is illustrated as step S22 in the process flow shown in FIG. 16B. In some embodiments, the epitaxy structures 410 may include Si, SiP, SiC, SiPC, or a III-V compound semiconductor such as InP, GaAs, AlAs, InAs, InAlAs, InGaAs, or the like. In some embodiments where the epitaxy structures 410 include SiP, the epitaxy structures 410 can be referred to as phosphorus-containing semiconductor structures. In some embodiments, the lattice constants of the epitaxy structures 410 are different from the lattice constant of the semiconductor fin 104, so that the channel region between the epitaxy structures 410 can be strained or stressed by the epitaxy structures 410 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 104.

In some embodiments, protective caps 412 can be optionally formed over the epitaxy structures 410 using, for example, an epitaxy process that use gaseous and/or liquid precursors, which interact with the composition of the n-type epitaxy structures 410. The protective caps 412 have a slower etch rate than the epitaxy structures 410 in a following etching process used to etch the bi-layered dummy spacer films, thus reducing damages to the epitaxy structures 410 caused by the following etching process. For example, in some embodiments where the bi-layered dummy spacer films are etched using phosphoric acid in a following step, the phosphoric acid would etch SiP in a faster etch rate than it etches other semiconductor materials (e.g., Si, SiGe and so on), which in turn might cause damages to the epitaxy structures 410 if they are made of SiP. Such damages would lead to SiP volume loss and hence increased source/drain contact resistance. Therefore, the protective caps 412 may be made of a phosphorus-free semiconductor material (e.g., pure silicon free from phosphorus), which has a lower phosphorus atomic concentration than the epitaxy structure 410, so as to reduce damages to the epitaxy structures 410 caused by the following etching process using phosphoric acid.

Figure 12:
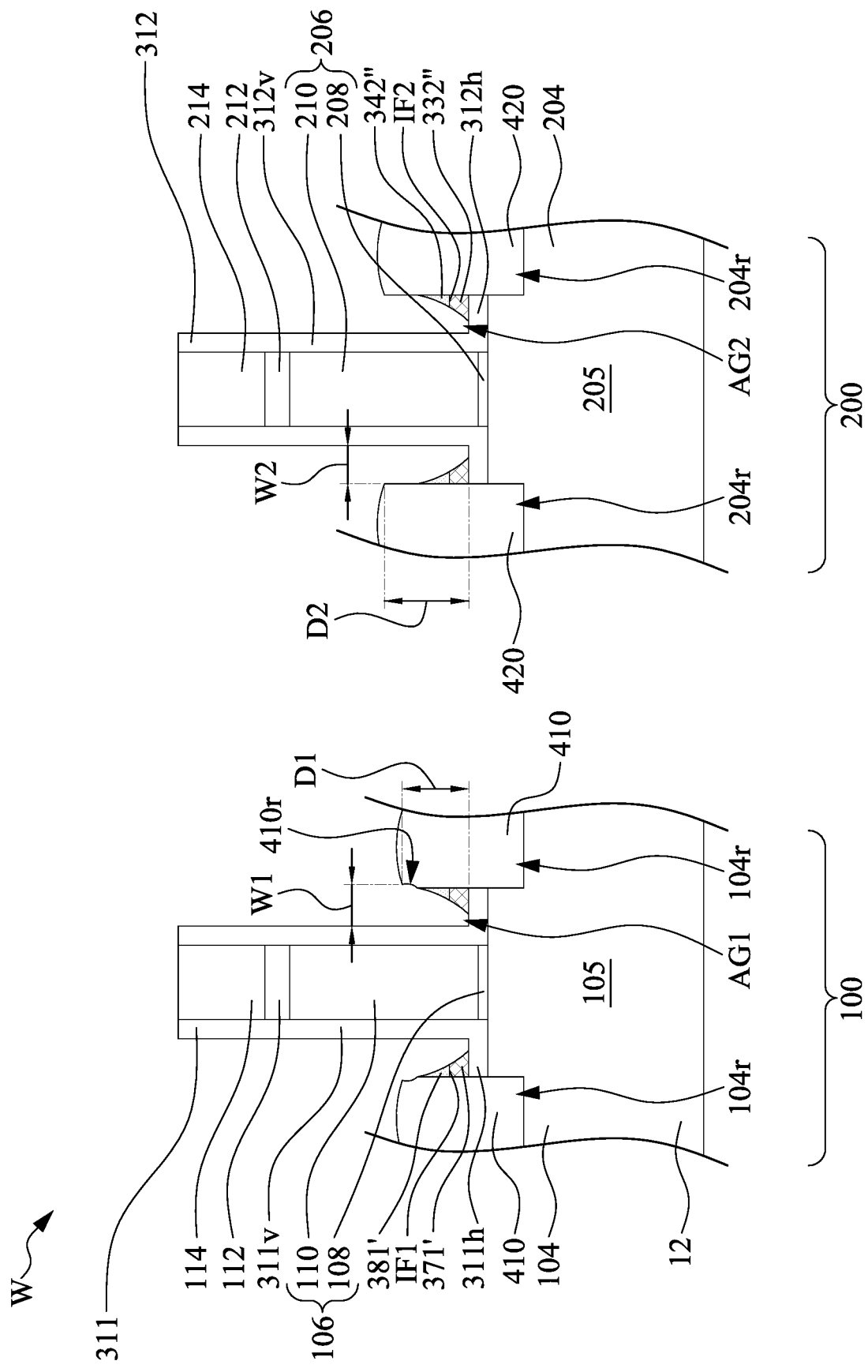

Next, the sacrificial spacer films 360, 361 and 322' are etched, and the resulting structure is illustrated in FIG. 12. The respective step is illustrated as step S23 in the process flow shown in FIG. 16B. In accordance with some embodiments of the present disclosure, etching the sacrificial spacer films 360, 361 and 322' includes a selective etching process which etches the sacrificial spacer films 360, 361 and 322' at a faster rate than it etches other materials on the wafer W. In particular, the etchant is selected to etch the sacrificial spacer films 360, 361 and 322' at a faster rate than it etches the first spacer layers 311 and 312. Stated differently, the sacrificial spacer films 360, 361 and 322' have lower etch resistance to the etchant used in the etching process than that of the first spacer layers 311 and 312. In this way, the first spacer layers 311 and 312 remain substantially intact during the etching process.

Figure 13:
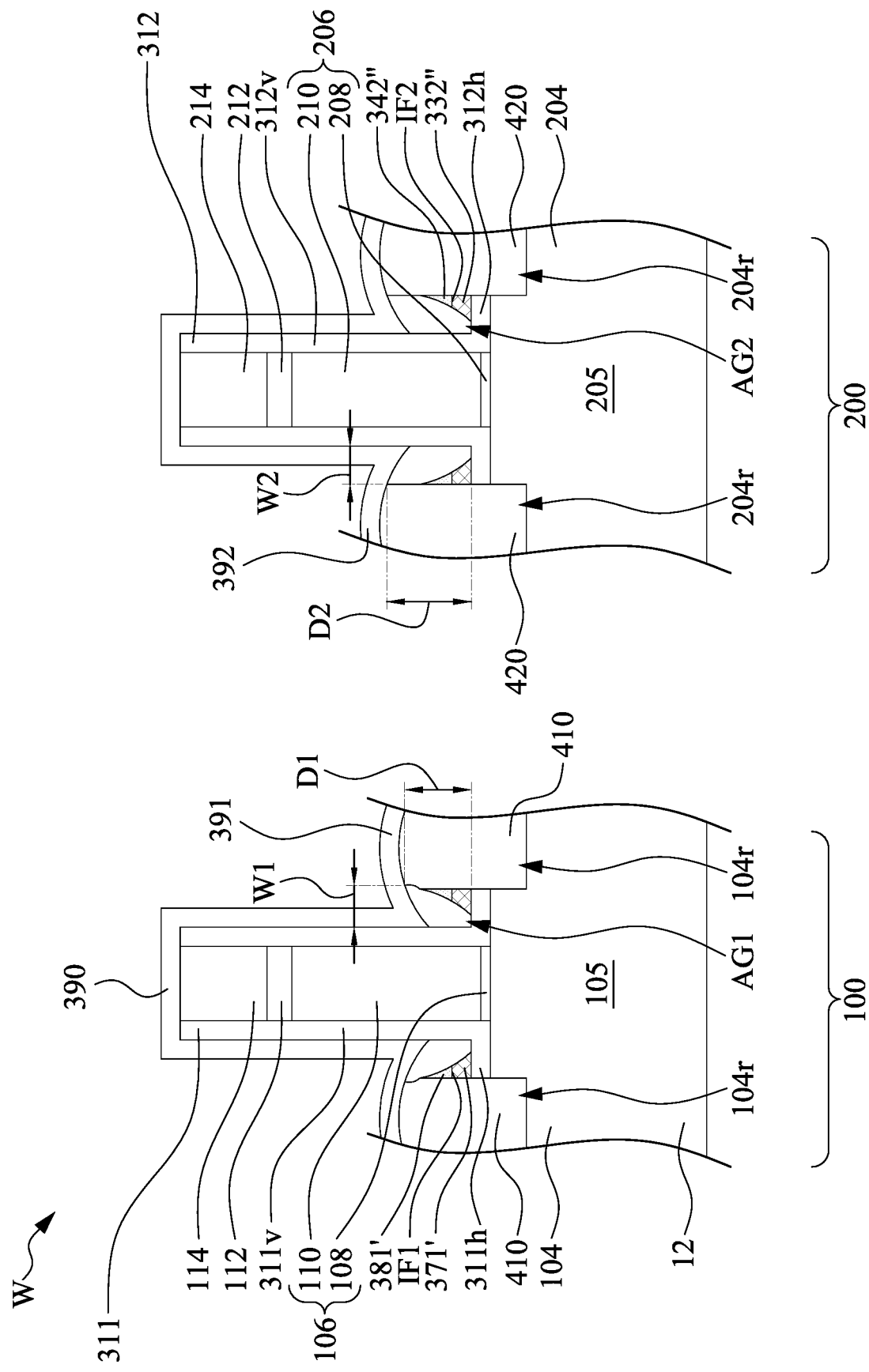

The etchant used to selectively etch the sacrificial spacer films 360, 361 and 322' includes, for example, phosphoric acid ($H_3PO_4$). In greater detail, the etching process includes soaking the wafer W in the phosphoric acid bath a given temperature for a given duration. In some embodiments, the duration of soaking the wafer W in the phosphoric acid at step S23 is longer than that at step S18, so as to create air gaps AG1 between the raised n-type epitaxy structures 410 and the first spacer layer 311 and air gaps AG2 between the raised p-type epitaxy structures 420 and the first spacer layer 312. These air gaps AG1 and AG2 have high aspect ratios so that the air gaps AG1 and AG2 will not be filled by a following deposited spacer layer 390 (as shown in FIG. 13). For example, the air gaps AG1 each have a width W1 and a depth D1, and an aspect ratio of the depth D1 to the width W1 is in a range from about 5:1 to about 8:1. Similarly, the air gaps AG2 each have a width W2 and a depth D2, and an aspect ratio of the depth D2 to the width W2 is in a range from about 5:1 to about 8:1.

As discussed previously, the phosphoric acid etches the outer dummy spacer layers 381, 380 and 342' at a slower etch rate than it etches the inner dummy spacer layer 371, 370 and 332', because the outer dummy spacer layers 381, 380 and 342' have a higher Si/N ratio and/or higher density than that of the inner dummy spacer layer 371, 370 and 332'. Stated differently, the outer dummy spacer layers 381, 380 and 342' have higher etch resistance to phosphoric acid than that of the inner dummy spacer layer 371, 370 and 332'. As a result, in some embodiments where the epitaxy structures 410 are made of SiP, the outer dummy spacer layer 381 can reduce damages to the SiP epitaxy structures 410 caused by the phosphoric acid, which in turn will reduce SiP volume loss and thus improve the source/drain contact resistance.

Moreover, as discussed previously, the phosphorus-free protective caps 412 have higher etch resistance to phosphoric acid than that of SiP epitaxy structures 410. Therefore, the protective caps 412 can also reduce damages to the respective SiP epitaxy structures 410 caused by the phosphoric acid. In some embodiments, the protective caps 412 may be consumed during the etching process, and thus the SiP epitaxy structures 410 may be free from coverage by the respective protective caps 412 after the etching process.

Figure 16A:
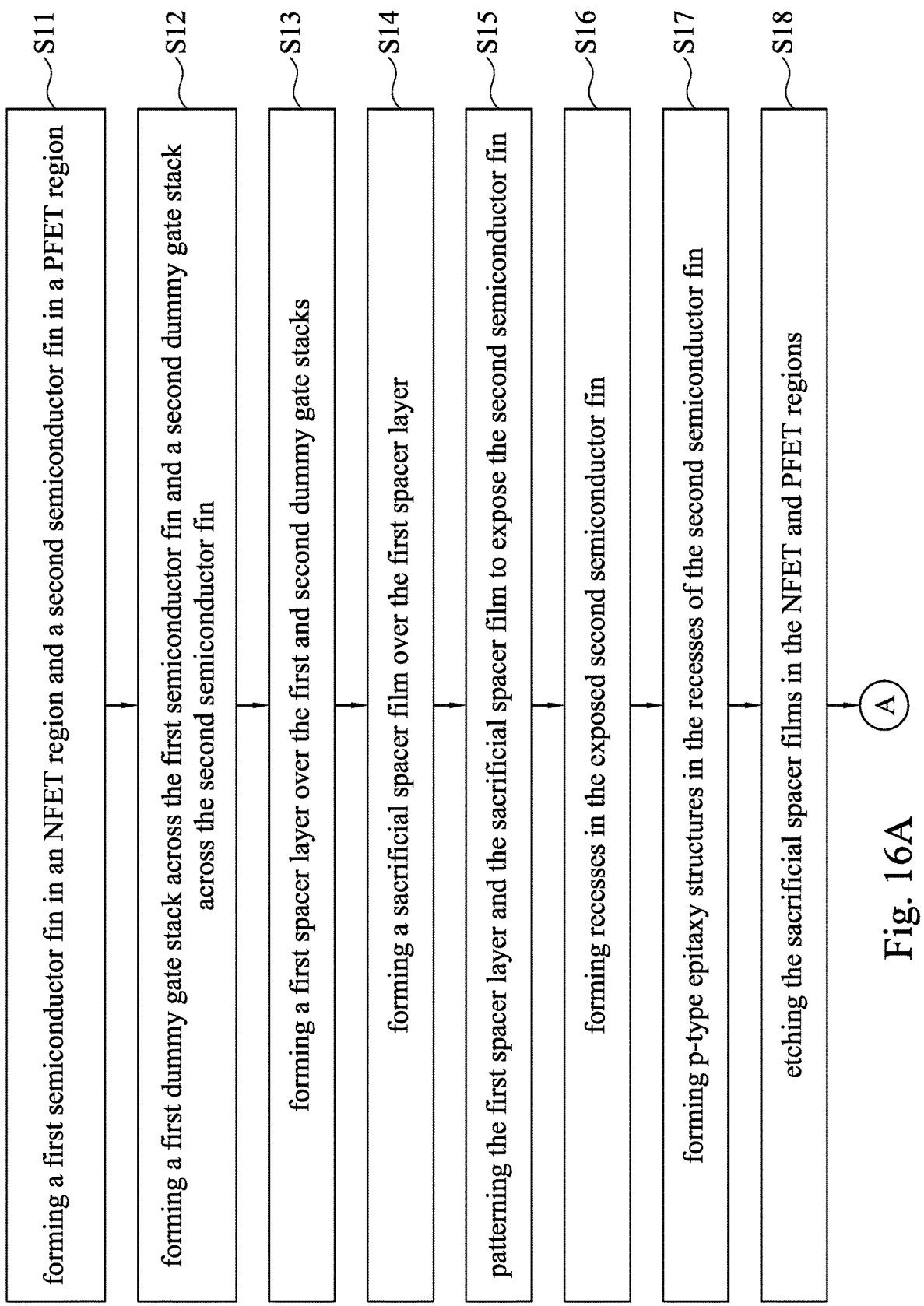
FIGS. 16A and 16B illustrate a flow chart of a process for forming transistors in accordance with some embodiments.
Figure 16B:
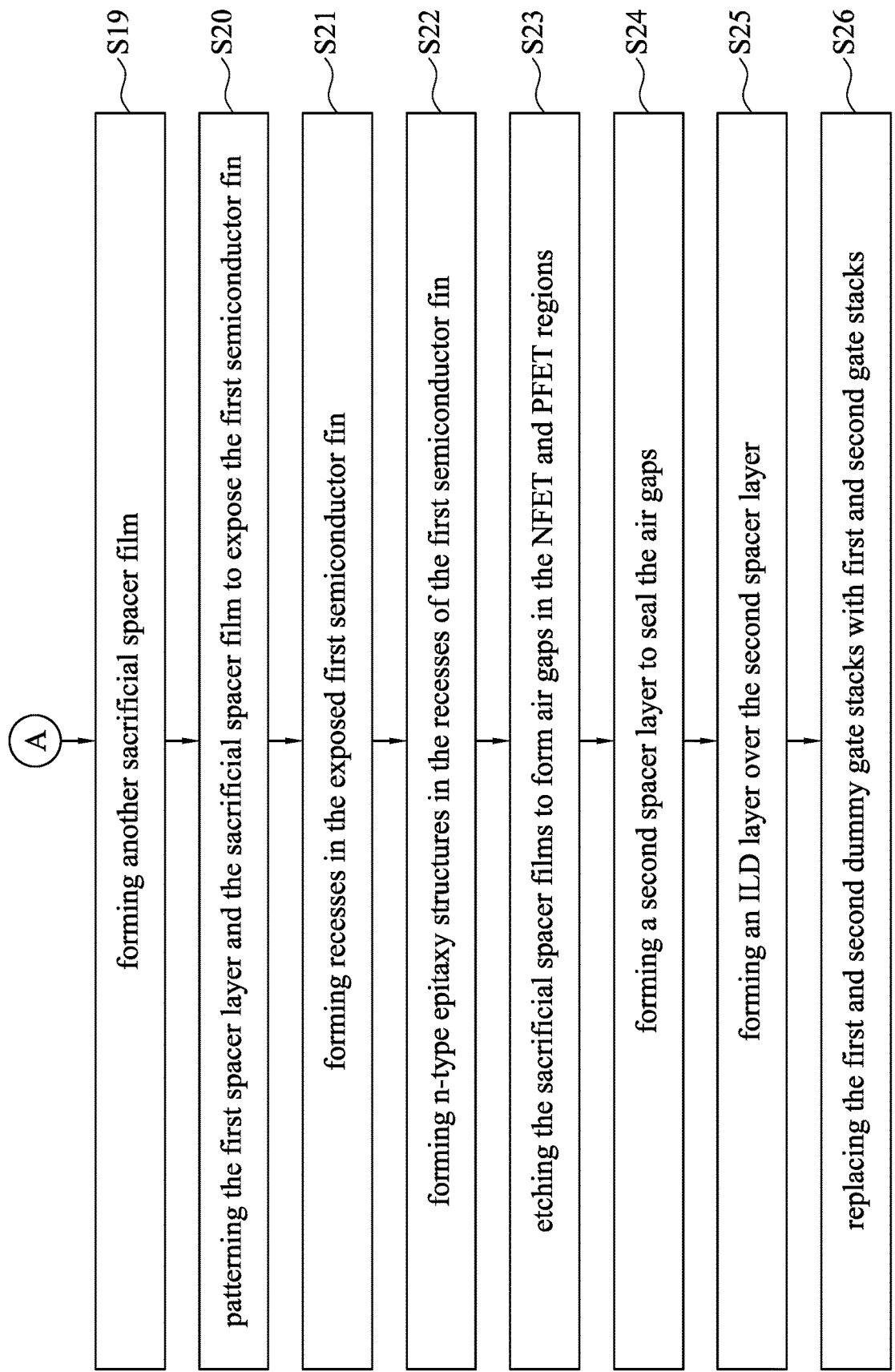

Additionally, in the process flow shown in FIGS. 16A and 16B, it is noted that the p-type epitaxy structures 420 experience dual phosphoric acid etching processes (steps S18 and S23), but the SiP epitaxy structures 410 experience a single phosphoric acid etching process (step S23). As a result, in the process flow shown in FIGS. 16A and 16B, the SiP epitaxy structures 410 are soaked in phosphoric acid for a shorter duration than the p-type epitaxy structures 420, which in turn will further reduce damages to the SiP epitaxy structures 410 caused by phosphoric acid.

As illustrated in FIG. 12, after the phosphoric acid etching process, residues 381' of the outer dummy spacer layer 381 may remain on upper portions of sidewalls of the epitaxy structures 410, and residues 371' of the inner dummy spacer layer 371 may remain on lower portions of the sidewalls of the epitaxy structures 410. The residues 381' have a higher Si/N ratio and/or a higher density than that of the residues 371', because the residues 381' are remnants of a high-temperature silicon nitride layer and the residues 371' are remnants of a low-temperature silicon nitride layer. The outer dummy spacer residue 381' and the inner dummy spacer residue 371' may form an interface IF1 substantially parallel with a top surface of the horizontal portion 311$h$ of the first spacer layer 311, because the outer dummy spacer residue 381' and the inner dummy spacer residue 371' are remnants of conformal layers 370 and 380 (as shown in FIG. 9) that are conformal to the first spacer layer 311. As a result, the residues 371' and 381' may be evidence that a sacrificial spacer film similar to the sacrificial spacer film 360 as shown in FIG. 9 is used to fabricate the semiconductor device. In some embodiments, the inner dummy spacer residue 371' has a width greater than a width of the outer dummy spacer residue 381', because inner dummy spacer residue 371' is at a bottom of the air gap AG1 that is hard to be etched. Moreover, the width of the inner dummy spacer residue 371' decreases as a distance from the horizontal portion 311$h$ of the first spacer layer 311 increases, and the width of the outer dummy spacer residue 381' decreases as a distance from the inner dummy spacer residue 371' increases.

Similarly, after the phosphoric acid etching process, residues 342" of the outer dummy spacer layer 342' may remain on upper portions of sidewalls of the epitaxy structures 420, and residues 332" of the inner dummy spacer layer 332' may remain on lower portions of the sidewalls of the epitaxy structures 420. The residues 342″ have a higher Si/N ratio and/or a higher density than that of the residues 332″, because the residues 342″ are remnants of a high-temperature silicon nitride layer and the residues 332″ are remnants of a low-temperature silicon nitride layer. The outer dummy spacer residue 342″ and the inner dummy spacer residue 332″ may form an interface IF2 substantially parallel with a top surface of the horizontal portion 312h of the first spacer layer 312, because the outer dummy spacer residue 342″ and the inner dummy spacer residue 332″ are remnants of conformal layers 340 and 330 (as shown in FIG. 5) that are conformal to the first spacer layer 312. As a result, the residues 332″ and 342″ may be evidence that a sacrificial spacer film similar to the sacrificial spacer film 320 as shown in FIG. 5 is used to fabricate the semiconductor device. In some embodiments, the inner dummy spacer residue 332″ has a width greater than a width of the outer dummy spacer residue 342″, because inner dummy spacer residue 332″ is at a bottom of the air gap AG2 which is hard to be etched. Moreover, the width of the inner dummy spacer residue 332″ decreases as a distance from the horizontal portion 312h of the first spacer layer 312 increases, and the width of the outer dummy spacer residue 342″ decreases as a distance from the inner dummy spacer residue 332″ increases.

Moreover, in some embodiments where the n-type epitaxy structures 410 include SiP, the phosphoric acid etching may result in recesses 410r in top corners of the SiP epitaxy structures 410. In contrast, in some embodiments where the p-type epitaxy structures 420 include SiGe, the top corners of the SiGe epitaxy structures 420 may be free from recesses because the phosphoric acid hardly attacks the SiGe epitaxy structures 420. As a result, the SiGe epitaxy structures 420 may have substantially vertical sidewall extending upwards from the top dummy spacer residues 342″, and the SiP epitaxy structures 410 may have recesses 410r above the top spacer residues 381'.

Next, as shown in FIG. 13, a second spacer layer 390 is formed as a blanket layer to cover the wafer W, such that the air gaps AG1 and AG2 having high aspect ratios can be sealed but unfilled by the second spacer layer 390. The respective step is also illustrated as step S24 in the process flow shown in FIG. 16B. In some embodiments, the second spacer layer 390 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials, or other suitable dielectric materials. The second spacer layer 390 may be formed using, for example, CVD, ALD, PVD or other suitable deposition techniques. Because the second spacer layer 390 is formed after formation of air gaps AG1 and AG2 using phosphoric acid, a nitrogen-containing material (e.g., silicon nitride) can be selected to form the second spacer layer 390. Therefore, the second spacer layer 390 has a different dielectric material than the nitrogen-free spacer layer 310.

As a result of deposition of the blanket deposition, the second spacer layer 390 includes a portion 391 in the NFET region 100 and sealing the air gap AG1, and another portion 392 in the PFET region 200 and sealing the air gap AG2. Because the air gaps AG1 and AG2 are void of dielectric materials but filled with air having an extremely low dielectric constant (about 1) compared with other dielectric materials (e.g., silicon oxide, silicon nitride and so on), the parasitic capacitance in the semiconductor device can be reduced, thus improving the resistive-capacitive (RC) time delay.

Figure 14:
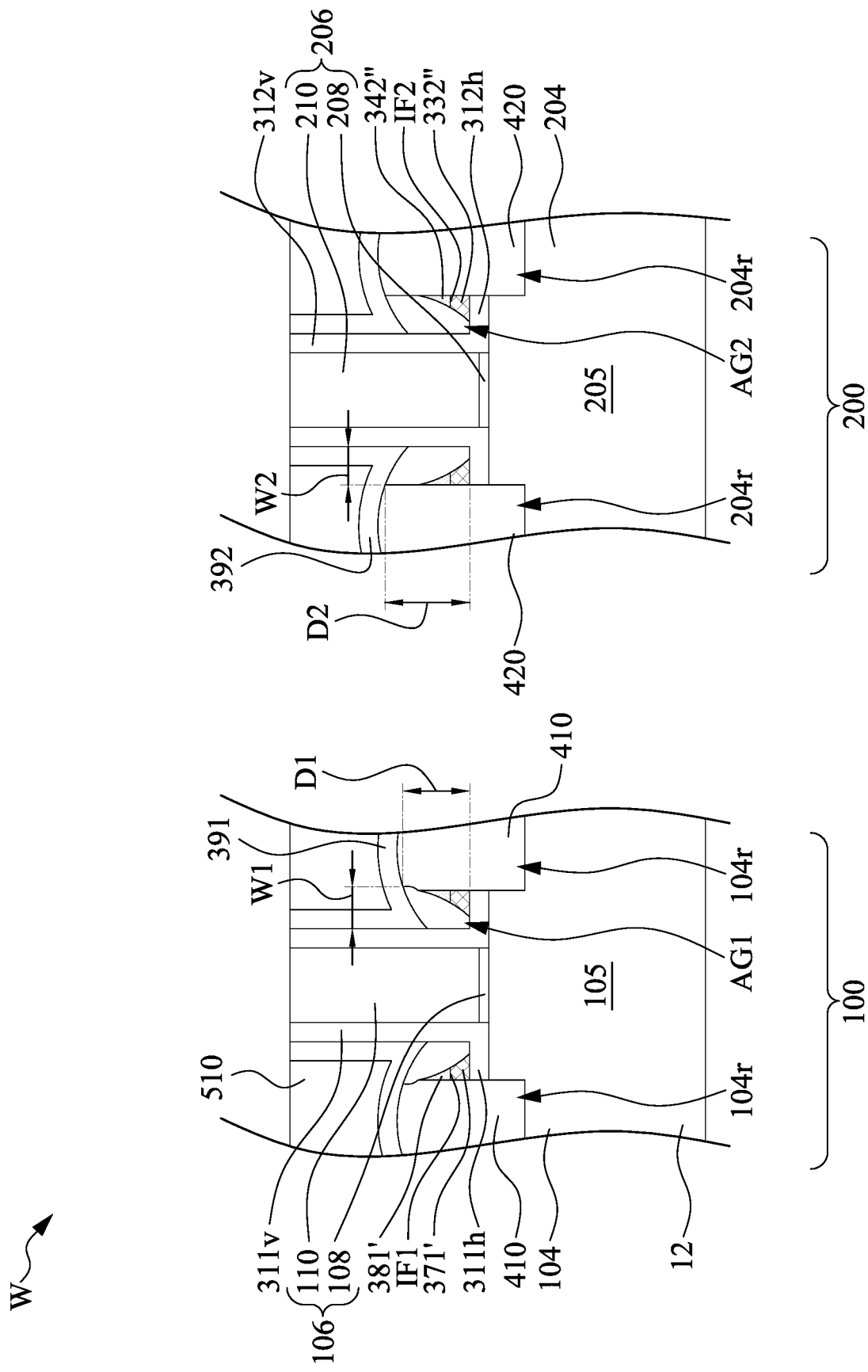

Thereafter, as shown in FIG. 14, an interlayer dielectric (ILD) layer 510 is formed over the second spacer layer 390, followed by a CMP process performed to remove excessive material of the ILD layer 510 to expose the dummy gate electrodes 110 and 210. The respective step is illustrated as step S25 in the process flow shown in FIG. 16B. The CMP process may planarize a top surface of the ILD layer 510 with top surfaces of the dummy gate stacks 106, 206, the first spacer layers 311, 312 and the second spacer layers 391 and 392. In some embodiments, the ILD layer 510 includes silicon oxide, silicon nitride, silicon oxynitride, phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 510 may be formed using, for example, CVD, ALD, spin-on-glass (SOG) or other suitable techniques. In some embodiments, a contact etch stop layer (CESL) is absent from between the epitaxy structures 410, 420 and the ILD layer 510, because the second spacer layers 391 and 392 respectively capping the epitaxy structures 410, 420 can act as the CESL. In some other embodiments, an additional CESL is formed over the second spacer layers 391 and 392, followed by forming the ILD layer 510 over the CESL layer.

Figure 15:
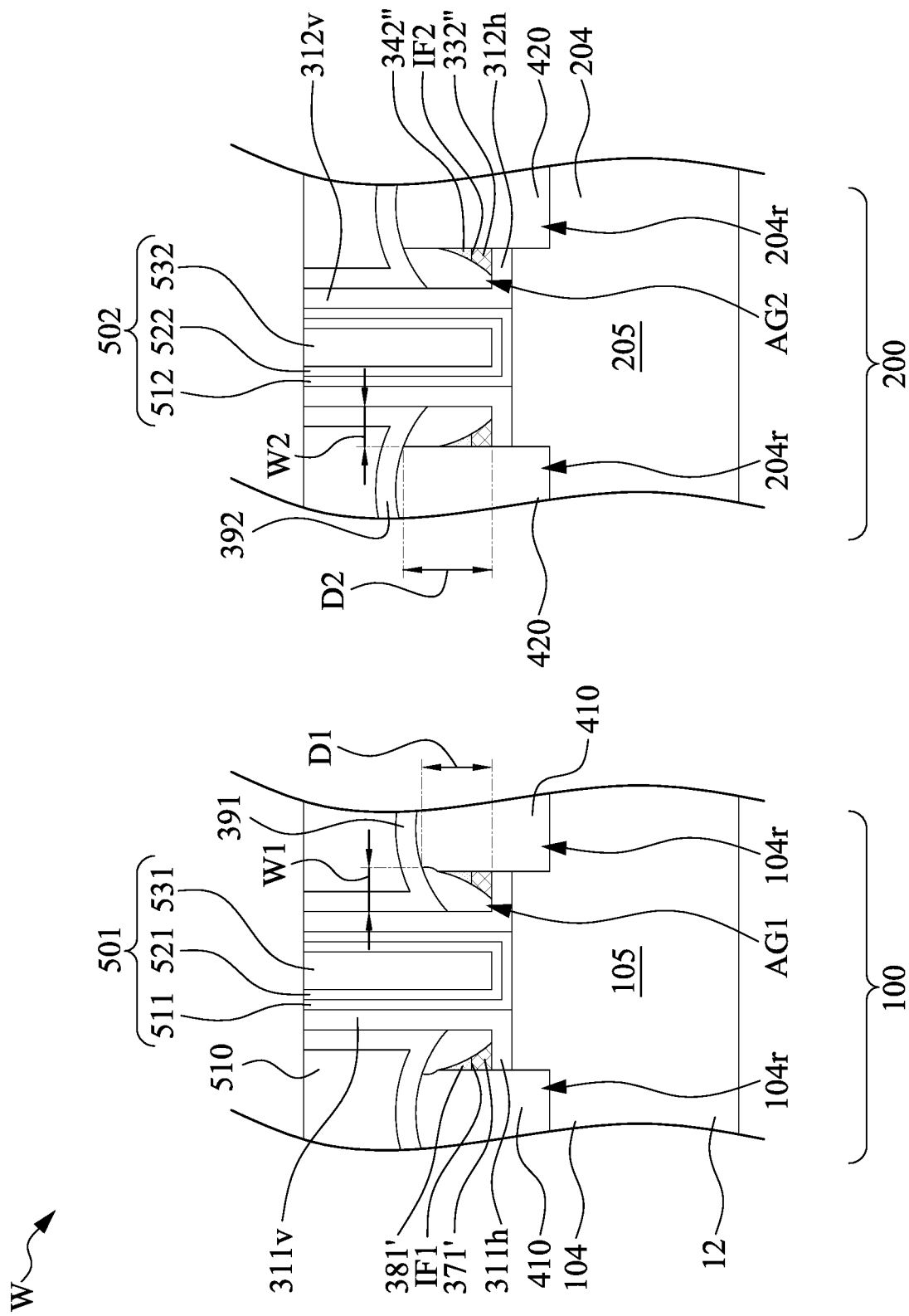

Next, the first and second dummy gate stacks 106 and 206 are respectively replaced with first and second gate stacks 501 and 502, as shown in FIG. 15. The respective step is illustrated as step S26 as shown in FIG. 16B. The gate replacement process include removing the first and second dummy gate stacks 106 and 206 using one or more selective etching processes to form a gate trench with vertical first spacer layers 311v as their sidewalls in the NFET region 100 and a gate trench with vertical first spacer layers 312v as their sidewalls in the PFET region 200, followed by forming the first and second gate stacks 501 and 502 in the gate trenches.

The gate stack 501 may include a gate dielectric layer 511, a work function conductor 521 on the gate dielectric layer 511 and a filling conductor 531 on the work function conductor 521. Similarly, the gate stack 502 may include a gate dielectric layer 512, a work function conductor 522 and a filling conductor 532. In some embodiments, the gate dielectric layers 511 and 512 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layers 511 and 512 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), silicon oxynitrides (SiON), and combinations thereof. In alternative embodiments, the gate dielectric layers 511 and 512 may have a multilayer structure such as one layer of silicon oxide (e.g., interfacial layer) and another layer of high-k material.

The work function conductors 521 and 522 may include work function metals to provide a suitable work function for the gate stacks 501 and 502. For example, the work function conductor 521 may include one or more n-type work function metals (N-metal) for forming an n-type FinFET on the NFET region 100. The n-type work function metals may exemplarily include, but are not limited to, titanium aluminide (TiAl), titanium aluminium nitride (TiAlN), carbonitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, the work function conductor 522 may include one or more p-type work function metals (P-metal) for forming a p-type FinFET on PFET region 200. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. The filling conductors 531 and 532 respectively fill recesses in the work function conductors 521 and 522. The filling conductors 531 and 532 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Exemplary method of forming the gate stacks 501 and 502 may include depositing a blanket gate dielectric layer, depositing one or more work function conductor layers over the blanket gate dielectric layer, removing portions of work function conductive layers from the NFET region 100 or the PFET region 200, forming a filling conductor layer over the work function conductor layers, and performing a CMP process to remove excessive materials of the filling conductor layer, the work function conductor layers and the gate dielectric layer outside the gate trenches.

Although the embodiments discussed above use a high-temperature SiN layer and a low-temperature SiN layer as the sacrificial spacer film, some other embodiments of the present disclosure can form the sacrificial spacer film using different methods. FIGS. 17-23 illustrate exemplary cross sectional views of various stages for manufacturing transistors according to some other embodiments of the present disclosure. It is understood that additional operations can be provided before, during, and after processes shown by FIGS. 17-23, and some of the operations described below can be replaced or eliminated, for additional embodiments of the method. The order of the operations/processes may be interchangeable. The same or similar configurations, materials, processes and/or operation as described with FIGS. 1-15 may be employed in the following embodiments, and the detailed explanation may be omitted.

Figure 17:
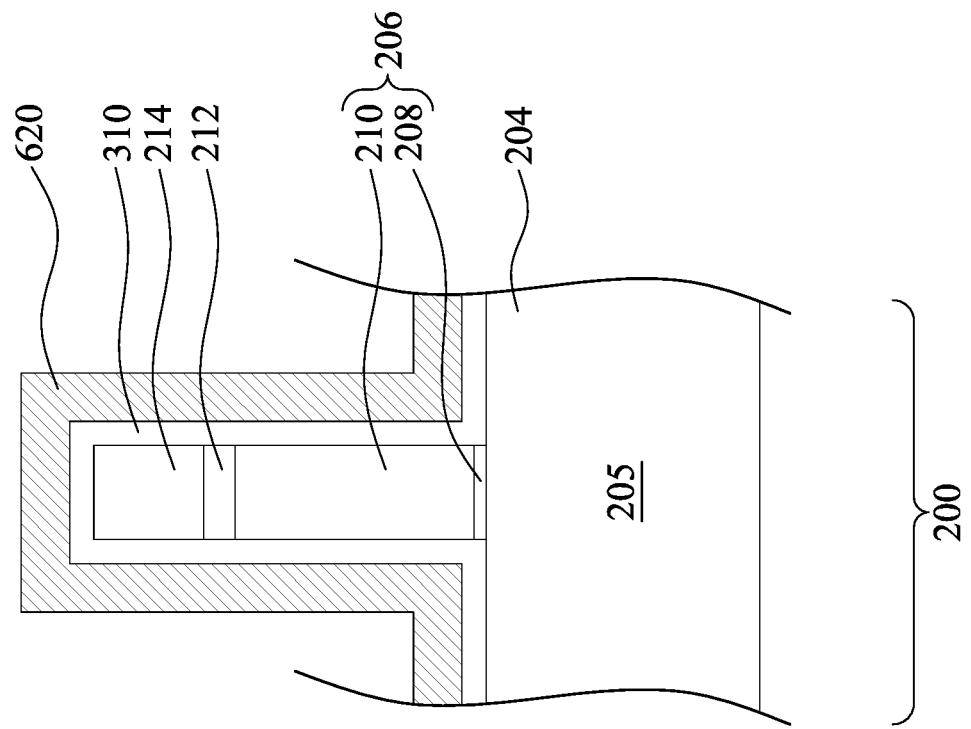
FIGS. 17-23 illustrate cross-sectional views of intermediate stages in the formation of transistors in accordance with some embodiments.
Figure 17:
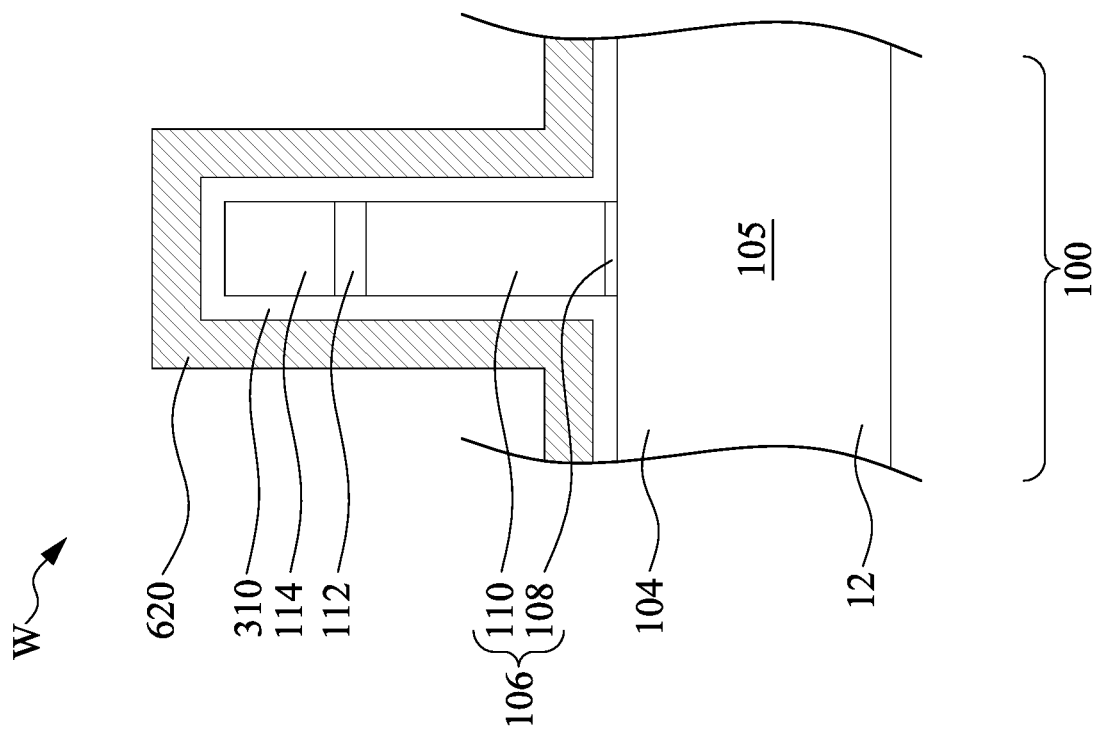

After the structure as shown in FIG. 4 is formed, a gradient layer 620 is blanket formed to cover the first spacer layer 310, as shown in FIG. 17. In some embodiments, the gradient layer 620 is a silicon nitride layer formed using a deposition process at a temperature increasing as time passes. The increasing temperature results in a silicon nitride layer having a gradient Si/N ratio and/or a gradient density. In greater detail, the Si/N ratio of the gradient silicon nitride layer 620 increases as a distance from the first spacer layer 310 increases. In this way, the gradient silicon nitride layer 620 has a maximum Si/N ratio and/or a maximum density at a portion of the gradient silicon nitride layer 620 furthest (distal) from the first spacer layer 310, and has a minimum Si/N ratio and/or a minimum density at a portion of the gradient silicon nitride layer 620 closest (proximal) to the first spacer layer 310. The gradient silicon nitride layer 620 can function as a sacrificial spacer film in some embodiments of the present disclosure.

Figure 18:
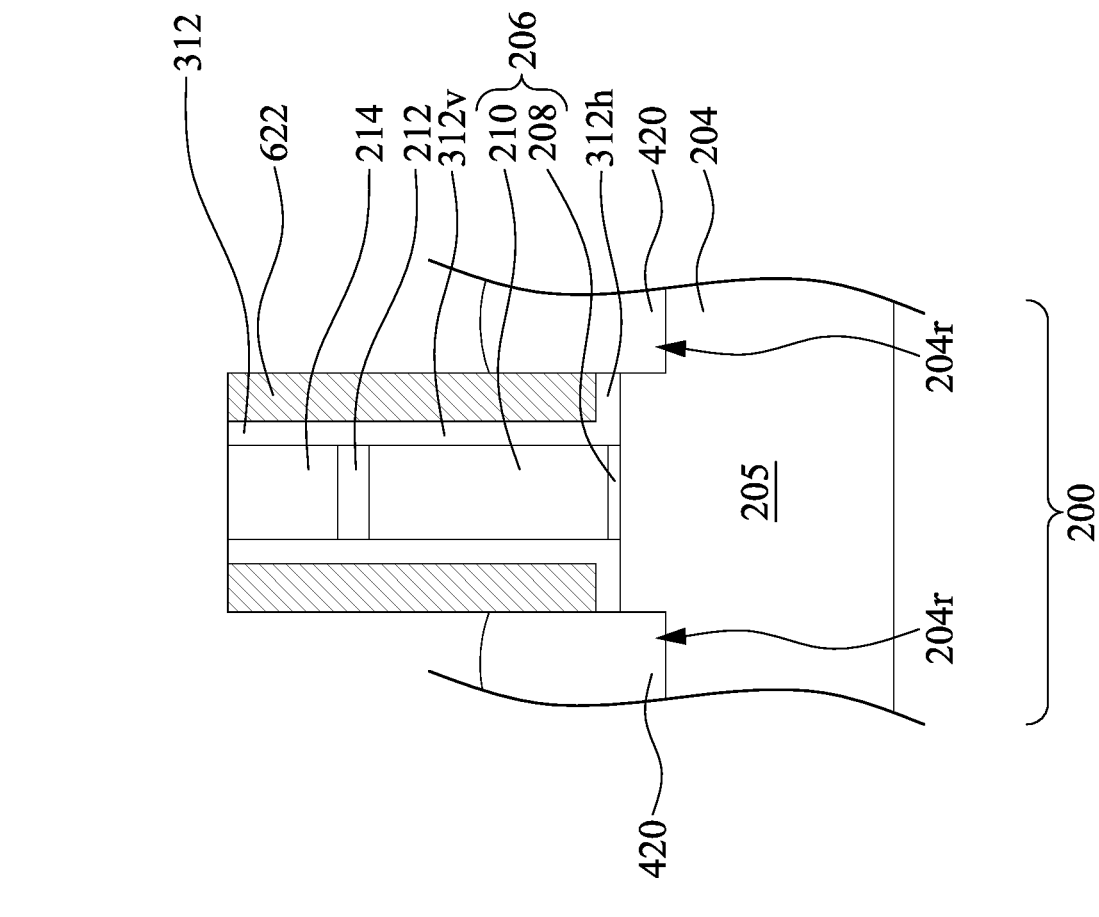
Figure 18:
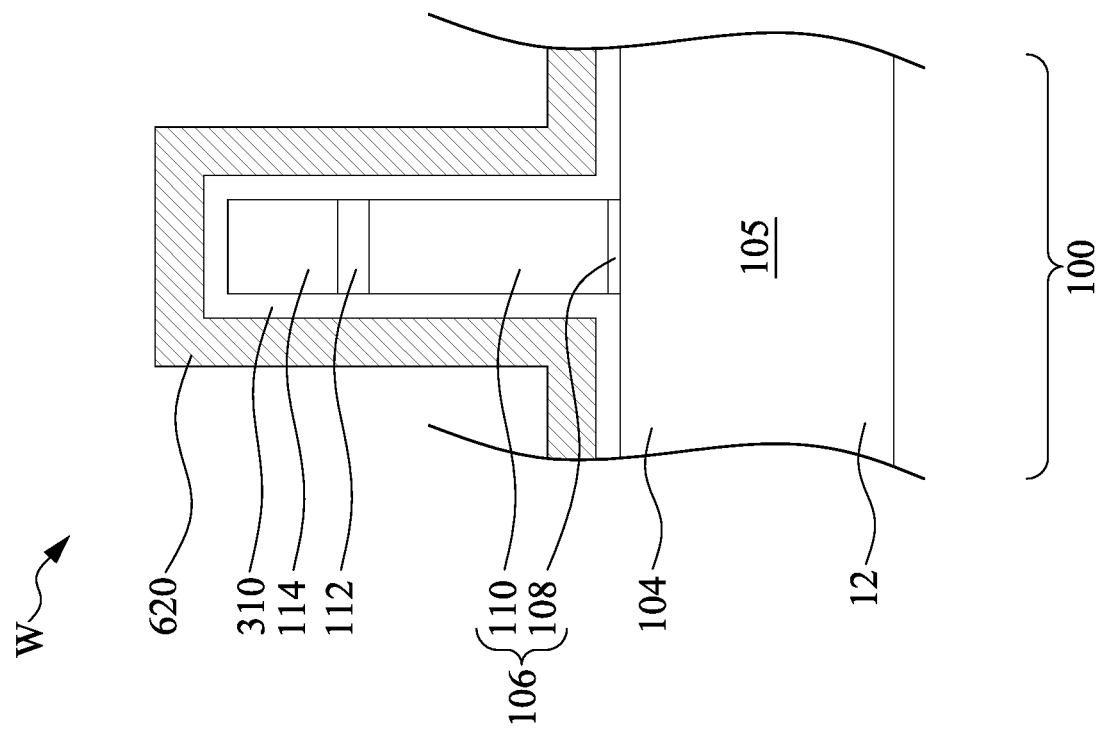

The following process subsequent to forming the gradient silicon nitride layer 620 includes, for example, masking the NFET region 100 using a photoresist, etching the first spacer layer 310 and the gradient silicon nitride layer 620 in the PFET region 200 to form a patterned first spacer layer 312 and a patterned gradient silicon nitride layer 622 that expose the semiconductor fin 204, recessing the semiconductor fin 204, removing the photoresist from the NFET region 100, and epitaxially growing p-type epitaxy structures 420 from the recessed semiconductor fin 204. The resulting structure is shown in FIG. 18. These process steps are similar to steps S15-S17 in the process flow as shown in FIG. 16A, and thus are not repeated for the sake of brevity.

Figure 19:
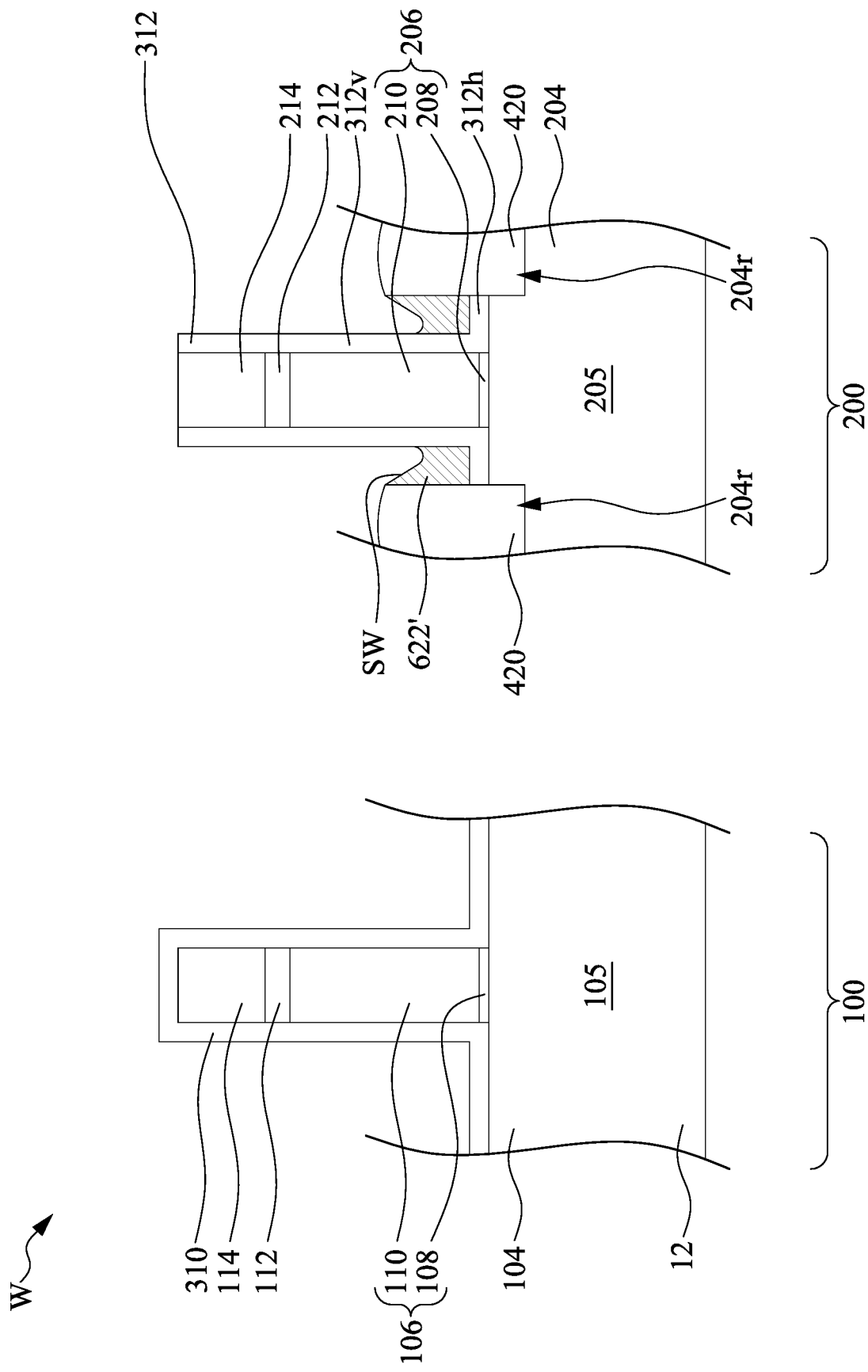

Next, the gradient silicon nitride layers 620 and 622 are etched, and the resulting structure is illustrated in FIG. 19. In some embodiments, the etching process uses phosphoric acid as an etchant. In greater detail, the etching process includes soaking the wafer W in the phosphoric acid bath a given temperature for a given duration. The etching duration is selected so that the gradient silicon nitride layer 620 is substantially completely removed from the NFET region 100, but a portion 622' of the sacrificial spacer film 622 in the PFET region 200 still remains in the gap between the first spacer layer 312 and the epitaxy structure 420 due to the aspect ratio of the gap. As discussed previously, the higher the Si/N ratio (or the density) of silicon nitride, the slower the etch rate of the silicon nitride in a phosphoric acid etching process. Because the gradient layer 622' has a Si/N ratio and/or density increasing as a distance from the first spacer layer 310 increases, the gradient layer 622' has a maximum Si/N ratio and/or density at a portion of the gradient layer 622' closest to the epitaxy structure 420, and has a minimum Si/N ratio and/or density at a portion of the gradient layer 622' furthest from the epitaxy structure 420. As a result, after the phosphoric acid etching process, the gradient layer 622' has a down-slant sidewall SW extending downwards from the epitaxy structure 420.

Figure 20:
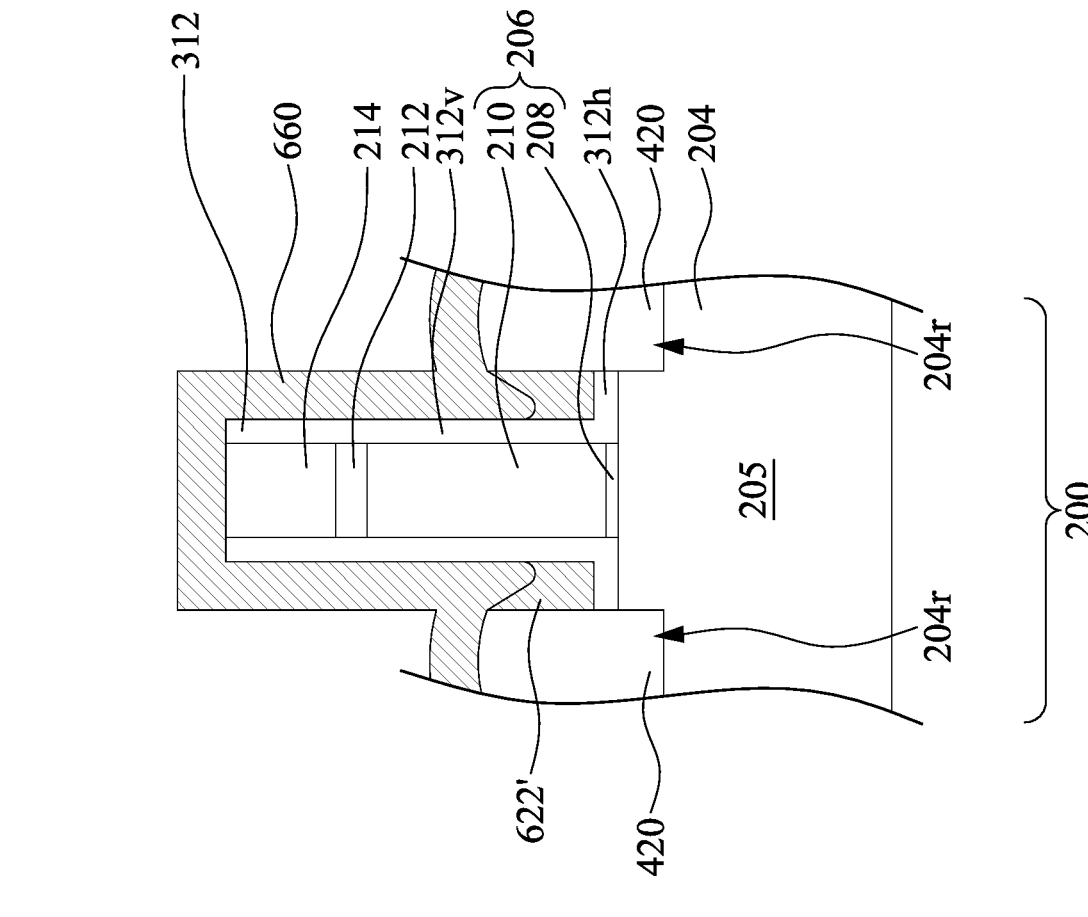
Figure 20:
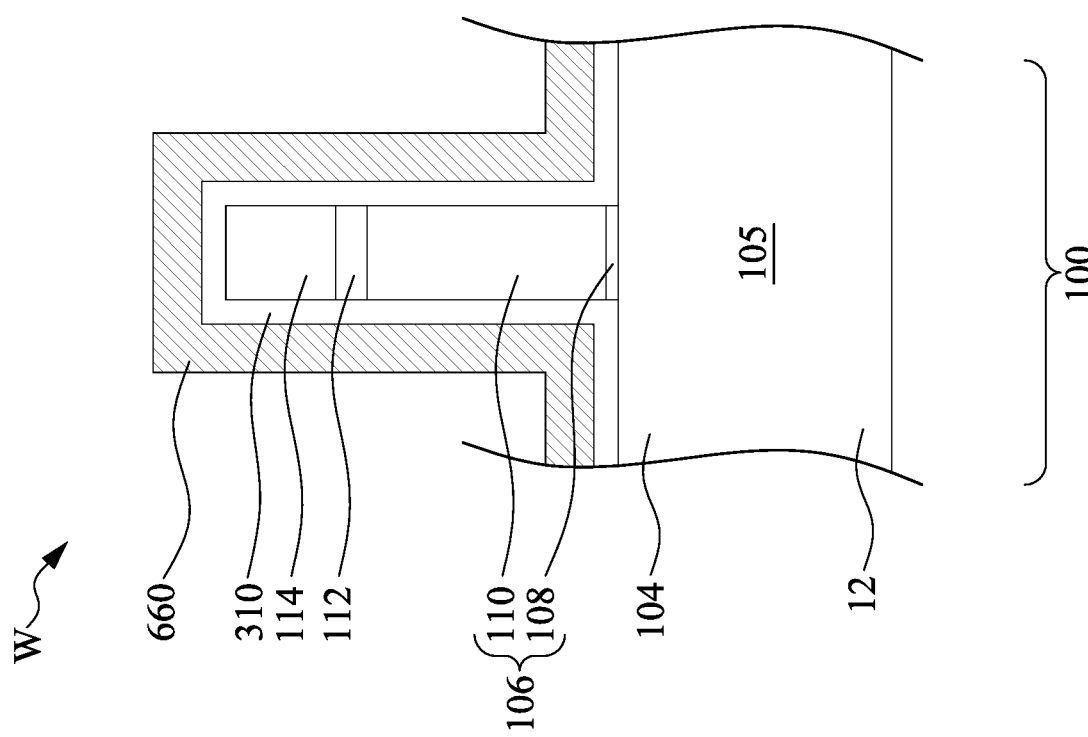

FIG. 20 illustrates forming another gradient layer 660 blanket over the wafer W. Similar to the gradient layer 620, the gradient layer 660 may be a silicon nitride layer formed using a deposition process at a temperature increasing as time passes, thus resulting in the Si/N ratio of the gradient silicon nitride layer 660 increases as a distance from the first spacer layer 310 increases. In this way, the gradient silicon nitride layer 660 has a maximum Si/N ratio and/or a maximum density at a portion of the gradient silicon nitride layer 660 furthest (distal) from the first spacer layer 310, and has a minimum Si/N ratio and/or a minimum density at a portion of the gradient silicon nitride layer 660 closest (proximal) to the first spacer layer 310. The gradient silicon nitride layer 620 can function as another sacrificial spacer film.

Figure 21:
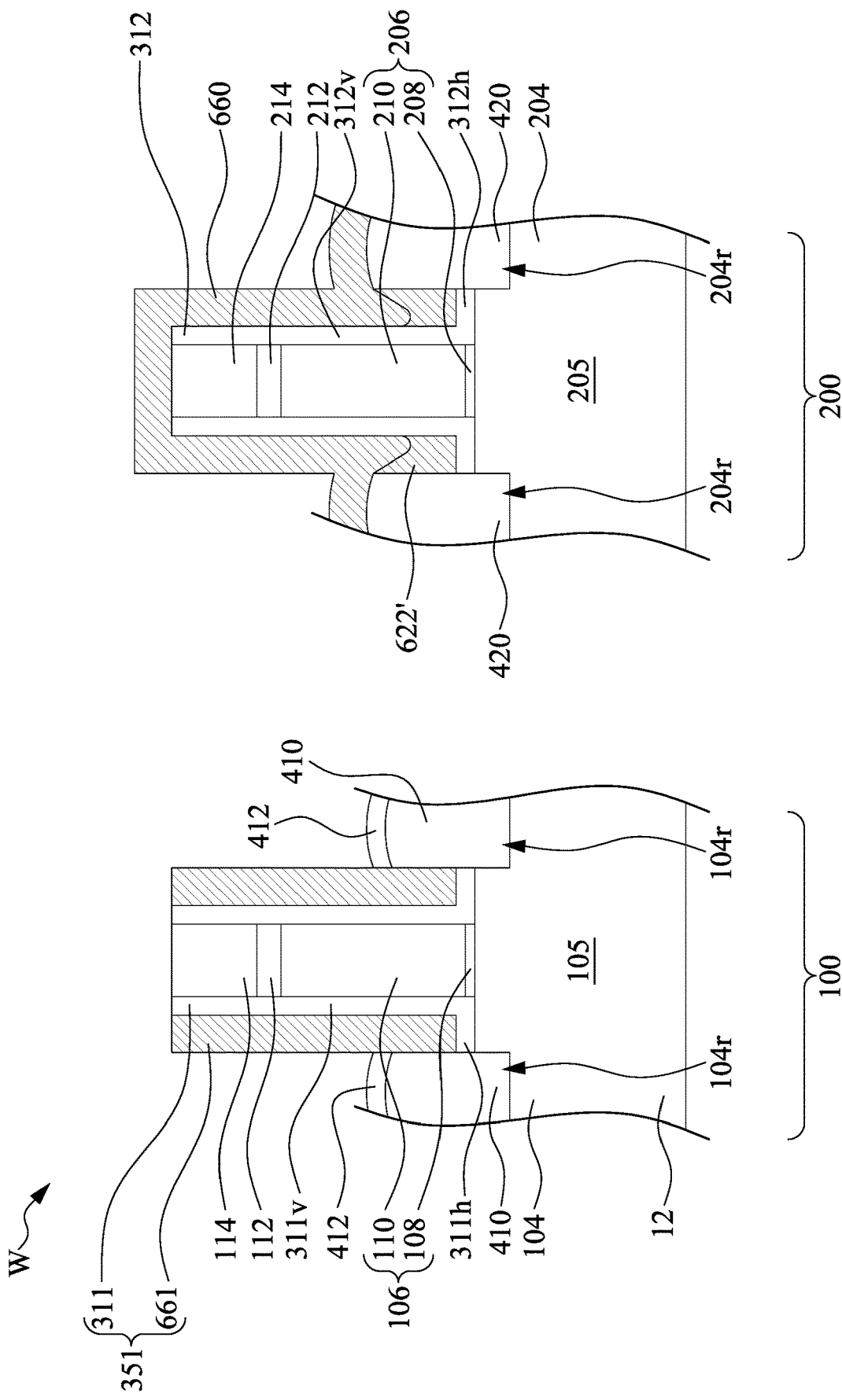

The following process subsequent to forming the gradient silicon nitride layer 660 includes, for example, masking the PFET region 200 using a photoresist, etching the first spacer layer 310 and the gradient silicon nitride layer 660 in the NFET region 100 to form a patterned first spacer layer 311 and a patterned gradient silicon nitride layer 661 that expose the semiconductor fin 104, recessing the semiconductor fin 104, removing the photoresist from the PFET region 200, and epitaxially growing n-type epitaxy structures 410 from the recessed semiconductor fin 104. The resulting structure is shown in FIG. 21. These process steps are similar to steps S20-S22 in the process flow as shown in FIG. 16B, and thus are not repeated for the sake of brevity.

Figure 22:
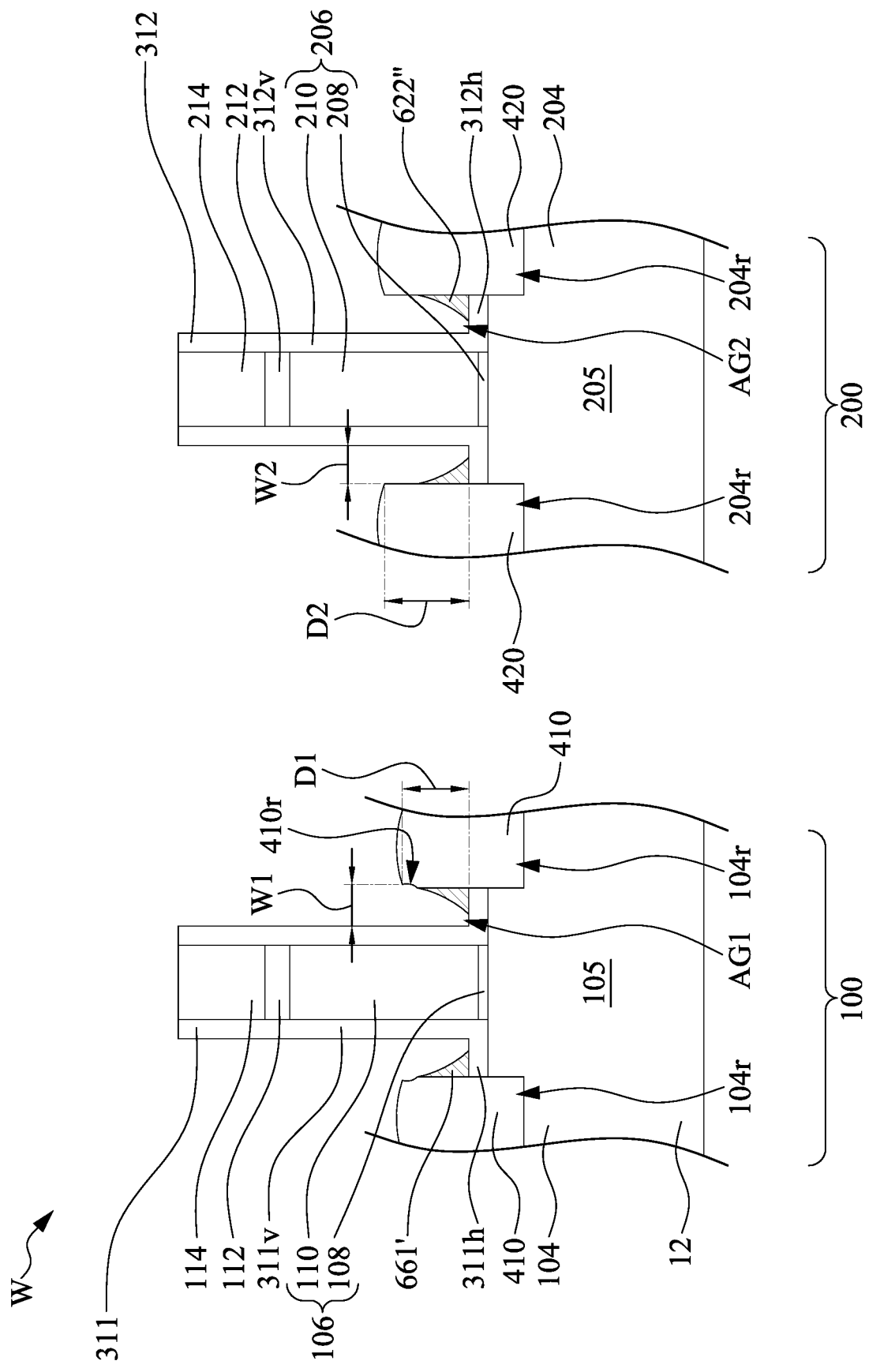

Next, the gradient silicon nitride layers 660, 661 and 622' are etched, thus resulting in air gaps AG1 and AG2. The resulting structure is illustrated in FIG. 22. In accordance with some embodiments of the present disclosure, etching the gradient silicon nitride layers 660, 661 and 622' includes an etching process using phosphoric acid which etches the gradient silicon nitride layers 660, 661 and 622' at a faster rate than it etches other materials (e.g., first spacer layers 311 and 312) on the wafer W. Moreover, the phosphoric acid etches the outermost portions of the gradient silicon nitride layers 660, 661 and 622' at a slower etch rate than it etches inner portions of the gradient silicon nitride layers 660, 661 and 622', because outermost portions of the gradient silicon nitride layers 660, 661 and 622' have a higher Si/N ratio and/or density than the inner portions of the gradient silicon nitride layers 660, 661 and 622'. As a result, the outermost portions of the silicon nitride layers 661 can reduce damages to the epitaxy structures 410 caused by the phosphoric acid.

After the phosphoric acid etching process, residues 661' of the gradient silicon nitride layer 661 remain on sidewalls of the epitaxy structures 410, and residues 622" of the gradient silicon nitride layer 622' remain on sidewalls of the epitaxy structures 420. The residues 661' have a gradient Si/N ratio and/or density that increase as a distance from a top surface of the horizontal portion 311h of the first spacer layer 311 increases. Similarly, the residues 622" have a gradient Si/N ratio and/or density that increase as a distance from a top surface of the horizontal portion 312h of the first spacer layer 312 increases. The gradient silicon nitride residues 661' may be evidence that a sacrificial spacer film similar to the sacrificial spacer film 660 as shown in FIG. 20 is used to fabricate the semiconductor device, and the gradient silicon nitride residues 622" may be evidence that a sacrificial spacer film similar to the sacrificial spacer film 620 as shown in FIG. 17 is used to fabricate the semiconductor device.

Figure 23:
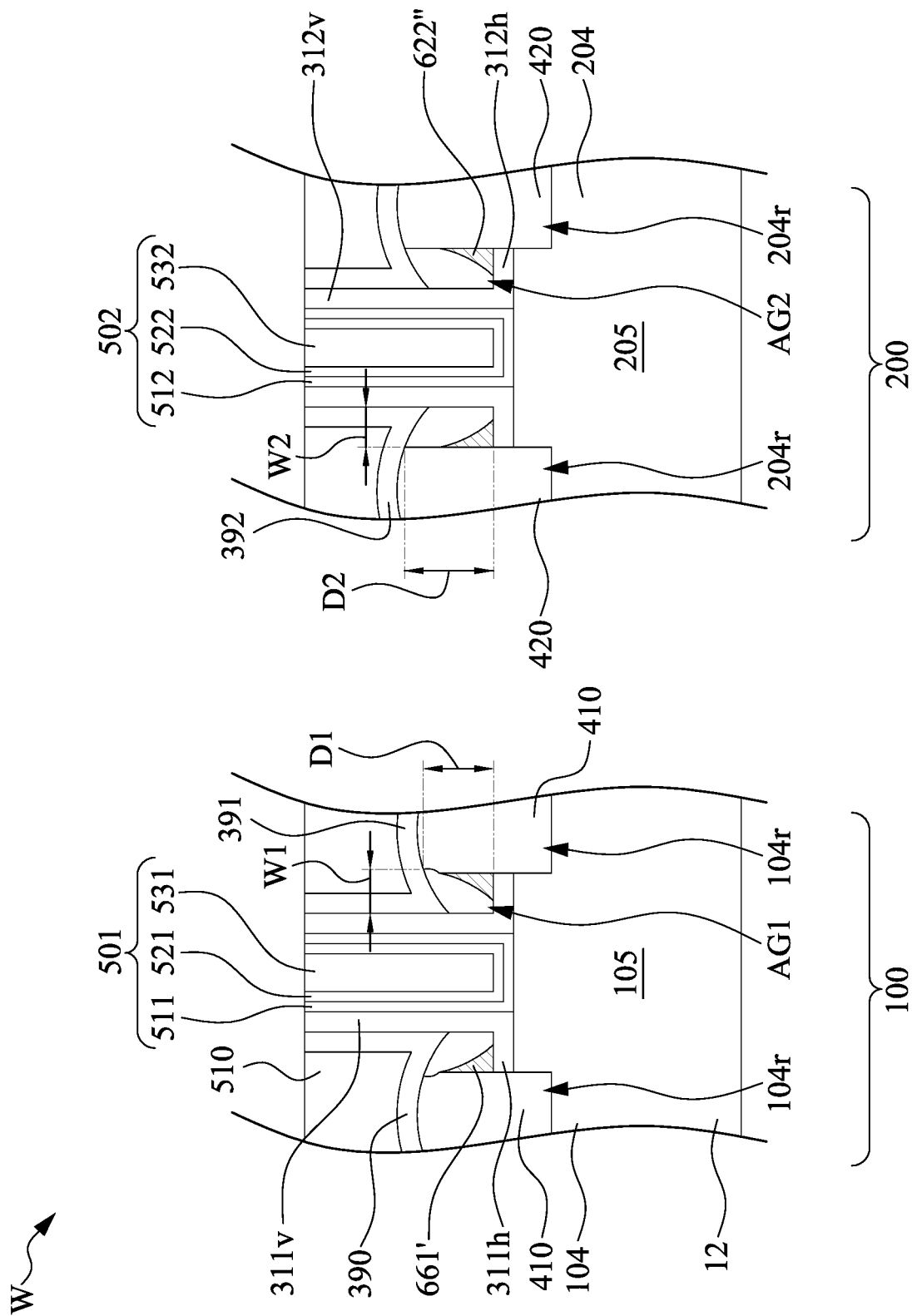

The following process subsequent to forming the air gaps AG1 and AG2 includes, for example, forming a second spacer layer 390 to seal the air gaps AG1 and AG2, forming an ILD layer 510 over the second spacer layer 390, and replacing the dummy gate stacks 106 and 206 with the gate stacks 501 and 502, respectively. The resulting structure is shown in FIG. 23. These process steps are similar to steps S24-S26 in the process flow as shown in FIG. 16B, and thus are not repeated for the sake of brevity.

FIGS. 24-33 illustrate exemplary cross sectional views of various stages for manufacturing transistors according to some other embodiments of the present disclosure. It is understood that additional operations can be provided before, during, and after processes shown by FIGS. 24-33, and some of the operations described below can be replaced or eliminated, for additional embodiments of the method. The order of the operations/processes may be interchangeable. The same or similar configurations, materials, processes and/or operation as described with FIGS. 1-15 may be employed in the following embodiments, and the detailed explanation may be omitted.

Figure 24:
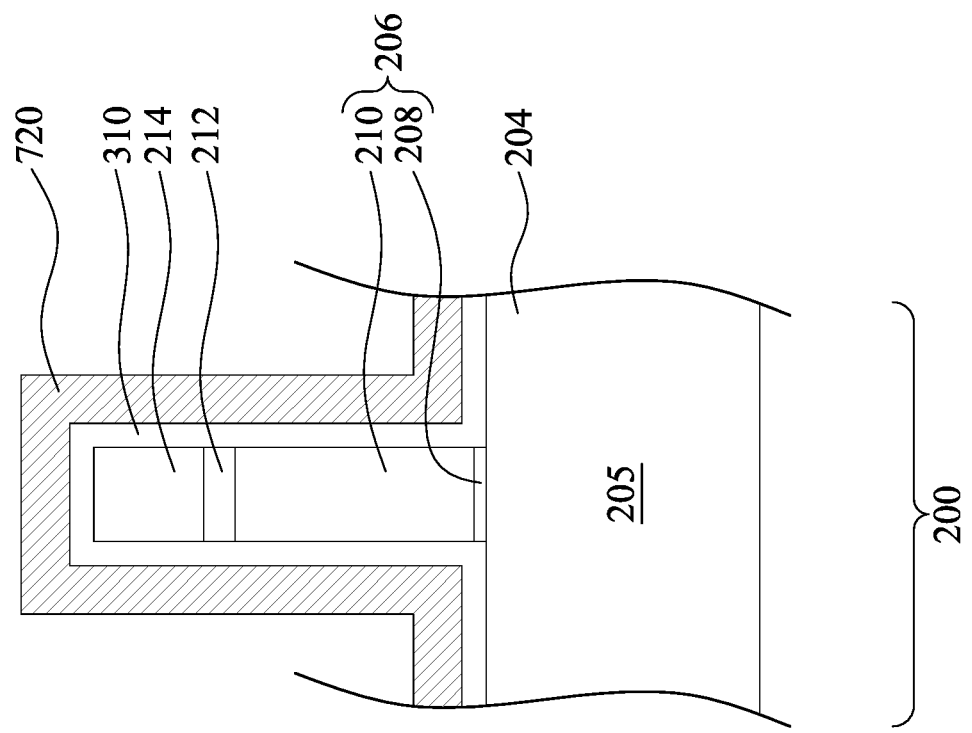
FIGS. 24-33 illustrate cross-sectional views of intermediate stages in the formation of transistors in accordance with some embodiments.
Figure 24:
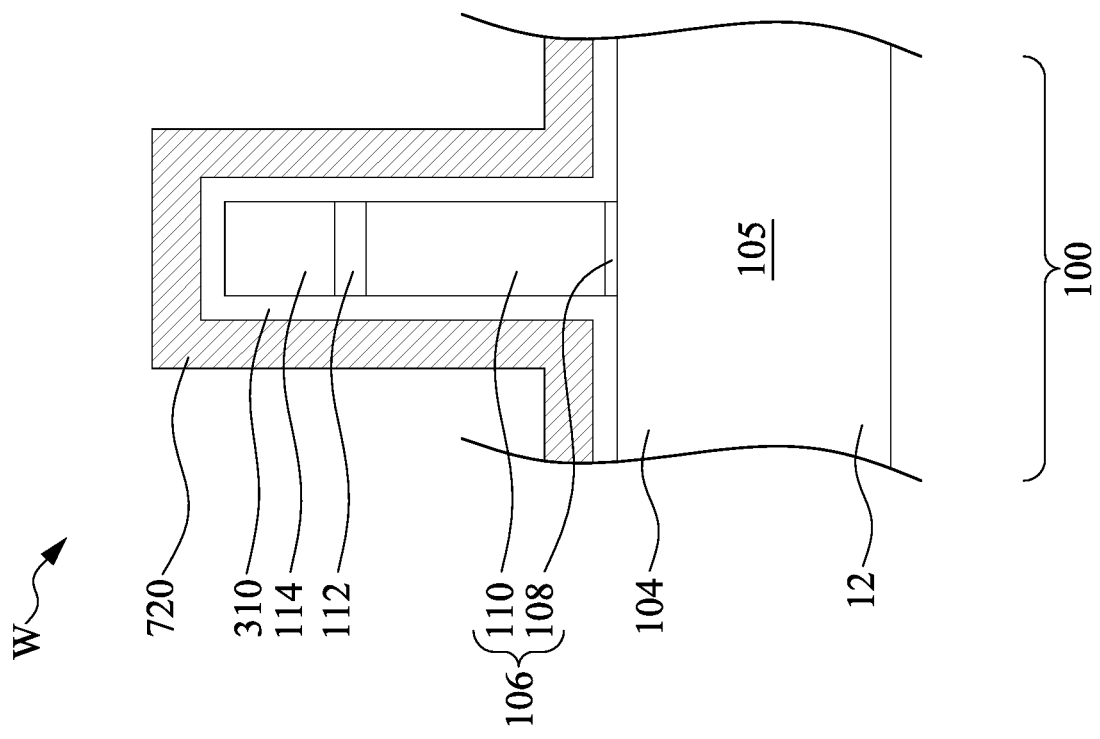

After the structure as shown in FIG. 4 is formed, a sacrificial spacer film 720 is blanket formed to cover the first spacer layer 310, as shown in FIG. 24. In some embodiments, the sacrificial spacer film 720 includes silicon nitride, silicon oxide or other suitable dielectric materials, which can be formed using CVD, PVD, ALD or other suitable deposition techniques.

Figure 25:
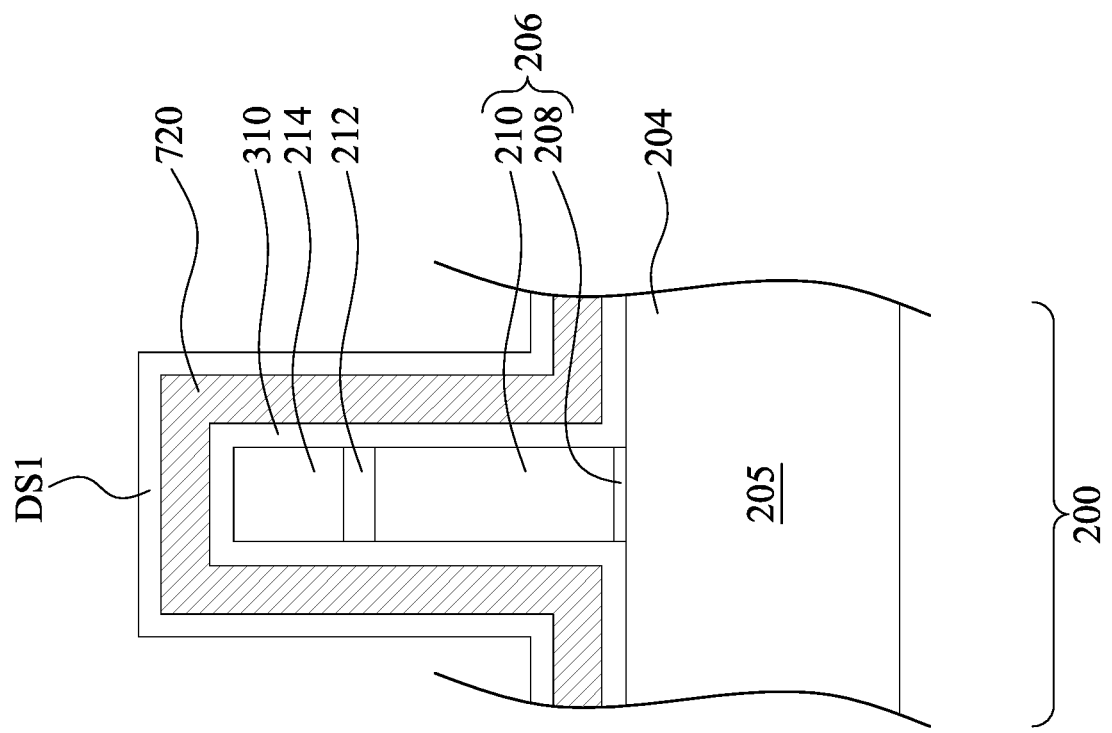
Figure 25:
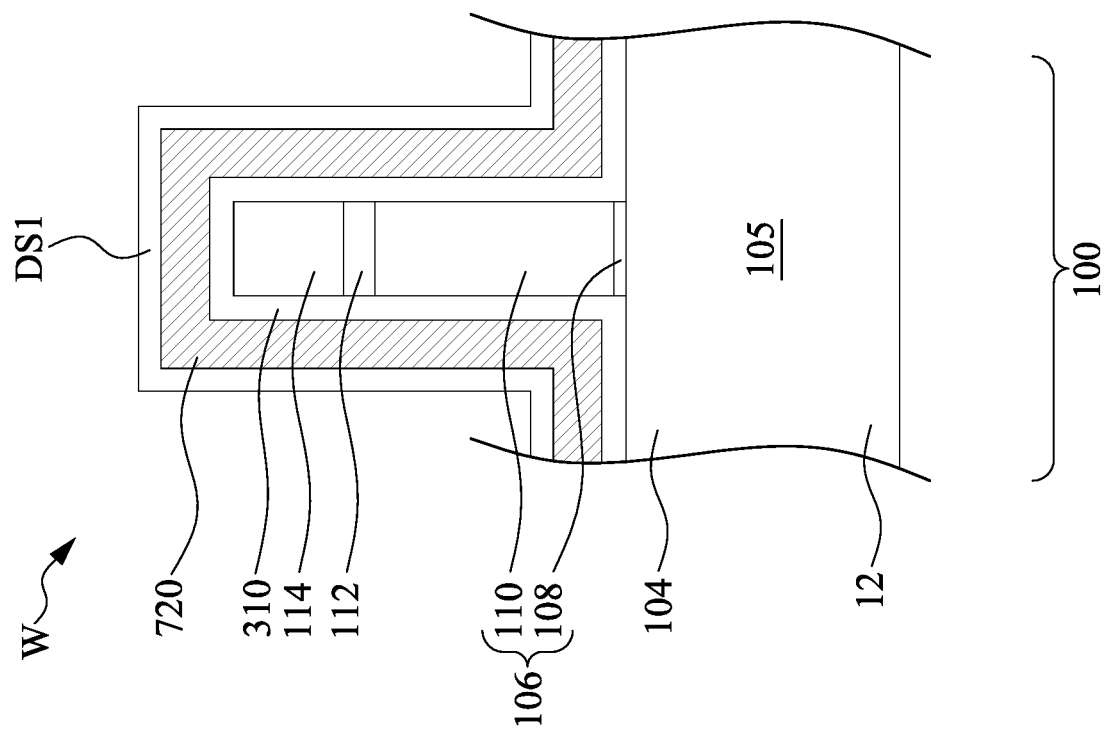

Next, as shown in FIG. 25, a dopant source layer DS1 is formed over the sacrificial spacer film 720. A dopant in the dopant source layer DS1 includes, for example, carbon, boron or other suitable materials that may increase etch resistance in doped silicon nitride against phosphoric acid. The dopant source layer DS1 may be formed using, for example, CVD, PVD, ALD or other suitable deposition techniques. In some embodiments, the atomic percentage of the dopant in the dopant source layer DS1 may be substantially equal to or greater than about 90 percent. In some embodiments, the dopant source layer DS1 can be a substantially pure dopant layer.

Figure 26:
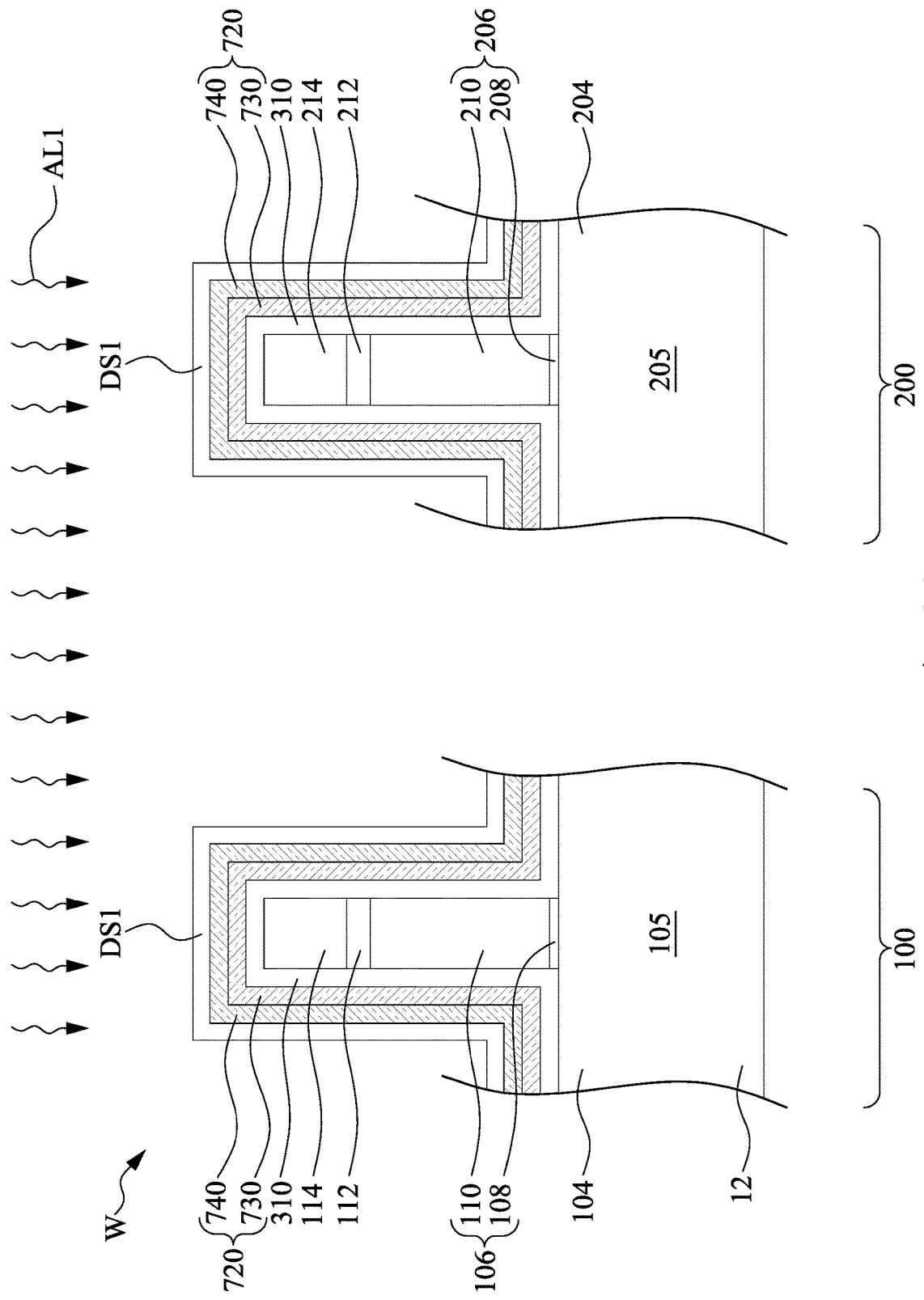

Next, as shown in FIG. 26, an annealing process AL1 is performed to drive the dopant from the dopant source layer DS1 to diffuse into the sacrificial spacer film 720, thus converting an outer portion of the sacrificial spacer film 720 into a heavily doped spacer portion 740 and an inner portion of the sacrificial spacer film 720 into a lightly doped spacer portion 730, wherein the heavily doped spacer portion 740 has a higher dopant concentration (or impurity concentration) than that of the lightly doped spacer portion 730 due to nature of thermal diffusion. As discussed previously, the dopant species is selected such that doped silicon nitride has a slower etch rate in a phosphoric acid etching process than that of un-doped silicon nitride. Therefore, the higher the dopant concentration, the slower the etch rate in the phosphoric acid etching process. Therefore, the heavily doped spacer portion 740 has higher etch resistance to the phosphoric acid etching process than that of the lightly doped spacer portion 730.

In some embodiments, the heavily doped spacer portion 740 may have a gradient dopant concentration that increases as a distance from the lightly doped spacer portion 730 increases due to nature of thermal diffusion. Similarly, the lightly doped spacer portion 730 may have a gradient dopant concentration that decreases as a distance from the heavily doped spacer portion 740 increases due to nature of thermal diffusion. In some embodiments, after the annealing process AL1 process, the dopant source layer DS1 is removed using suitable etching process. In some other embodiments, the dopant source layer DS1 is not removed.

Figure 27:
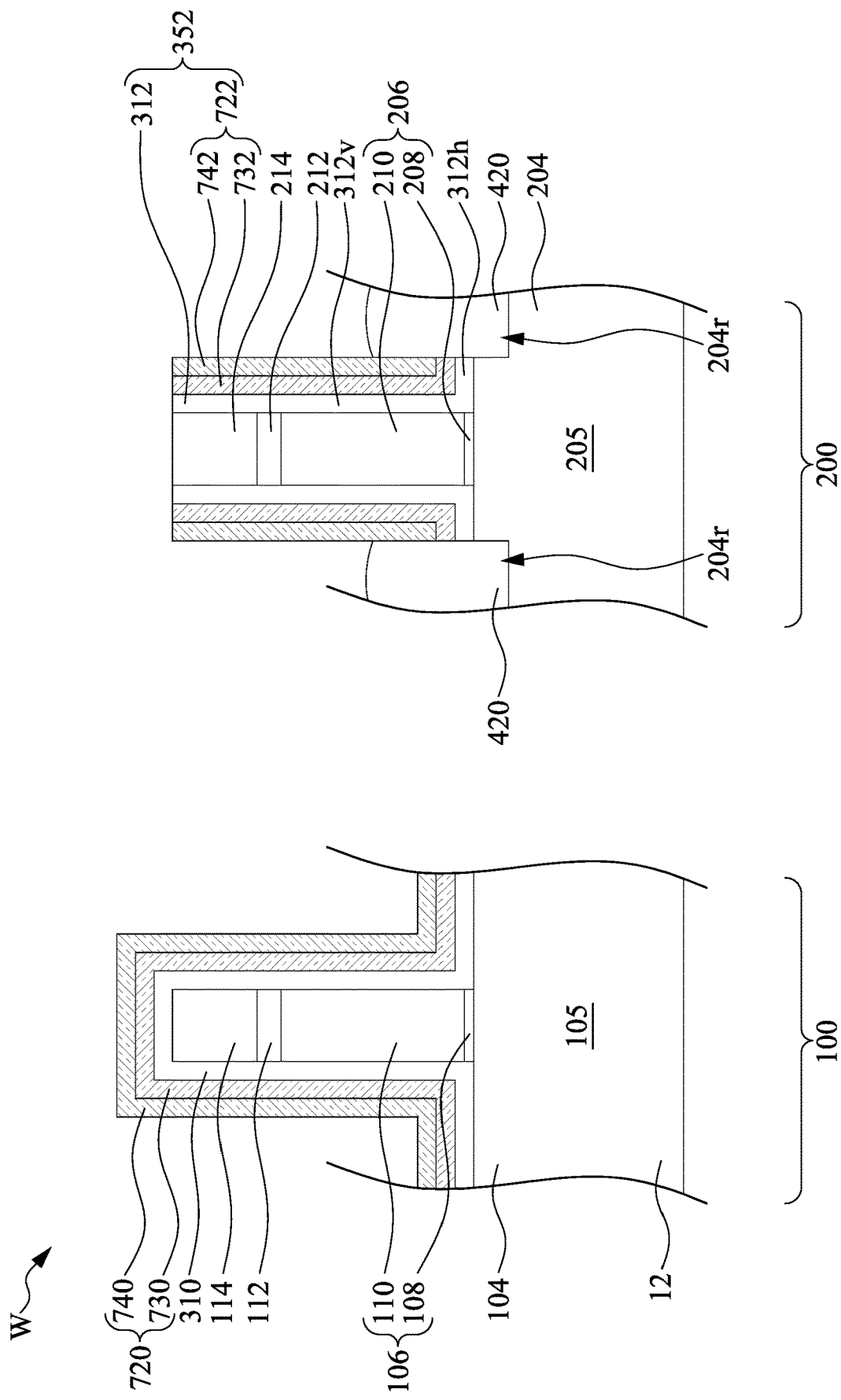

The following process subsequent to the annealing process AL1 includes, for example, masking the NFET region 100 using a photoresist, etching the first spacer layer 310 and the sacrificial spacer film 720 in the PFET region 200 to form a patterned first spacer layer 312 and a patterned sacrificial spacer film 722 having a patterned lightly doped spacer portion 732 and a patterned heavily doped spacer portion 742, recessing the semiconductor fin 204, removing the photoresist from the NFET region 100, and epitaxially growing p-type epitaxy structures 420 from the recessed semiconductor fin 204. The resulting structure is shown in FIG. 27. These process steps are similar to steps S15-S17 in the process flow as shown in FIG. 16A, and thus are not repeated for the sake of brevity.

Figure 28:
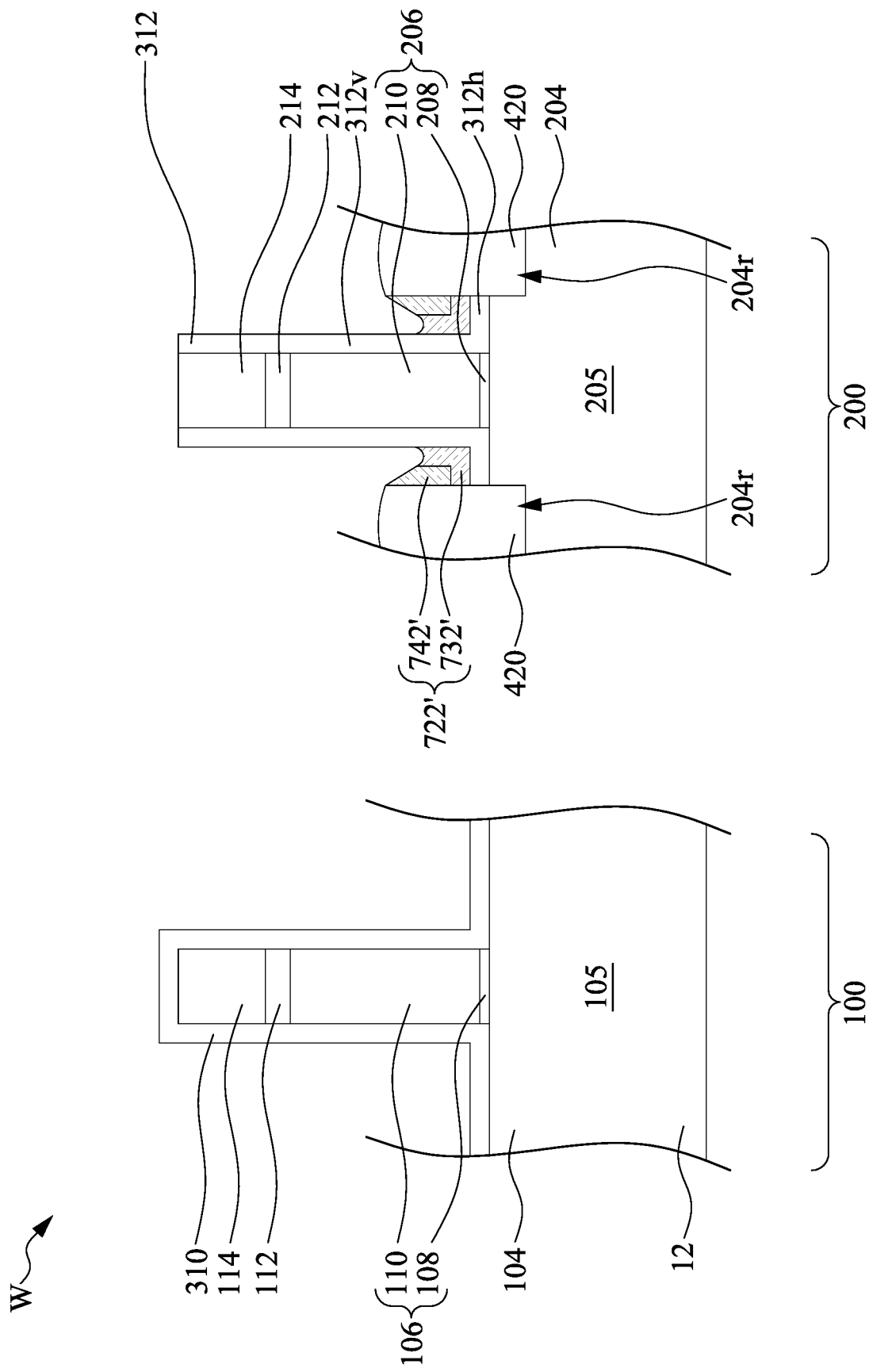

Next, the doped sacrificial spacer films 720 and 722 are etched, and the resulting structure is illustrated in FIG. 28. In some embodiments, the etching process uses phosphoric acid as an etchant. In greater detail, the etching process includes soaking the wafer W in the phosphoric acid bath a given temperature for a given duration. The etching duration is selected so that the doped sacrificial spacer film 720 is substantially completely removed from the NFET region 100, but a portion 722' of the doped sacrificial spacer film 722 in the PFET region 200 still remains in the gap between the first spacer layer 312 and the epitaxy structure 420 due to the aspect ratio of the gap, wherein the doped sacrificial spacer film 722 includes a remaining portion 732' of the lightly doped spacer portion 732 and a remaining portion 742' of the heavily doped spacer portion 742.

Figure 29:
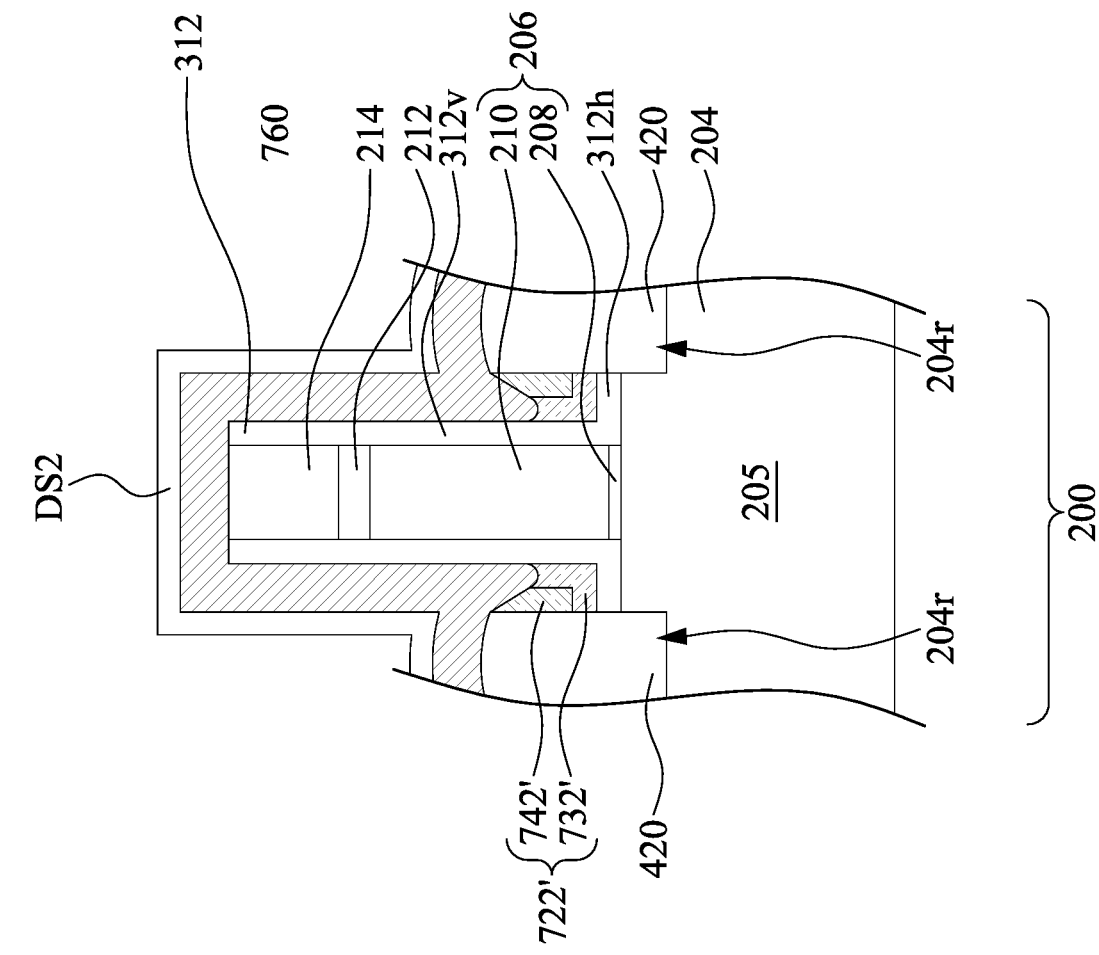
Figure 29:
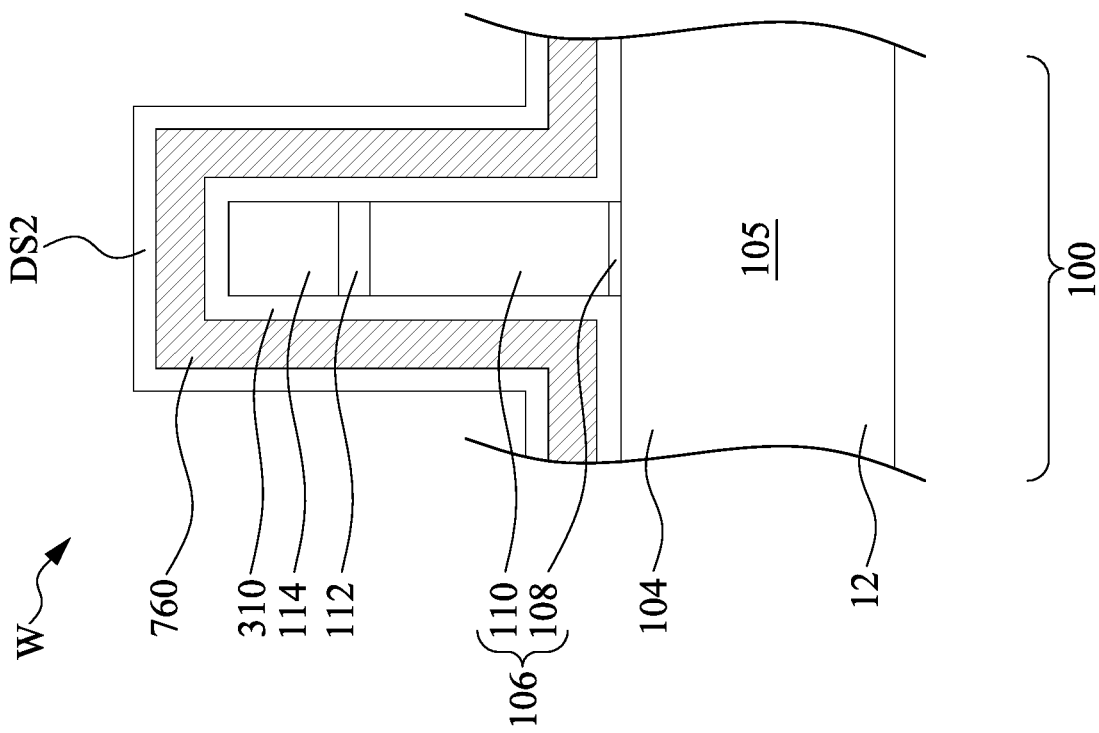

Next, as shown in FIG. 29, another sacrificial spacer film 760 and another dopant source layer DS2 are formed in sequence over the wafer W. In some embodiments, the sacrificial spacer film 760 includes silicon nitride, silicon oxide or other suitable dielectric materials, and the dopant source layer DS2 includes, for example, carbon, boron or other suitable materials that may result in increased etch resistance in doped silicon nitride when the doped silicon nitride is etched using phosphoric acid. In some embodiments, the atomic percentage of the dopant in the dopant source layer DS2 may be substantially equal to or greater than about 90 percent. In some embodiments, the dopant source layer DS2 can be a substantially pure dopant layer. In some embodiments, the sacrificial spacer film 760 has the same material as the sacrificial spacer film 720, and the dopant source layer DS2 has the same dopant as the dopant source layer DS1.

Figure 30:
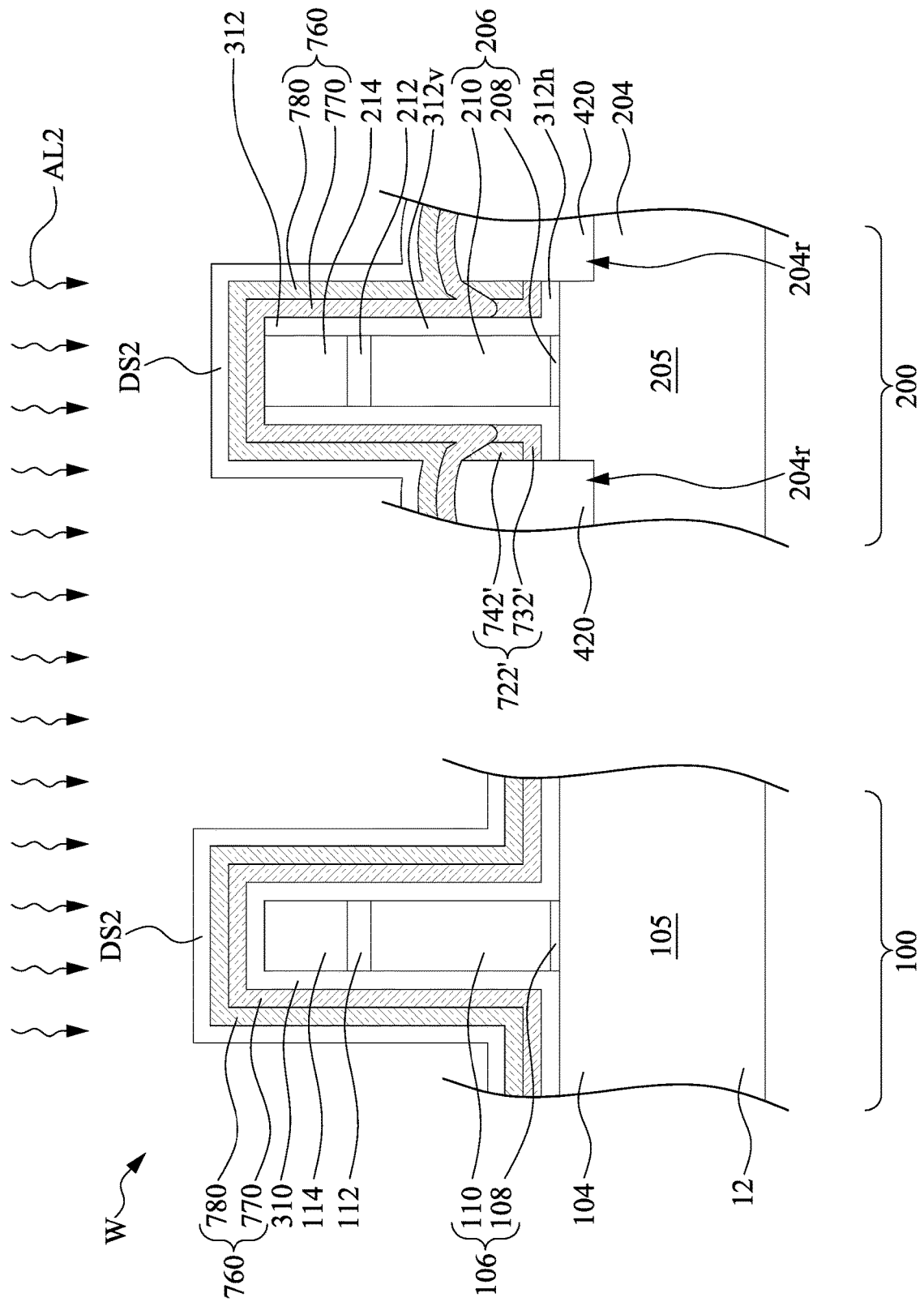

Next, as shown in FIG. 30, another annealing process AL2 is performed to drive the dopant from the dopant source layer DS2 to diffuse into the sacrificial spacer film 760, thus converting an outer portion of the sacrificial spacer film 760 into a heavily doped spacer portion 780 and an inner portion of the sacrificial spacer film 760 into a lightly doped spacer portion 770, wherein the heavily doped spacer portion 780 has a higher dopant concentration than that of the lightly doped spacer portion 770 due to nature of thermal diffusion. The heavily doped spacer portion 780 has higher etch resistance to the phosphoric acid etching process than that of the lightly doped spacer portion 770.

In some embodiments, the heavily doped spacer portion 780 may have a gradient dopant concentration that increases as a distance from the lightly doped spacer portion 770 increases due to nature of thermal diffusion. Similarly, the lightly doped spacer portion 770 may have a gradient dopant concentration that decreases as a distance from the heavily doped spacer portion 780 increases due to nature of thermal diffusion. In some embodiments, after the annealing process AL2 process, the dopant source layer DS2 is removed using suitable etching process. In some other embodiments, the dopant source layer DS2 is not removed.

Figure 31:
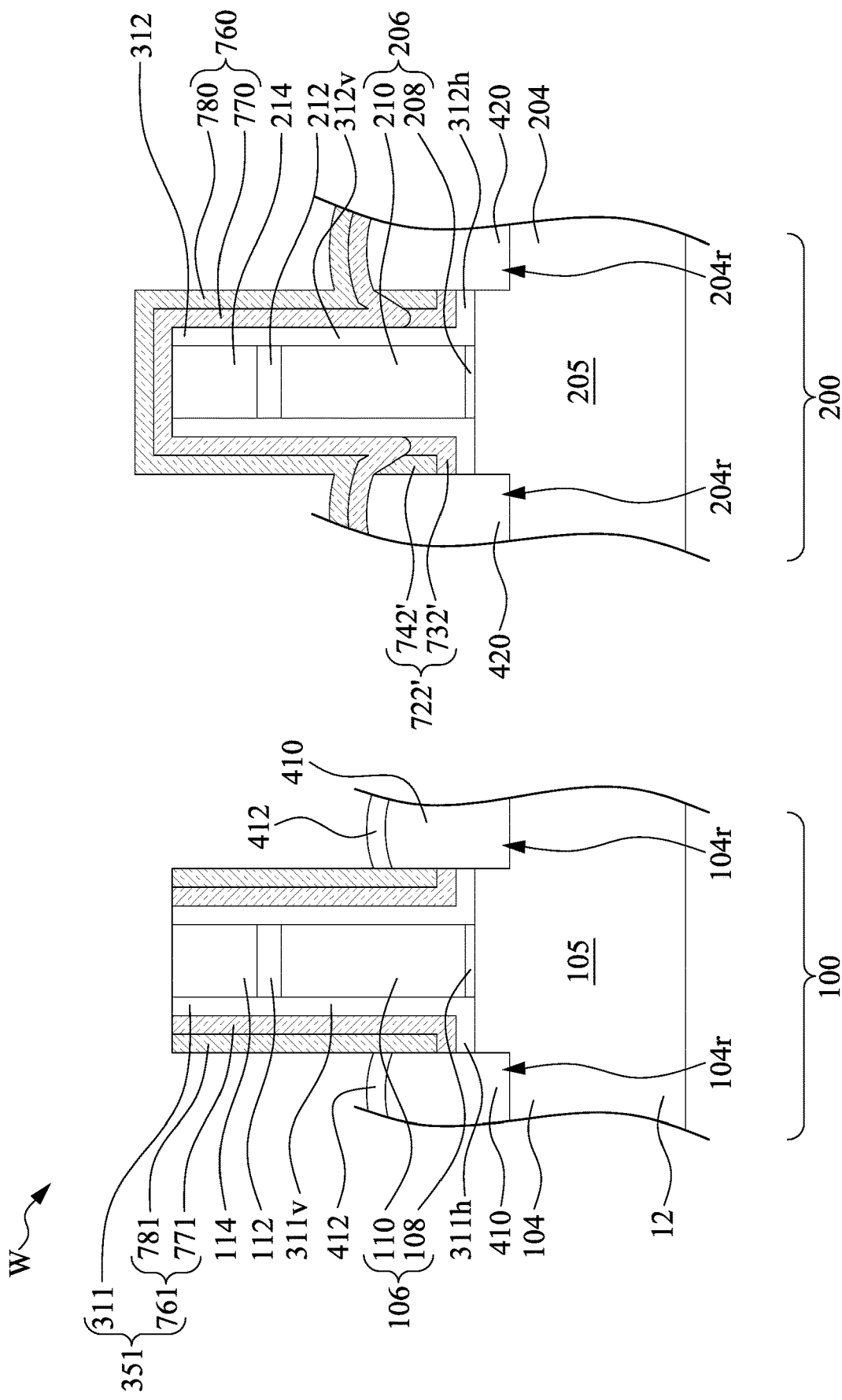

The following process subsequent to the annealing process AL2 includes, for example, masking the PFET region 200 using a photoresist, etching the first spacer layer 310 and the doped sacrificial spacer film 760 in the unmasked NFET region 100 to form a patterned first spacer layer 311 and a patterned doped sacrificial spacer film 761 having a patterned lightly doped spacer portion 771 and a patterned heavily doped spacer portion 781, recessing the semiconductor fin 104, removing the photoresist from the PFET region 200, and epitaxially growing n-type epitaxy structures 410 and protective caps 412 on the recessed semiconductor fin 104. The resulting structure is shown in FIG. 31. These process steps are similar to steps S20-S22 in the process flow as shown in FIG. 16B, and thus are not repeated for the sake of brevity.

Figure 32:
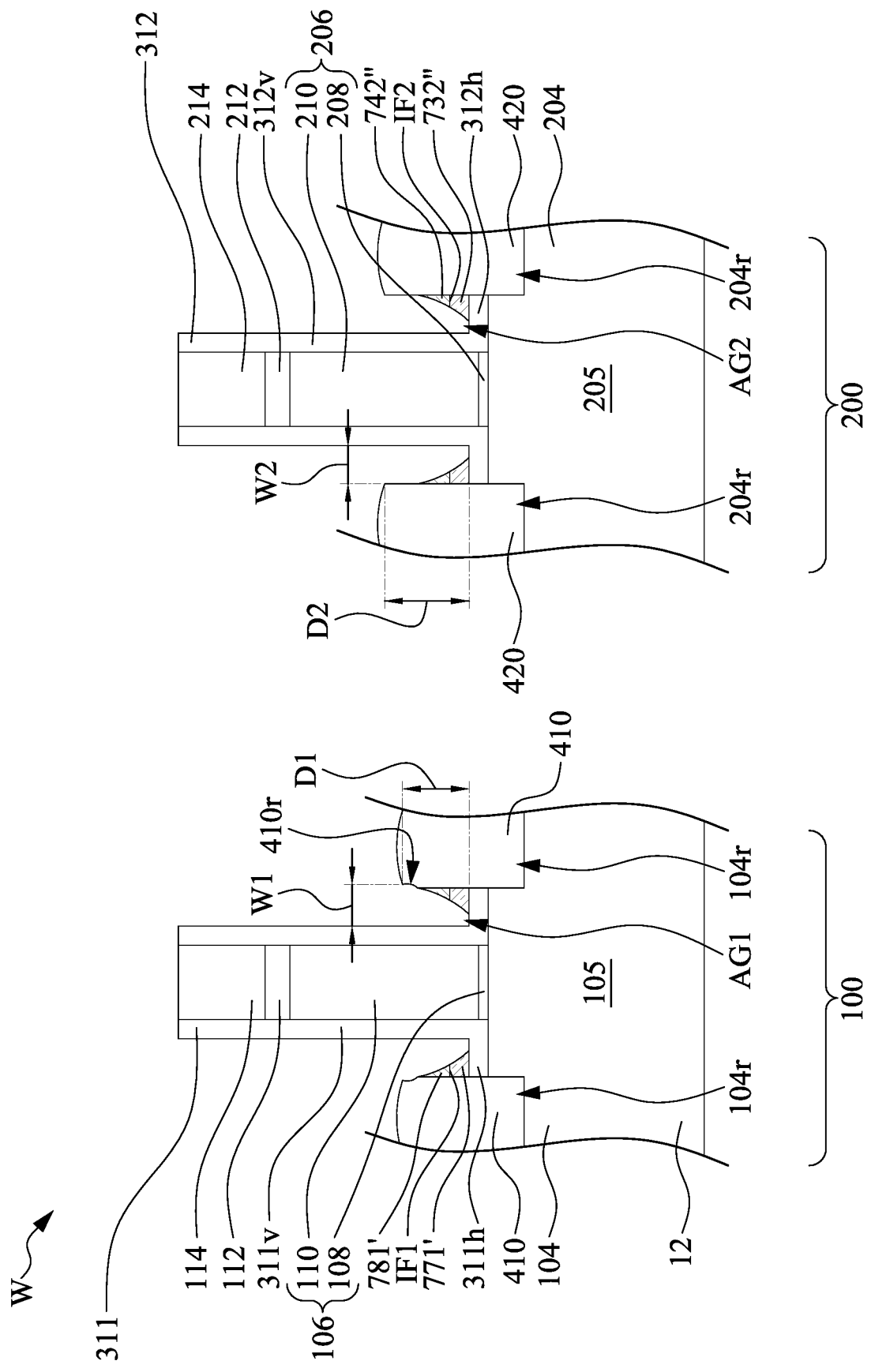

Next, the doped sacrificial spacer films 760, 761 and 722' are etched, thus resulting in air gaps AG1 and AG2. The resulting structure is illustrated in FIG. 32. In accordance with some embodiments of the present disclosure, etching the doped sacrificial spacer films 760, 761 and 722' includes an etching process using phosphoric acid which etches the heavily doped spacer portions 780, 781 and 742' at a slower etch rate than it etches the lightly doped spacer portions 770, 771 and 732'. As a result, the heavily doped spacer portion 781 can reduce damages to the epitaxy structures 410 caused by the phosphoric acid.

As shown in FIG. 32, after the phosphoric acid etching process, residues 771' of the lightly doped spacer portion 771 and residues 781' of the heavily doped spacer portion 781 remain on sidewalls of the epitaxy structures 410. The residues 781' may have a higher impurity concentration (e.g., carbon concentration or boron concentration) than the residues 771'. Moreover, the residues 781' may have a gradient impurity concentration increasing as a distance from the residues 771' increases, and the residues 771' have a gradient impurity concentration decreasing as a distance from the residues 781' increases. These doped spacer residues 771' and 781' may be evidence that a doped sacrificial spacer film similar to the doped sacrificial spacer film 760 formed using steps as shown in FIGS. 29 and 30 is used to fabricate the semiconductor device.

Similarly, after the phosphoric acid etching process, residues 732" of the lightly doped spacer portion 732' and residues 742" of the heavily doped spacer portion 742' remain on sidewalls of the epitaxy structures 420. The residues 742" may have a higher impurity concentration (e.g., carbon concentration or boron concentration) than the residues 732". Moreover, the residues 742" may have a gradient impurity concentration increasing as a distance from the residues 732" increases, and the residues 732" have a gradient impurity concentration decreasing as a distance from the residues 742" increases. These doped spacer residues 742" and 732" may be evidence that a doped sacrificial spacer film similar to the doped sacrificial spacer film 720 formed using steps as shown in FIGS. 24-26 is used to fabricate the semiconductor device.

Figure 33:
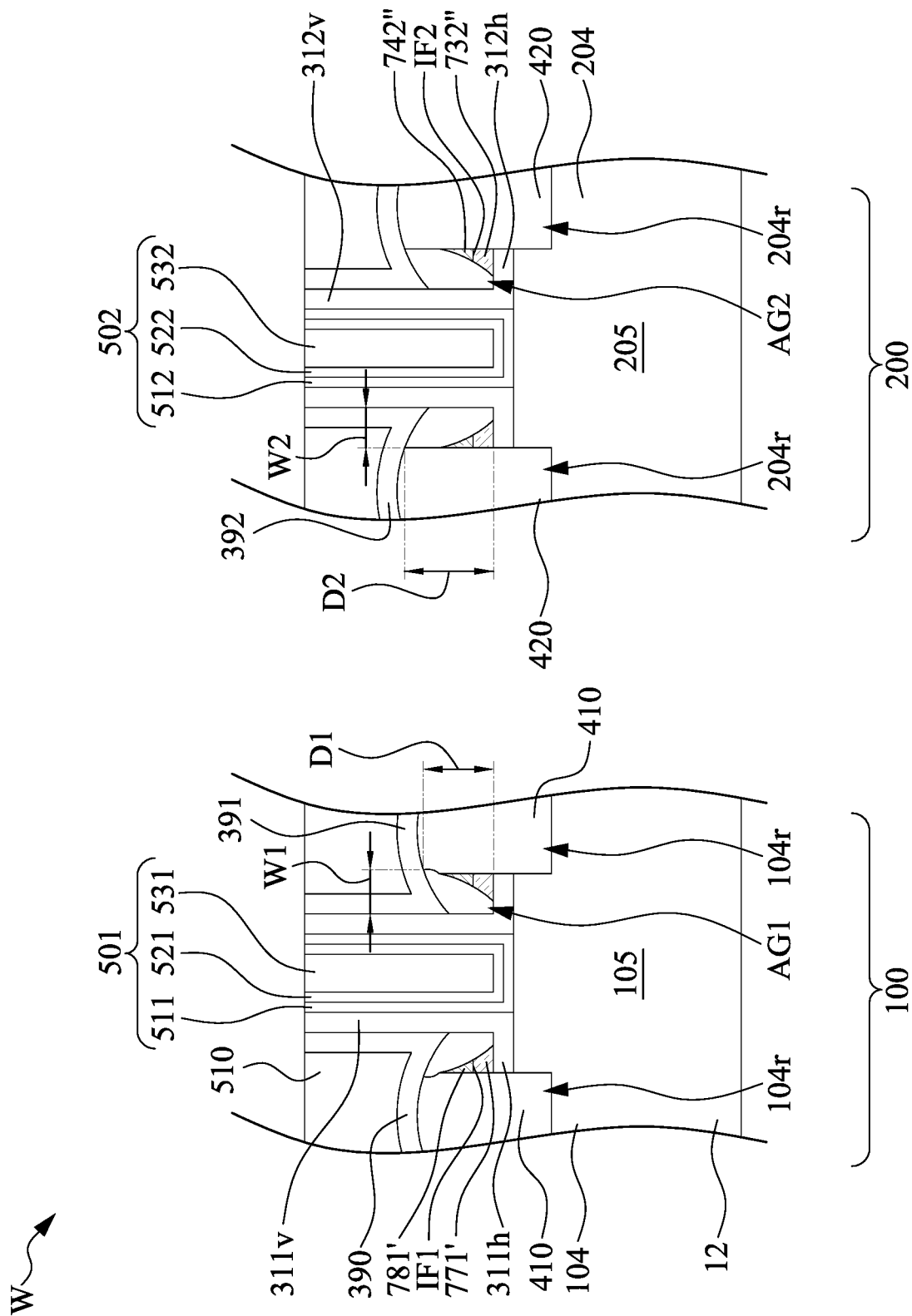

The following process subsequent to forming the air gaps AG1 and AG2 includes, for example, forming a second spacer layer 390 to seal the air gaps AG1 and AG2, forming an ILD layer 510 over the second spacer layer 390, and replacing the dummy gate stacks 106 and 206 with the gate stacks 501 and 502, respectively. The resulting structure is shown in FIG. 33. These process steps are similar to steps S24-S26 in the process flow as shown in FIG. 16B, and thus are not repeated for the sake of brevity.

Figure 34:
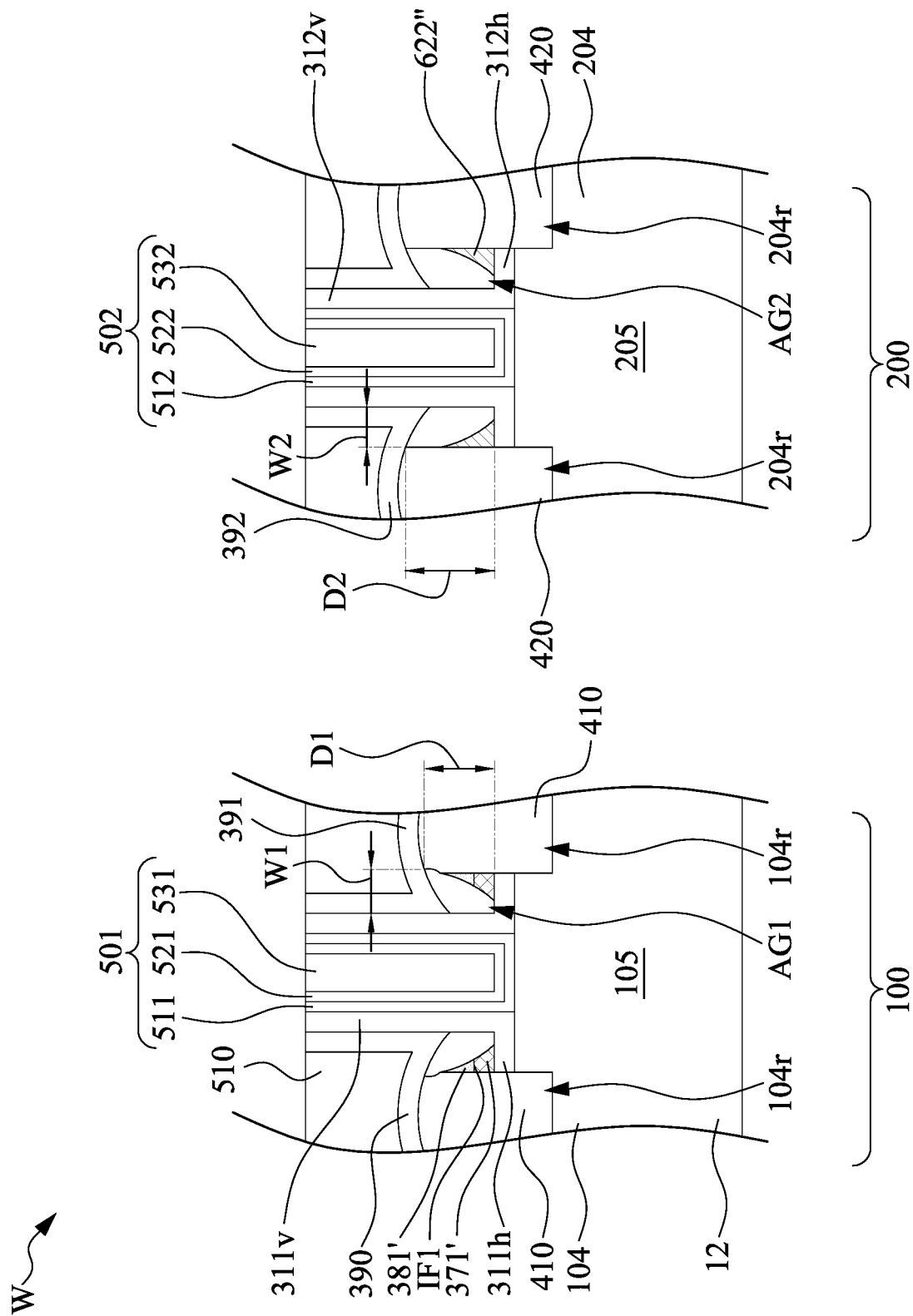
FIGS. 34-39 illustrate cross sectional views of semiconductor devices according to some embodiments of the present disclosure.

FIG. 34 illustrates an exemplary cross sectional view of a semiconductor device according to some other embodiments of the present disclosure. FIG. 34 shows substantially the same structure as FIG. 15, except for the low-temperature silicon nitride residues 332" and the high-temperature silicon nitride residues 342" are replaced with the gradient silicon nitride residues 622" (as shown in FIG. 23). The semiconductor device as shown in FIG. 34 can be formed using the process flow as shown in FIGS. 16A and 16B, wherein step S14 involves forming a gradient silicon nitride layer as a sacrificial spacer film and step S19 involves forming a bi-layered film of a low-temperature SiN layer and a high-temperature SiN layer as another sacrificial spacer film.

Figure 35:
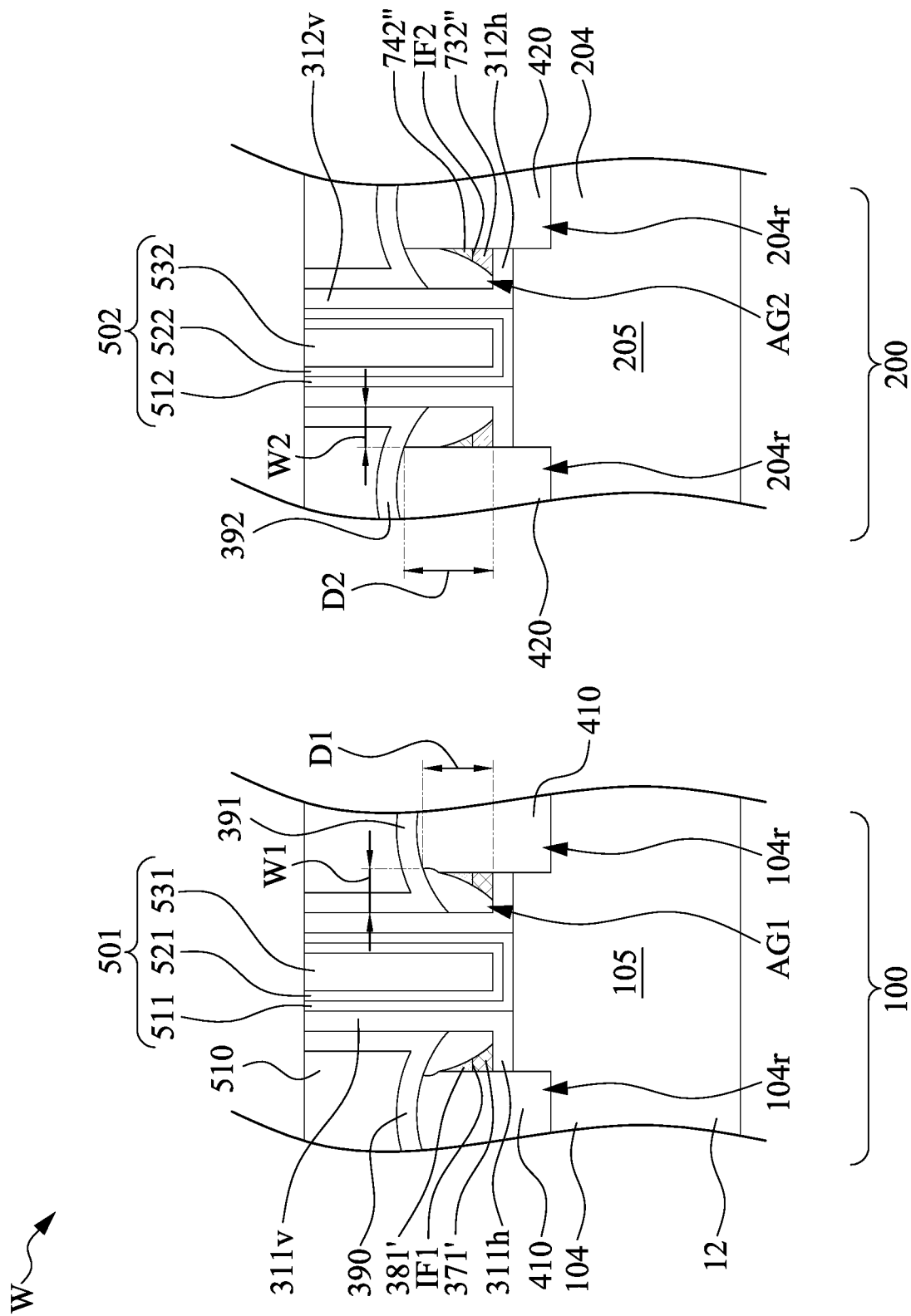

FIG. 35 illustrates an exemplary cross sectional view of a semiconductor device according to some other embodiments of the present disclosure. FIG. 35 shows substantially the same structure as FIG. 15, except for the low-temperature silicon nitride residues 332" and the high-temperature silicon nitride residues 342" are respectively replaced with the lightly doped residues 732" and the heavily doped residues 742" (as shown in FIG. 33). The semiconductor device as shown in FIG. 35 can be formed using the process flow as shown in FIGS. 16A and 16B, wherein step S14 involves forming a lightly doped layer and a heavily doped layer using a thermal diffusion process as a sacrificial spacer film, and step S19 involves forming a bi-layered film of a low-temperature SiN layer and a high-temperature SiN layer as another sacrificial spacer film.

Figure 36:
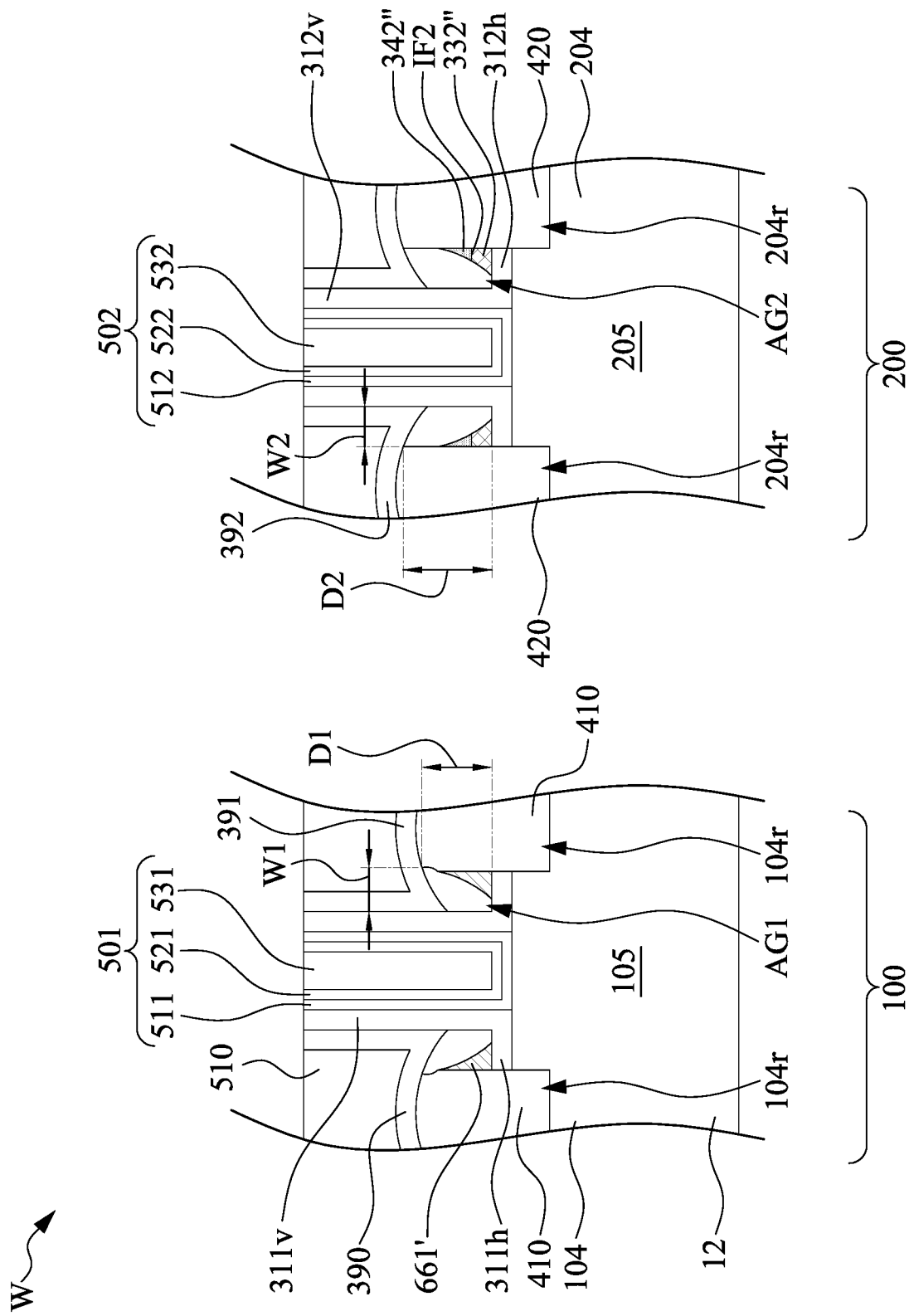

FIG. 36 illustrates an exemplary cross sectional view of a semiconductor device according to some other embodiments of the present disclosure. FIG. 36 shows substantially the same structure as FIG. 15, except for the low-temperature silicon nitride residues 371' and the high-temperature silicon nitride residues 381' are replaced with the gradient silicon nitride residues 661' (as shown in FIG. 23). The semiconductor device as shown in FIG. 36 can be formed using the process flow as shown in FIGS. 16A and 16B, wherein step S14 involves forming a bi-layered film of a low-temperature SiN layer and a high-temperature SiN layer as a sacrificial spacer film, and step S19 involves forming a gradient silicon nitride layer as another sacrificial spacer film.

Figure 37:
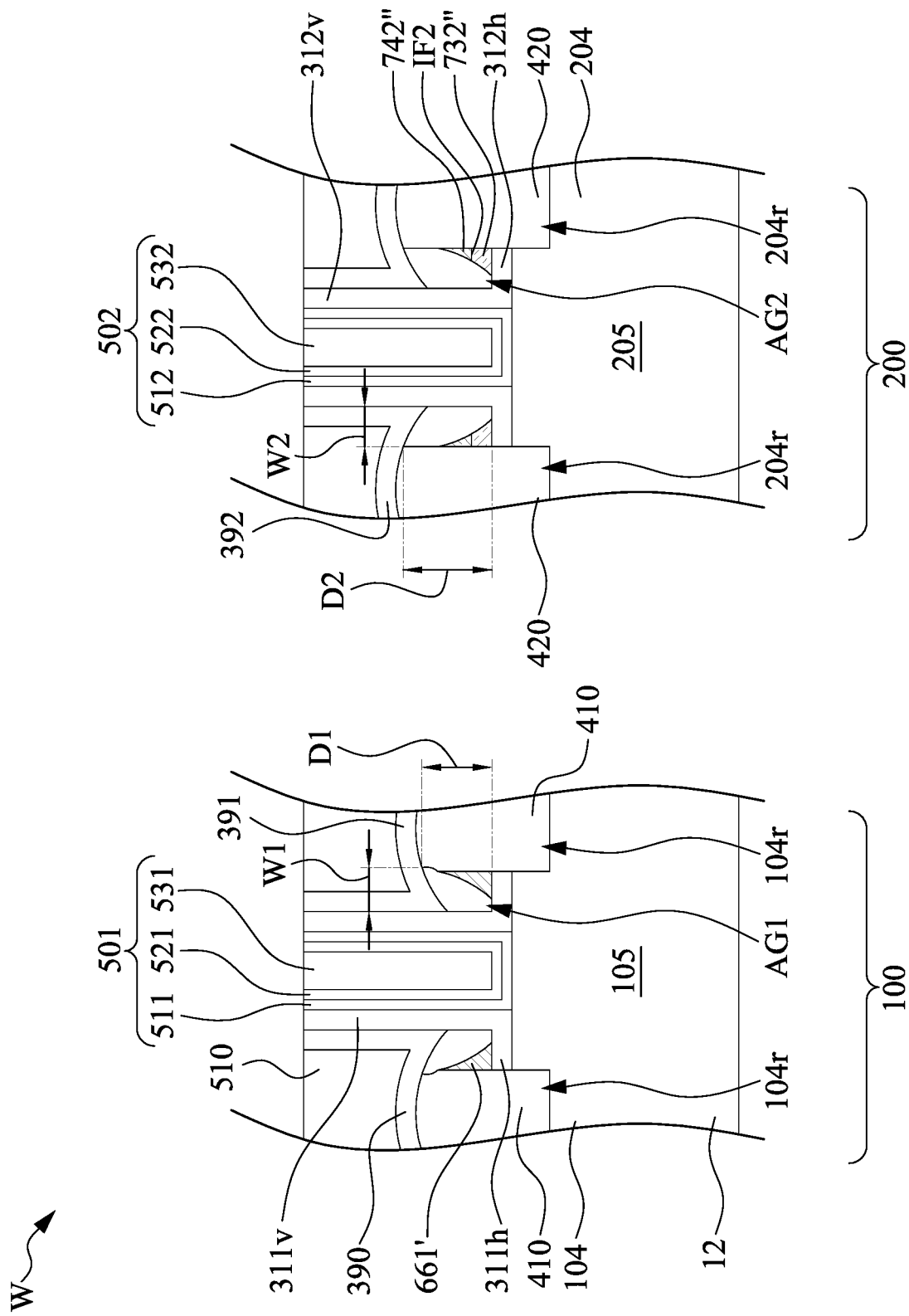

FIG. 37 illustrates an exemplary cross sectional view of a semiconductor device according to some other embodiments of the present disclosure. FIG. 37 shows substantially the same structure as FIG. 23, except for the gradient silicon nitride residues 622" in the PFET region are replaced with the lightly doped residues 732" and the heavily doped residues 742" over the lightly doped residues 732" (as shown in FIG. 33). The semiconductor device as shown in FIG. 37 can be formed using the process flow as shown in FIGS. 16A and 16B, wherein step S14 involves forming a lightly doped layer and a heavily doped layer using a thermal diffusion process as a sacrificial spacer film, and step S19 involves forming a gradient silicon nitride layer as another sacrificial spacer film.

Figure 38:
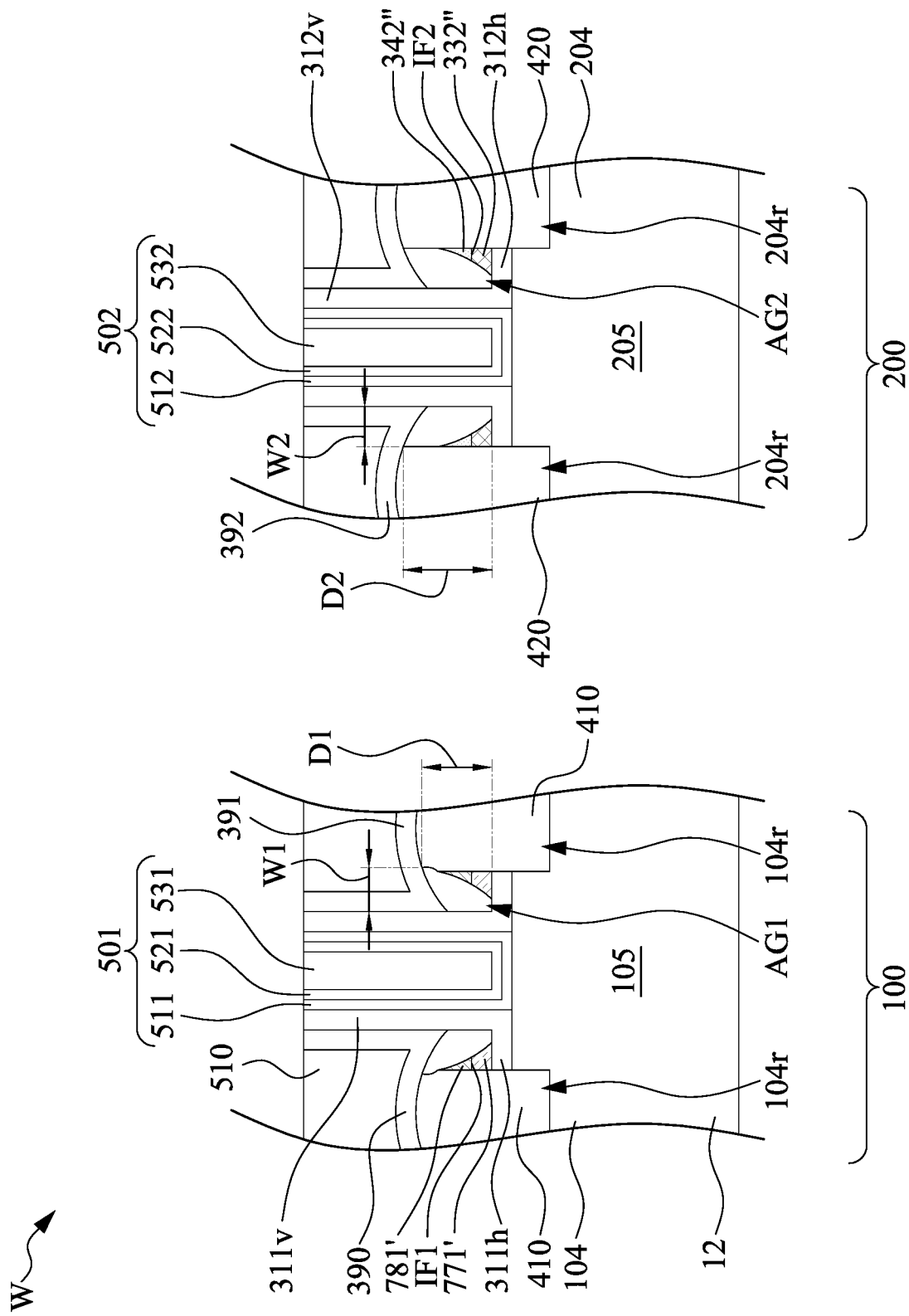

FIG. 38 illustrates an exemplary cross sectional view of a semiconductor device according to some other embodiments of the present disclosure. FIG. 38 shows substantially the same structure as FIG. 15, except for the low-temperature silicon nitride residues 371' and the high-temperature silicon nitride residues 381' in the NFET region 100 are respectively replaced with the lightly doped residues 771' and the heavily doped residues 781' (as shown in FIG. 33). The semiconductor device as shown in FIG. 38 can be formed using the process flow as shown in FIGS. 16A and 16B, wherein step S14 involves forming a bi-layered film of a low-temperature SiN layer and a high-temperature SiN layer as a sacrificial spacer film, and step S19 involves forming a lightly doped layer and a heavily doped layer using a thermal diffusion process as another sacrificial spacer film.

Figure 39:
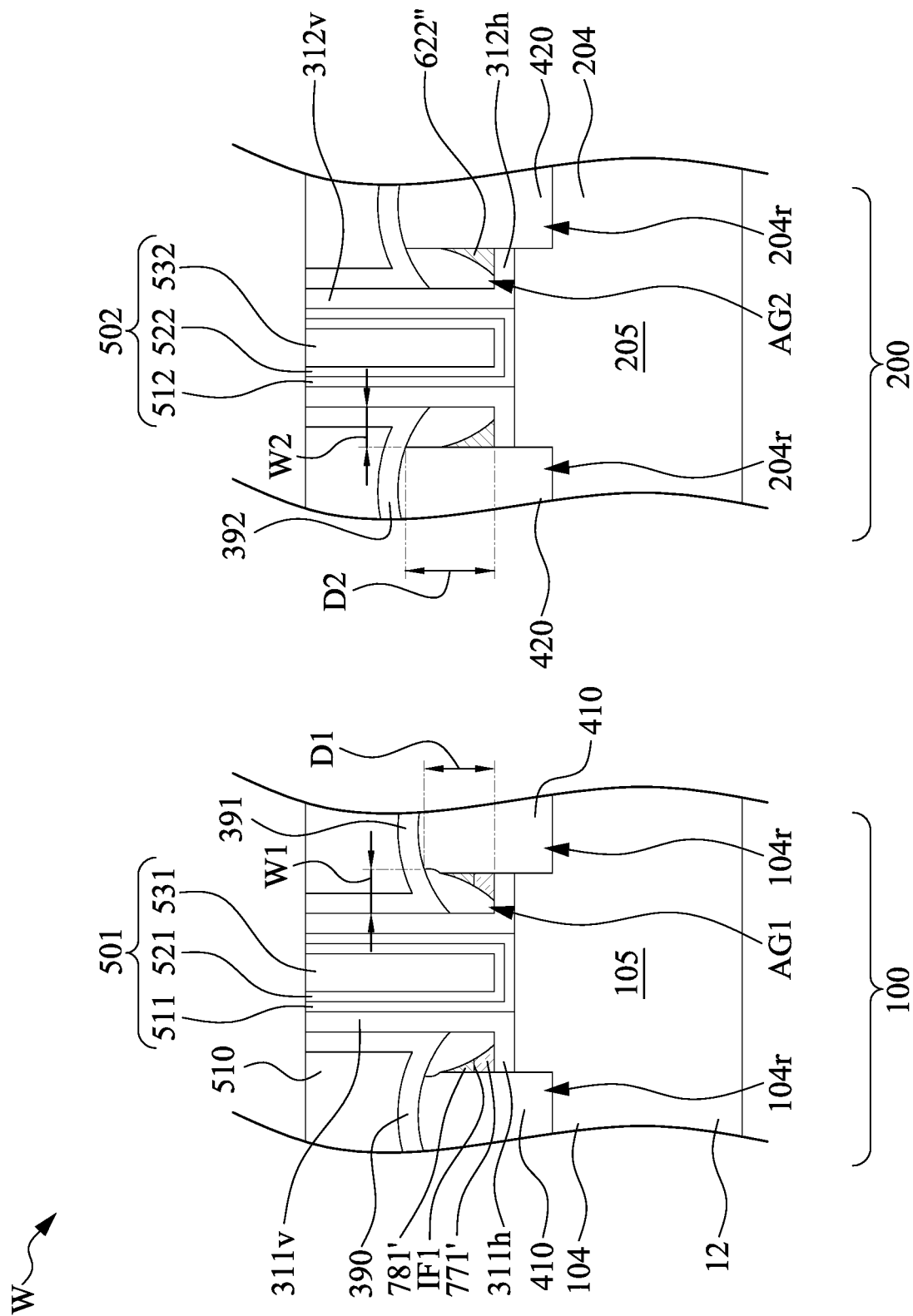

FIG. 39 illustrates an exemplary cross sectional view of a semiconductor device according to some other embodiments of the present disclosure. FIG. 39 shows substantially the same structure as FIG. 23, except for the gradient silicon nitride residues 661' in the NFET region 100 are replaced with the lightly doped residues 771' and the heavily doped residues 781' over the lightly doped residues 771' (as shown in FIG. 33). The semiconductor device as shown in FIG. 39 can be formed using the process flow as shown in FIGS. 16A and 16B, wherein step S14 involves forming a gradient silicon nitride layer as a sacrificial spacer film, and step S19 involves a lightly doped layer and a heavily doped layer using a thermal diffusion process as another sacrificial spacer film.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that damages to the epitaxy structure (e.g., SiP epitaxy structure) caused by phosphoric acid during formation of air gaps can be reduced. Another advantage is that a first portion of the sacrificial spacer film distal from the epitaxy structure is easily removable compared to a second portion of the sacrificial spacer film proximal to the epitaxy structure, thus facilitating to either create an air gap or protect the epitaxy structure.

In accordance with some embodiments of the present disclosure, a semiconductor device includes a gate stack, an epitaxy structure, a first spacer, a second spacer, and a dielectric residue. The gate stack is over a substrate. The epitaxy structure is formed raised above the substrate. The first spacer is on a sidewall of the gate stack. The first spacer and the epitaxy structure define an air gap therebetween. The second spacer seals the air gap between the first spacer and the epitaxy structure. The dielectric residue is in the air gap and has an upper portion and a lower portion under the upper portion. The upper portion of the dielectric residue has higher etch resistance to phosphoric acid than that of the lower portion of the dielectric residue.

In accordance with some embodiments of the present disclosure, a device includes a fin structure, a gate structure, first and second epitaxy structures, a first spacer layer, a second spacer layer, and a first dielectric residue. The fin structure extends from a substrate. The gate structure extends across the fin structure. The first source/drain epitaxy structure and the second source/drain epitaxy structure are on opposite sides of the gate structure, respectively. The first spacer layer spaces the first source/drain epitaxy structure apart from the gate structure, and the first spacer layer and an inner sidewall of the first source/drain epitaxy structure define a first air gap therebetween. The second spacer layer is over the first source/drain epitaxy structure and seals the first air gap. The first dielectric residue is in the first air gap. The first dielectric residue forms an interface with a lower portion of the inner sidewall of the first source/drain epitaxy structure, and the interface is more linear than an upper portion of the inner sidewall of the first source/drain epitaxy structure.

In accordance with some embodiments of the present disclosure, a device includes an n-type field-effect transistor (NFET) and a p-type field-effect transistor (PFET) on a substrate. The NFET includes a first n-type epitaxy structure, a second n-type epitaxy structure, and an NFET gate structure laterally between the first and second n-type epitaxy structures, wherein the NFET gate structure is separated from an inner sidewall of the first n-type epitaxy structure at least by a first unfilled gap. The PFET includes a first p-type epitaxy structure, a second p-type epitaxy structure, and a PFET gate structure laterally between the first and second p-type epitaxy structures, wherein the PFET gate structure is separated from an inner sidewall of the first p-type epitaxy structure at least by a second unfilled gap. The inner sidewall of the first n-type epitaxy structure has a first residue-free region exposed in the first unfilled gap and a first residue-containing region below the first residue-free region. The inner sidewall of the first p-type epitaxy structure has a second residue-free region exposed in the second unfilled gap and a second residue-containing region below the second residue-free region. The second residue-free region of the inner sidewall of the first p-type epitaxy structure is more linear than the first residue-free region of the inner sidewall of the first n-type epitaxy structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   source/drain regions over a substrate;
   a gate structure laterally between the source/drain regions;
   a first gate spacer on a first sidewall of the gate structure, and spaced apart from a first one of the source/drain regions at least in part by a void region; and
   a dielectric material between the first one of the source/drain regions and the void region, the dielectric material having a gradient ratio of a first chemical element to a second chemical element.

2. The semiconductor device of claim 1, wherein the first chemical element is silicon.

3. The semiconductor device of claim 1, wherein the second chemical element is nitrogen.

4. The semiconductor device of claim 1, wherein the first gate spacer comprises a vertical portion on the first sidewall of the gate structure, and a horizontal portion directly below the dielectric material.

5. The semiconductor device of claim 4, wherein the gradient ratio of the first chemical element to the second chemical element increases as a distance from the horizontal portion of the first gate spacer increases.

6. The semiconductor device of claim 4, wherein the dielectric material has a density increasing as a distance from the horizontal portion of the first gate spacer increases.

7. The semiconductor device of claim 1, further comprising:
   a second gate spacer extending from the first gate spacer to over the first one of the source/drain regions, the second gate spacer defining a top boundary of the void region.

8. The semiconductor device of claim 7, wherein the dielectric material is spaced apart from the second gate spacer.

9. The semiconductor device of claim 1, wherein the first one of the source/drain regions has an inner sidewall facing the void region, and an interface formed by the inner sidewall and the dielectric material is more linear than an upper portion of the inner sidewall that is spaced apart from the dielectric material.

10. A semiconductor device, comprising:
    a gate structure extending across a semiconductor fin;
    source/drain epitaxial regions on the semiconductor fin and spaced apart from the gate structure at least by air-containing regions; and
    a dielectric structure between a first one of the source/drain epitaxial regions and a first one of the air-containing regions, the dielectric structure having a gradient density.

11. The semiconductor device of claim 10, wherein the gradient density of the dielectric structure increases as a distance from the semiconductor fin increases.

12. The semiconductor device of claim 10, wherein the dielectric structure is silicon nitride.

13. The semiconductor device of claim 10, wherein the dielectric structure has a gradient silicon-to-nitrogen atomic ratio.

14. The semiconductor device of claim 13, wherein the gradient silicon-to-nitrogen atomic ratio increases as a distance from the semiconductor fin increases.

15. The semiconductor device of claim 10, further comprising:
    a first gate spacer on a first sidewall of the gate structure, the first gate spacer having an L-shaped cross-sectional pattern bordering the first one of the first air-containing regions; and
    a second gate spacer on a second sidewall of the gate structure, the second gate spacer having an L-shaped cross-sectional pattern bordering a second one of the first air-containing regions.

16. The semiconductor device of claim 15, further comprising:
    a third gate spacer alongside the first gate spacer and over the first one of the source/drain epitaxial regions, the third gate spacer defining a top border of the first one of the first air-containing regions; and
    a fourth gate spacer alongside the second gate spacer and over a second one of the source/drain epitaxial regions, the fourth gate spacer defining a top border of the second one of the first air-containing regions.

17. A semiconductor device, comprising:
    an n-type transistor comprising a first gate structure and n-type source/drain regions on opposite sides of the first gate structure, the first gate structure being spaced apart from the n-type source/drain regions at least by first air-containing regions; and
    a p-type transistor comprising a second gate structure and p-type source/drain regions on opposite sides of the second gate structure, the second gate structure being spaced apart from the p-type source/drain regions at least by second air-containing regions,
    wherein the n-type source/drain regions have inner surfaces facing the first air-containing regions, and the p-type source/drain regions have inner surfaces facing the second air-containing regions, and the inner surfaces of the n-type source/drain regions are rougher than the inner surfaces of the p-type source/drain regions.

18. The semiconductor device of claim 17, wherein each of the inner surfaces of the n-type source/drain regions has a residue-containing region and a residue-free region over the residue-containing region, and the residue-free regions are rougher than the residue-containing regions.

19. The semiconductor device of claim 18, wherein dielectric residues on the residue-containing regions of the inner surfaces of the n-type source/drain regions have a gradient ratio of silicon to nitrogen.

20. The semiconductor device of claim 18, wherein dielectric residues on the residue-containing regions of the inner surfaces of the n-type source/drain regions have a gradient density.

* * * * *